US012082486B2

(12) United States Patent
Li et al.

(10) Patent No.: US 12,082,486 B2
(45) **Date of Patent: *Sep. 3, 2024**

(54) TETRADENTATE PLATINUM (II) COMPLEXES CYCLOMETALATED WITH FUNCTIONALIZED PHENYL CARBENE LIGANDS AND THEIR ANALOGUES

(71) Applicant: ARIZONA BOARD OF REGENTS ON BEHALF OF ARIZONA STATE UNIVERSITY, Scottsdale, AZ (US)

(72) Inventors: Jian Li, Tempe, AZ (US); Zhi-Qiang Zhu, Mesa, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 603 days.

This patent is subject to a terminal disclaimer.

(21) Appl. No.: 17/110,353

(22) Filed: Dec. 3, 2020

(65) Prior Publication Data

US 2021/0091316 A1 Mar. 25, 2021

Related U.S. Application Data

(63) Continuation of application No. 15/925,084, filed on Mar. 19, 2018, now Pat. No. 10,886,478, which is a continuation of application No. 14/805,691, filed on Jul. 22, 2015, now Pat. No. 9,923,155.

(60) Provisional application No. 62/028,562, filed on Jul. 24, 2014.

(51) Int. Cl.

| | |
|---|---|
| ***C09K 11/06*** | (2006.01) |
| ***C07F 15/00*** | (2006.01) |
| ***H10K 50/11*** | (2023.01) |
| ***H10K 85/30*** | (2023.01) |
| ***H10K 101/10*** | (2023.01) |

(52) U.S. Cl.

CPC ....... *H10K 85/346* (2023.02); *C07F 15/0086* (2013.01); *C09K 11/06* (2013.01); *C09K 2211/1007* (2013.01); *C09K 2211/1011* (2013.01); *C09K 2211/1014* (2013.01); *C09K 2211/1029* (2013.01); *C09K 2211/1044* (2013.01); *C09K 2211/185* (2013.01); *H10K 50/11* (2023.02); *H10K 2101/10* (2023.02)

(58) Field of Classification Search

CPC .............. C07D 498/22; C07F 15/0086; C09K 11/06; C09K 2211/185; C09K 2211/1014

See application file for complete search history.

(56) References Cited

U.S. PATENT DOCUMENTS

| | | | |
|---|---|---|---|
| 4,769,292 | A | 9/1988 | Tang |
| 5,451,674 | A | 9/1995 | Silver |
| 5,641,878 | A | 6/1997 | Dandliker |
| 5,707,745 | A | 1/1998 | Forrest |
| 5,844,363 | A | 12/1998 | Gu |
| 6,200,695 | B1 | 3/2001 | Arai |
| 6,303,238 | B1 | 10/2001 | Thompson |
| 6,780,528 | B2 | 8/2004 | Tsuboyama |
| 7,002,013 | B1 | 2/2006 | Chi |
| 7,037,599 | B2 | 5/2006 | Culligan |
| 7,064,228 | B1 | 6/2006 | Yu |

(Continued)

FOREIGN PATENT DOCUMENTS

| | | |
|---|---|---|
| CN | 1680366 A | 10/2005 |
| CN | 1777663 | 5/2006 |

(Continued)

OTHER PUBLICATIONS

JP4460952 machine translation downloaded from Google patents Dec. 30, 2022, 21 pages.

Adachi, C. et al., "High-efficiency organic electrophosphorescent devices with tris(2-phenylpyridine)iridium doped into electron-transporting materials", Applied Physics Letters, Aug. 2000, vol. 77, No. 6, pp. 904-906 <DOI:10.1063/1.1306639>.

Ayan Maity et al., "Room-temperature synthesis of cyclometalated iridium(III) complexes; kinetic isomers and reactive functionalities" Chem. Sci., vol. 4, pp. 1175-1181 (2013).

(Continued)

*Primary Examiner* — Noble E Jarrell

(74) *Attorney, Agent, or Firm* — Riverside Law LLP

(57) ABSTRACT

Tetradentate platinum complexes of Formulas I and II suitable for phosphorescent or delayed fluorescent and phosphorescent emitters in display and lighting applications.

Formula I

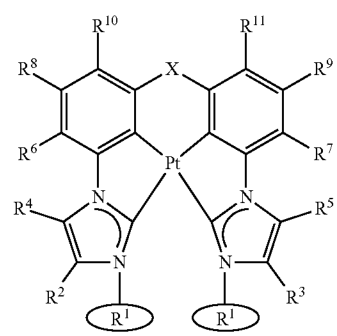

Formula II

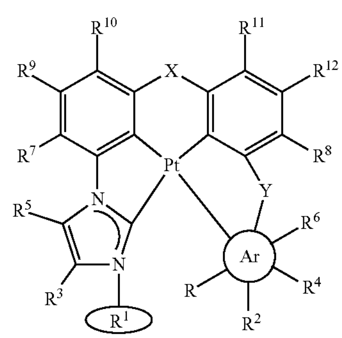

18 Claims, 2 Drawing Sheets

(56) References Cited

U.S. PATENT DOCUMENTS 7,268,485 B2 9/2007 Tyan
7,279,704 B2 10/2007 Walters
7,332,232 B2 2/2008 Ma
7,442,797 B2 10/2008 Itoh
7,501,190 B2 3/2009 Ise
7,635,792 B1 12/2009 Cella
7,655,322 B2 2/2010 Forrest
7,854,513 B2 12/2010 Quach
7,947,383 B2 5/2011 Ise
8,106,199 B2 1/2012 Jabbour
8,133,597 B2 3/2012 Yasukawa
8,389,725 B2 3/2013 Li
8,617,723 B2 12/2013 Stoessel
8,669,364 B2 3/2014 Li
8,778,509 B2 7/2014 Yasukawa
8,816,080 B2 8/2014 Li
8,846,940 B2 9/2014 Li
8,871,361 B2 10/2014 Xia
8,927,713 B2 1/2015 Li
8,933,622 B2 1/2015 Kawami
8,946,417 B2 2/2015 Jian
8,987,451 B2 3/2015 Tsai
9,059,412 B2 6/2015 Zeng
9,076,974 B2 7/2015 Li
9,082,989 B2 7/2015 Li
9,203,039 B2 12/2015 Li
9,221,857 B2 12/2015 Li
9,224,963 B2 12/2015 Li
9,238,668 B2 1/2016 Li
9,312,502 B2 4/2016 Li
9,312,505 B2 4/2016 Brooks
9,318,725 B2 4/2016 Li
9,324,957 B2 4/2016 Li
9,382,273 B2 7/2016 Li
9,385,329 B2 7/2016 Li
9,425,415 B2 8/2016 Li
9,461,254 B2 10/2016 Tsai
9,493,698 B2 11/2016 Beers
9,502,671 B2 11/2016 Li
9,550,801 B2 1/2017 Li
9,598,449 B2 3/2017 Li
9,617,291 B2 4/2017 Li
9,666,822 B2 5/2017 Forrest
9,673,409 B2 6/2017 Li
9,698,359 B2 7/2017 Li
9,711,739 B2 7/2017 Li
9,711,741 B2 7/2017 Li
9,711,742 B2 7/2017 Li
9,735,397 B2 8/2017 Riegel
9,755,163 B2 9/2017 Li
9,818,959 B2 11/2017 Li
9,865,825 B2 1/2018 Li
9,879,039 B2 1/2018 Li
9,882,150 B2 1/2018 Li
9,899,614 B2 2/2018 Li
9,920,242 B2 3/2018 Li
9,923,155 B2 3/2018 Li
9,941,479 B2 4/2018 Li
9,947,881 B2 4/2018 Li
9,985,224 B2 5/2018 Li
10,020,455 B2 7/2018 Li
10,033,003 B2 7/2018 Li
10,056,564 B2 8/2018 Li
10,056,567 B2 8/2018 Li
10,158,091 B2 12/2018 Li
10,177,323 B2 1/2019 Li
10,211,411 B2 2/2019 Li
10,211,414 B2 2/2019 Li
10,263,197 B2 4/2019 Li
10,294,417 B2 5/2019 Li
10,392,387 B2 8/2019 Li
10,411,202 B2 9/2019 Li
10,414,785 B2 9/2019 Li
10,516,117 B2 12/2019 Li
10,566,553 B2 2/2020 Li
10,566,554 B2 2/2020 Li
10,804,475 B2 10/2020 Zeng
10,886,478 B2 * 1/2021 Li .......................... C09K 11/06
11,183,670 B2 11/2021 Li
11,594,688 B2 2/2023 Li
2001/0019782 A1 9/2001 Igarashi
2002/0068190 A1 6/2002 Tsuboyama
2003/0062519 A1 4/2003 Yamazaki
2003/0180574 A1 9/2003 Huang
2003/0186077 A1 10/2003 Chen
2004/0230061 A1 11/2004 Seo
2005/0037232 A1 2/2005 Tyan
2005/0139810 A1 6/2005 Kuehl
2005/0170207 A1 8/2005 Ma
2005/0260446 A1 11/2005 MacKenzie
2006/0024522 A1 2/2006 Thompson
2006/0032528 A1 2/2006 Wang
2006/0066228 A1 3/2006 Antoniadis
2006/0073359 A1 4/2006 Ise
2006/0094875 A1 5/2006 Itoh
2006/0127696 A1 6/2006 Stossel
2006/0182992 A1 8/2006 Nii
2006/0202197 A1 9/2006 Nakayama
2006/0210831 A1 9/2006 Sano
2006/0255721 A1 11/2006 Igarashi
2006/0263635 A1 11/2006 Ise
2006/0286406 A1 12/2006 Igarashi
2007/0057630 A1 3/2007 Nishita
2007/0059551 A1 3/2007 Yamazaki
2007/0082284 A1 4/2007 Stoessel
2007/0103060 A1 5/2007 Itoh
2007/0160905 A1 7/2007 Morishita
2007/0252140 A1 11/2007 Limmert
2008/0001530 A1 1/2008 Ise
2008/0036373 A1 2/2008 Itoh
2008/0054799 A1 3/2008 Satou
2008/0079358 A1 4/2008 Satou
2008/0102310 A1 5/2008 Thompson
2008/0111476 A1 5/2008 Choi
2008/0241518 A1 10/2008 Satou
2008/0241589 A1 10/2008 Fukunaga
2008/0269491 A1 10/2008 Jabbour
2008/0315187 A1 12/2008 Bazan
2009/0026936 A1 1/2009 Satou
2009/0026939 A1 1/2009 Kinoshita
2009/0032989 A1 2/2009 Karim
2009/0039768 A1 2/2009 Igarashi
2009/0079340 A1 3/2009 Kinoshita
2009/0126796 A1 5/2009 Yang
2009/0128008 A1 5/2009 Ise
2009/0136779 A1 5/2009 Cheng
2009/0153045 A1 6/2009 Kinoshita
2009/0167157 A1 7/2009 Murakami
2009/0167167 A1 7/2009 Aoyama
2009/0205713 A1 8/2009 Mitra
2009/0218561 A1 9/2009 Kitamura
2009/0261721 A1 10/2009 Murakami
2009/0267500 A1 10/2009 Kinoshita
2010/0000606 A1 1/2010 Thompson
2010/0013386 A1 1/2010 Thompson
2010/0043876 A1 2/2010 Tuttle
2010/0093119 A1 4/2010 Shimizu
2010/0127246 A1 5/2010 Nakayama
2010/0141127 A1 6/2010 Xia
2010/0147386 A1 6/2010 Benson-Smith
2010/0171111 A1 7/2010 Takada
2010/0171418 A1 7/2010 Kinoshita
2010/0200051 A1 8/2010 Triani
2010/0204467 A1 8/2010 Lamarque
2010/0270540 A1 10/2010 Chung
2010/0288362 A1 11/2010 Hatwar
2010/0297522 A1 11/2010 Creeth
2010/0301315 A1 12/2010 Masui
2010/0307594 A1 12/2010 Zhu
2011/0028723 A1 2/2011 Li
2011/0049496 A1 3/2011 Fukuzaki
2011/0062858 A1 3/2011 Yersin
2011/0132440 A1 6/2011 Sivarajan
2011/0217544 A1 9/2011 Young

(56) References Cited

U.S. PATENT DOCUMENTS

2011/0227058 A1 9/2011 Masui
2011/0301351 A1 12/2011 Li
2012/0024383 A1 2/2012 Kaiho
2012/0025588 A1 2/2012 Humbert
2012/0039323 A1 2/2012 Hirano
2012/0095232 A1 4/2012 Li
2012/0108806 A1 5/2012 Li
2012/0146012 A1 6/2012 Limmert
2012/0181528 A1 7/2012 Takada
2012/0199823 A1 8/2012 Molt
2012/0202997 A1 8/2012 Parham
2012/0204960 A1 8/2012 Kato
2012/0215001 A1 8/2012 Li
2012/0223634 A1 9/2012 Xia
2012/0264938 A1 10/2012 Li
2012/0273736 A1 11/2012 James
2012/0302753 A1 11/2012 Li
2013/0048963 A1 2/2013 Beers
2013/0082245 A1 4/2013 Kottas
2013/0137870 A1 5/2013 Li
2013/0168656 A1 7/2013 Tsai
2013/0172561 A1 7/2013 Tsai
2013/0200340 A1 8/2013 Otsu
2013/0203996 A1 8/2013 Li
2013/0237706 A1 9/2013 Li
2013/0341600 A1 12/2013 Lin
2014/0014922 A1 1/2014 Lin
2014/0014931 A1 1/2014 Riegel
2014/0027733 A1 1/2014 Zeng
2014/0042475 A1 2/2014 Park
2014/0066628 A1 3/2014 Li
2014/0073798 A1 3/2014 Li
2014/0084261 A1 3/2014 Brooks
2014/0114072 A1 4/2014 Li
2014/0147996 A1 5/2014 Vogt
2014/0148594 A1 5/2014 Li
2014/0191206 A1 7/2014 Cho
2014/0203248 A1 7/2014 Zhou
2014/0249310 A1 9/2014 Li
2014/0326960 A1 11/2014 Kim
2014/0330019 A1 11/2014 Li
2014/0364605 A1 12/2014 Li
2014/0374728 A1 12/2014 Adamovich
2015/0008419 A1 1/2015 Li
2015/0018558 A1 1/2015 Li
2015/0028323 A1 1/2015 Xia
2015/0060804 A1 3/2015 Kanitz
2015/0069334 A1 3/2015 Xia
2015/0105556 A1 4/2015 Li
2015/0123047 A1 5/2015 Maltenberger
2015/0162552 A1 6/2015 Li
2015/0194616 A1 7/2015 Li
2015/0207086 A1 7/2015 Li
2015/0228914 A1 8/2015 Li
2015/0274762 A1 10/2015 Li
2015/0287938 A1 10/2015 Li
2015/0311456 A1 10/2015 Li
2015/0318500 A1 11/2015 Li
2015/0349279 A1 12/2015 Li
2015/0380666 A1 12/2015 Szigethy
2016/0028028 A1 1/2016 Li
2016/0028029 A1 1/2016 Li
2016/0043331 A1 2/2016 Li
2016/0072082 A1 3/2016 Brooks
2016/0133861 A1 5/2016 Li
2016/0133862 A1 5/2016 Li
2016/0181529 A1 6/2016 Tsai
2016/0194344 A1 7/2016 Li
2016/0197285 A1 7/2016 Zeng
2016/0197291 A1 7/2016 Li
2016/0204358 A1 7/2016 Stoessel
2016/0285015 A1 9/2016 Li
2016/0359120 A1 12/2016 Li
2016/0359125 A1 12/2016 Li
2017/0005278 A1 1/2017 Li
2017/0012224 A1 1/2017 Li
2017/0040555 A1 2/2017 Li
2017/0047533 A1 2/2017 Li
2017/0066792 A1 3/2017 Li
2017/0069855 A1 3/2017 Li
2017/0077420 A1 3/2017 Li
2017/0125708 A1 5/2017 Li
2017/0267923 A1 9/2017 Li
2017/0271611 A1 9/2017 Li
2017/0301871 A1 10/2017 Li
2017/0305881 A1 10/2017 Li
2017/0309943 A1 10/2017 Angell
2017/0331056 A1 11/2017 Li
2017/0342098 A1 11/2017 Li
2017/0373260 A1 12/2017 Li
2018/0006246 A1 1/2018 Li
2018/0013096 A1 1/2018 Hamada
2018/0037812 A1 2/2018 Pegington
2018/0052366 A1 2/2018 Hao
2018/0053904 A1 2/2018 Li
2018/0062084 A1 3/2018 Watabe
2018/0130960 A1 5/2018 Li
2018/0138428 A1 5/2018 Li
2018/0148464 A1 5/2018 Li
2018/0159051 A1 6/2018 Li
2018/0166655 A1 6/2018 Li
2018/0175329 A1 6/2018 Li
2018/0194790 A1 7/2018 Li
2018/0198081 A1 7/2018 Zeng
2018/0219161 A1 8/2018 Li
2018/0226592 A1 8/2018 Li
2018/0226593 A1 8/2018 Li
2018/0277777 A1 9/2018 Li
2018/0301641 A1 10/2018 Li
2018/0312750 A1 11/2018 Li
2018/0331307 A1 11/2018 Li
2018/0334459 A1 11/2018 Li
2018/0337345 A1 11/2018 Li
2018/0337349 A1 11/2018 Li
2018/0337350 A1 11/2018 Li
2018/0353771 A1 12/2018 Kim
2019/0013485 A1 1/2019 Li
2019/0058137 A1 2/2019 Ko
2019/0067602 A1 2/2019 Li
2019/0109288 A1 4/2019 Li
2019/0119312 A1 4/2019 Chen
2019/0157352 A1 5/2019 Li
2019/0194536 A1 6/2019 Li
2019/0221757 A1 7/2019 Tarran
2019/0259963 A1 8/2019 Li
2019/0276485 A1 9/2019 Li
2019/0312217 A1 10/2019 Li
2019/0367546 A1 12/2019 Li
2019/0389893 A1 12/2019 Li
2020/0006678 A1 1/2020 Li
2020/0055885 A1 2/2020 Tarran
2020/0071330 A1 3/2020 Li
2020/0075868 A1 3/2020 Li
2020/0119288 A1 4/2020 Li
2020/0119289 A1 4/2020 Lin
2020/0140471 A1 5/2020 Chen
2020/0152891 A1 5/2020 Li
2020/0168798 A1 5/2020 Han
2020/0239505 A1 7/2020 Li
2020/0243776 A1 7/2020 Li
2020/0365819 A1 11/2020 Seo
2021/0095195 A1 4/2021 Ma
2021/0292351 A1 9/2021 MacInnis
2021/0376260 A1 12/2021 Li
2022/0059786 A1 2/2022 Seo

FOREIGN PATENT DOCUMENTS

CN 1894267 1/2007
CN 1894269 A 1/2007
CN 101142223 A 3/2008
CN 101667626 3/2010
CN 102449108 A 5/2012
CN 102892860 A 1/2013

(56) References Cited

FOREIGN PATENT DOCUMENTS

| | | | |
|---|---|---|---|
| CN | 102971396 | A | 3/2013 |
| CN | 103102372 | | 5/2013 |
| CN | 104232076 | A | 12/2014 |
| CN | 104377231 | | 2/2015 |
| CN | 104576934 | | 4/2015 |
| CN | 104693243 | A | 6/2015 |
| CN | 105367605 | A | 3/2016 |
| CN | 105418591 | A | 3/2016 |
| CN | 106783922 | | 5/2017 |
| EP | 1617493 | | 1/2006 |
| EP | 1808052 | A1 | 7/2007 |
| EP | 1874893 | A1 | 1/2008 |
| EP | 1874894 | A1 | 1/2008 |
| EP | 1919928 | A1 | 5/2008 |
| EP | 1968131 | | 9/2008 |
| EP | 2020694 | | 2/2009 |
| EP | 2036907 | A1 | 3/2009 |
| EP | 2096690 | | 9/2009 |
| EP | 2112213 | A2 | 10/2009 |
| EP | 2417217 | A2 | 2/2012 |
| EP | 2684932 | | 1/2014 |
| EP | 2711999 | A2 | 3/2014 |
| EP | 3032293 | | 6/2016 |
| JP | 2002010505 | | 1/2002 |
| JP | 2002105055 | | 4/2002 |
| JP | 2003342284 | | 12/2003 |
| JP | 2005031073 | | 2/2005 |
| JP | 2005267557 | | 9/2005 |
| JP | 2005310733 | A | 11/2005 |
| JP | 2006047240 | A | 2/2006 |
| JP | 2006232784 | A | 9/2006 |
| JP | 2006242080 | | 9/2006 |
| JP | 2006242081 | A | 9/2006 |
| JP | 2006256999 | A | 9/2006 |
| JP | 2006257238 | A | 9/2006 |
| JP | 2006261623 | A | 9/2006 |
| JP | 2006290988 | A | 10/2006 |
| JP | 2006313796 | A | 11/2006 |
| JP | 2006332622 | A | 12/2006 |
| JP | 2006351638 | A | 12/2006 |
| JP | 2007019462 | A | 1/2007 |
| JP | 2007031678 | | 2/2007 |
| JP | 2007042875 | A | 2/2007 |
| JP | 2007051243 | A | 3/2007 |
| JP | 2007053132 | A | 3/2007 |
| JP | 2007066581 | | 3/2007 |
| JP | 2007073620 | A | 3/2007 |
| JP | 2007073845 | A | 3/2007 |
| JP | 2007073900 | A | 3/2007 |
| JP | 2007080593 | | 3/2007 |
| JP | 2007080677 | A | 3/2007 |
| JP | 2007088105 | | 4/2007 |
| JP | 2007088164 | A | 4/2007 |
| JP | 2007096259 | A | 4/2007 |
| JP | 2007099765 | A | 4/2007 |
| JP | 2007110067 | | 4/2007 |
| JP | 2007110102 | A | 4/2007 |
| JP | 2007519614 | | 7/2007 |
| JP | 2007258550 | A | 10/2007 |
| JP | 2007324309 | A | 12/2007 |
| JP | 2008010353 | A | 1/2008 |
| JP | 2008091860 | A | 4/2008 |
| JP | 2008103535 | A | 5/2008 |
| JP | 2008108617 | A | 5/2008 |
| JP | 2008109085 | | 5/2008 |
| JP | 2008109103 | A | 5/2008 |
| JP | 2008116343 | A | 5/2008 |
| JP | 2008117545 | A | 5/2008 |
| JP | 2008160087 | A | 7/2008 |
| JP | 2008198801 | A | 8/2008 |
| JP | 2008270729 | A | 11/2008 |
| JP | 2008270736 | | 11/2008 |
| JP | 2008310220 | A | 12/2008 |
| JP | 2009016184 | A | 1/2009 |
| JP | 2009016579 | | 1/2009 |

| | | | |
|---|---|---|---|
| JP | 2009032977 | A | 2/2009 |
| JP | 2009032988 | A | 2/2009 |
| JP | 2009059997 | | 3/2009 |
| JP | 2009076509 | | 4/2009 |
| JP | 2009161524 | A | 7/2009 |
| JP | 2009247171 | | 10/2009 |
| JP | 2009266943 | A | 11/2009 |
| JP | 2009267171 | A | 11/2009 |
| JP | 2009267244 | A | 11/2009 |
| JP | 2009272339 | A | 11/2009 |
| JP | 2009283891 | A | 12/2009 |
| JP | 4460952 | | 5/2010 |
| JP | 2010135689 | A | 6/2010 |
| JP | 2010171205 | A | 8/2010 |
| JP | 2011071452 | A | 4/2011 |
| JP | 2012074444 | A | 4/2012 |
| JP | 2012079895 | A | 4/2012 |
| JP | 2012079898 | A | 4/2012 |
| JP | 5604505 | | 9/2012 |
| JP | 2012522843 | | 9/2012 |
| JP | 2012207231 | A | 10/2012 |
| JP | 2012222255 | A | 11/2012 |
| JP | 2012231135 | A | 11/2012 |
| JP | 2013023500 | A | 2/2013 |
| JP | 2013048256 | A | 3/2013 |
| JP | 2013053149 | A | 3/2013 |
| JP | 2013525436 | | 6/2013 |
| JP | 2014019701 | A | 2/2014 |
| JP | 2014058504 | A | 4/2014 |
| JP | 2014520096 | | 8/2014 |
| JP | 2012709899 | | 11/2014 |
| JP | 2014221807 | A | 11/2014 |
| JP | 2014239225 | A | 12/2014 |
| JP | 2015081257 | A | 4/2015 |
| KR | 20060011537 | | 2/2006 |
| KR | 20060015371 | | 2/2006 |
| KR | 20060115371 | | 11/2006 |
| KR | 20070061830 | | 6/2007 |
| KR | 20070112465 | | 11/2007 |
| KR | 20130043460 | | 4/2013 |
| KR | 101338250 | | 12/2013 |
| KR | 20140052501 | | 5/2014 |
| TW | 200701835 | | 1/2007 |
| TW | 201249851 | | 12/2012 |
| TW | 201307365 | A | 2/2013 |
| TW | 201710277 | | 3/2017 |
| WO | 0070655 | A2 | 11/2000 |
| WO | 2000070655 | | 11/2000 |
| WO | 2004003108 | | 1/2004 |
| WO | 2004070655 | | 8/2004 |
| WO | 2004085450 | | 10/2004 |
| WO | 2004108857 | | 12/2004 |
| WO | 2005042444 | A2 | 5/2005 |
| WO | 2005042550 | A1 | 5/2005 |
| WO | 2005113704 | | 12/2005 |
| WO | 2006033440 | A1 | 3/2006 |
| WO | 2006067074 | | 6/2006 |
| WO | 2006081780 | | 8/2006 |
| WO | 2006098505 | A1 | 9/2006 |
| WO | 2006113106 | | 10/2006 |
| WO | 2006115299 | A1 | 11/2006 |
| WO | 2006115301 | | 11/2006 |
| WO | 2007034985 | A1 | 3/2007 |
| WO | 2007069498 | A1 | 6/2007 |
| WO | 2008054578 | | 5/2008 |
| WO | 2008066192 | A1 | 6/2008 |
| WO | 2008066195 | A1 | 6/2008 |
| WO | 2008066196 | A1 | 6/2008 |
| WO | 2008101842 | A1 | 8/2008 |
| WO | 2008117889 | | 10/2008 |
| WO | 2008123540 | | 10/2008 |
| WO | 2008131932 | A1 | 11/2008 |
| WO | 2009003455 | | 1/2009 |
| WO | 2009008277 | | 1/2009 |
| WO | 2009011327 | | 1/2009 |
| WO | 2009017211 | A1 | 2/2009 |
| WO | 2009023667 | | 2/2009 |
| WO | 2009086209 | | 7/2009 |
| WO | 2009111299 | | 9/2009 |

(56) References Cited

FOREIGN PATENT DOCUMENTS

| | | |
|---|---|---|
| WO | 2010007098 A1 | 1/2010 |
| WO | 2010056669 | 5/2010 |
| WO | 2010093176 | 8/2010 |
| WO | 2010105141 | 9/2010 |
| WO | 2010118026 A2 | 10/2010 |
| WO | 2011064335 A1 | 6/2011 |
| WO | 2011070989 A1 | 6/2011 |
| WO | 2011089163 | 7/2011 |
| WO | 2011137429 A2 | 11/2011 |
| WO | 2011137431 A2 | 11/2011 |
| WO | 2012074909 | 6/2012 |
| WO | 2012112853 A1 | 8/2012 |
| WO | 2012116231 | 8/2012 |
| WO | 2012142387 | 10/2012 |
| WO | 2012162488 A1 | 11/2012 |
| WO | 2012163471 A1 | 12/2012 |
| WO | 2013130483 A1 | 9/2013 |
| WO | 2014009310 | 1/2014 |
| WO | 2014016611 | 1/2014 |
| WO | 2014031977 | 2/2014 |
| WO | 2014047616 A1 | 3/2014 |
| WO | 2014109814 | 7/2014 |
| WO | 2014208271 | 12/2014 |
| WO | 2015027060 A1 | 2/2015 |
| WO | 2015131158 | 9/2015 |
| WO | 2016025921 | 2/2016 |
| WO | 2016029137 | 2/2016 |
| WO | 2016029186 | 2/2016 |
| WO | 2016088354 A1 | 6/2016 |
| WO | 2016197019 | 12/2016 |
| WO | 2017117935 | 7/2017 |
| WO | 2018071697 | 4/2018 |
| WO | 2018140765 | 8/2018 |
| WO | 2019079505 | 4/2019 |
| WO | 2019079508 | 4/2019 |
| WO | 2019079509 | 4/2019 |
| WO | 2019236541 | 12/2019 |
| WO | 2020018476 | 1/2020 |

OTHER PUBLICATIONS

Baldo et al., "Highly Efficient Phosphorescent Emission from Organic Electroluminescent Devices," Nature, vol. 395, Sep. 10, 1998, pp. 151-154.

Baldo et al., "Very high-efficiency green organic light-emitting devices based on electrophosphorescence," Applied Physics Letters, vol. 75, No. 1, Jul. 5, 1999, pp. 4-6.

Baldo et al., Very High-Efficiency Green Organic Light-Emitting Devices Based on Electrophosphorescence, Appl Phys Lett, 75(3):4-6 (1999).

Baldo, M. et al., "Excitonic singlet-triplet ratio in a semiconducting organic thin film", Physical Review B, Nov. 1999, vol. 60, No. 20, pp. 14422-14428 <DOI:10.1103/PhysRevB.60.14422>.

Baldo, M. et al., "High-efficiency fluorescent organic light-emitting devices using a phosphorescent sensitizer", Nature, Feb. 2000, vol. 403, pp. 750-753.

Barry O'Brien et al.: White organic light emitting diodes using Pt-based red, green and blue phosphorescent dopants. Proc. SPIE, vol. 8829, pp. 1-6, Aug. 25, 2013.

Barry O'Brien et al., "High efficiency white organic light emitting diodes employing blue and red platinum emitters," Journal of Photonics for Energy, vol. 4, 2014, pp. 043597-1-8.

Berson et al. (2007). "Poly(3-hexylthiophene) fibers for photovoltaic applications," Adv. Funct. Mat., 17, 1377-84.

Bouman et al. (1994). "Chiroptical properties of regioregular chiral polythiophenes," Mol. Cryst. Liq. Cryst., 256, 439-48.

Brian W. D'Andrade et al., "Controlling Exciton Diffusion in Multilayer White Phosphorescent Organic Light Emitting Devices", Adv. Mater., vol. 14, No. 2, Jan. 16, 2002, pp. 147-151.

Bronner; Dalton Trans., 2010, 39, 180-184. DOI: 10.1039/b908424j (Year: 2010) (5 pages).

Brooks, J. et al., "Synthesis and Characterization of Phosphorescent Cyclometalated Platinum Complexes", Inorganic Chemistry, May 2002, vol. 41, No. 12, pp. 3055-3066 <DOI:10.1021/ ic0255508>.

Brown, A. et al., "Optical spectroscopy of triplet excitons and charged excitations in poly(p-phenylenevinylene) light-emitting diodes", Chemical Physics Letters, Jul. 1993, vol. 210, No. 1-3, pp. 61-66 <DOI:10.1016/0009-2614(93)89100-V>.

Burroughes, J. et al., "Light-emitting diodes based on conjugated polymers", Nature, Oct. 1990, vol. 347, pp. 539-541.

Campbell et al. (2008). "Low-temperature control of nanoscale morphology for high performance polymer photovoltaics," Nano Lett., 8, 3942-47.

Chen, F. et al., "High-performance polymer light-emitting diodes doped with a red phosphorescent iridium complex", Applied Physics Letters, Apr. 2002 [available online Mar. 2002], vol. 80, No. 13, pp. 2308-2310 <10.1063/1.1462862>.

Chen, X., et al., "Fluorescent Chemosensors Based on Spiroring-Opening of Xanthenes and Related Derivatives", Chemical Reviews, 2012 [available online Oct. 2011], vol. 112, No. 3, pp. 1910-1956 <DOI:10.1021/cr200201z>.

Chew, S. et al: Photoluminescence and electroluminescence of a new blue-emitting homoleptic iridium complex. Applied Phys. Letters; vol. 88, pp. 093510-1-093510-3, 2006.

Chi et al.; Transition-metal phosphors with cyclometalating ligands: fundamentals and applications, Chemical Society Reviews, vol. 39, No. 2, Feb. 2010, pp. 638-655.

Chi-Ming Che et al. "Photophysical Properties and OLEO Applications of Phosphorescent Platinum(II) Schiff Base Complexes," Chem. Eur. J., vol. 16, 2010, pp. 233-247.

Chow; Angew. Chem. Int. Ed. 2013, 52, 11775-11779. DOI: 10.1002/ anie.201305590 (Year: 2013) (5 pages).

Christoph Ulbricht et al., "Synthesis and Characterization of Oxetane-Functionalized Phosphorescent Ir(III)-Complexes", Macromol. Chem. Phys. 2009, 210, pp. 531-541.

Coakley et al. (2004). "Conjugated polymer photovoltaic cells," Chem. Mater., 16, 4533-4542.

Colombo, M. et al., "Synthesis and high-resolution optical spectroscopy of bis[2-(2-thienyl)pyridinato-C3, N'](2,2'-bipyridine)iridium(III)", Inorganic Chemistry, Jul. 1993, vol. 32, No. 14, pp. 3081-3087 <DOI:10.1021/ic00066a019>.

D.F. O'Brien et al., "Improved energy transfer in electrophosphorescent devices," Appl. Phys. Lett., vol. 74, No. 3, Jan. 18, 1999, pp. 442-444.

D'Andrade, B. et al., "Operational stability of electrophosphorescent devices containing p and n doped transport layers", Applied Physics Letters, Nov. 2003, vol. 83, No. 19, pp. 3858-3860 <DOI:10.1063/ 1.1624473>.

Dan Wang et al., "Carbazole and arylamine functionalized iridium complexes for efficient electro-phosphorescent light-emitting diodes", Inorganica Chimica Acta 370 (2011) pp. 340-345.

Dileep A. K. Vezzu et al., "Highly Luminescent Tetradentate Bis-Cyclometalated Platinum Complexes: Design, Synthesis, Structure, Photophysics, and Electroluminescence Application," Inorg. Chem., vol. 49, 2010, pp. 5107-5119.

Dorwald, Side Reactions in Organic Synthesis 2005, Wiley:VCH Weinheim Preface, pp. 1-15 & Chapter 1, pp. 279-308.

Dorwald; "Side Reactions in Organic Synthesis: A Guide to Successful Synthesis Design," Chapter 1, 2005 Wiley-VCH Verlag Gmbh & Co. KGaA, Wienheim, 32 pages.

Dsouza, R., et al., "Fluorescent Dyes and Their Supramolecular Host/Guest Complexes with Macrocycles in Aqueous Solution", Oct. 2011, vol. 111, No. 12, pp. 7941-7980 <DOI: 10.1021/ cr200213s>.

Eric Turner et al., "Cyclometalated Platinum Complexes with Luminescent Quantum Yields Approaching 100%," Inorg. Chem., 2013, vol. 52, pp. 7344-7351.

Evan L. Williams et al., "Excimer-Based White Phosphorescent Organic Light Emitting Diodes with Nearly 100% Internal Quantum Efficiency," Adv. Mater., vol. 19, 2007, pp. 197-202.

Finikova,M.A. et al., New Selective Synthesis of Substituted Tetrabenzoporphyris, Doklady Chemistry, 2003, vol. 391, No. 4-6, pp. 222-224.

(56) References Cited

OTHER PUBLICATIONS

Fuchs, C. et al., "Enhanced light emission from top-emitting organic light-emitting diodes by optimizing surface plasmon polariton losses", arXiv, submitted Mar. 2015, 11 pages, arXiv:1503.01309.
Fuchs, C. et al., "Enhanced light emission from top-emitting organic light-emitting diodes by optimizing surface plasmon polariton losses", Physical Review B, Dec. 2015, vol. 92, No. 24, pp. 245306-1-245306-10 <DOI:10.1103/PhysRevB.92.245306>.
Galanin et al. Synthesis and Properties of meso-Phenyl-Substituted Tetrabenzoazaporphines Magnesium Complexes. Russian Journal of Organic Chemistry (Translation of Zhurnal Organicheskoi Khimii) (2002), 38(8), 1200-1203.
Galanin et al., meso-Phenyltetrabenzoazaporphyrins and their zinc complexes. Synthesis and spectral properties, Russian Journal of General Chemistry (2005), 75(4), 651-655.
Gather, M. et al., "Recent advances in light outcoupling from white organic light-emitting diodes," Journal of Photonics for Energy, May 2015, vol. 5, No. 1, 057607-1-057607-20 <DOI:10.1117/1.JPE.5.057607>.
Glauco Ponterini et al., "Comparison of Radiationless Decay Processes in Osmium and Platinum Porphyrins," J. Am. Chem. Soc., vol. 105, No. 14, 1983, pp. 4639-4645.
Gong et al., Highly Selective Complexation of Metal Ions by the Self-Tuning Tetraazacalixpyridine macrocycles, Tetrahedron, 65(1): 87-92 (2009).
Gottumukkala, V. et al., Synthesis, cellular uptake and animal toxicity of a tetra carboranylphenyl N-tetrabenzoporphyr in, Bioorganic &Medicinal Chemistry, 2006, vol. 14, pp. 1871-1879.
Graf, A. et al., "Correlating the transition dipole moment orientation of phosphorescent emitter molecules in OLEDs with basic material properties", Journal of Materials Chemistry C, Oct. 2014, vol. 2, No. 48, pp. 10298-10304 <DOI: 10.1039/c4tc00997e>.
Guijie Li et al., "Efficient and stable red organic light emitting devices from a tetradentate cyclometalated platinum complex," Organic Electronics, 2014, vol. 15 pp. 1862-1867.
Guijie Li et al., "Modifying Emission Spectral Bandwidth of Phosphorescent Platinum(II) Complexes Through Synthetic Control," Inorg. Chem. 2017, 56, 8244-8256.
Guijie Li et al., Efficient and Stable White Organic Light-Emitting Diodes Employing a Single Emitter, Adv. Mater., 2014, vol. 26, pp. 2931-2936.
Hansen (1969). "The universality of the solubility parameter," I & EC Product Research and Development, 8, 2-11.
Hatakeyama, T. et al., "Ultrapure Blue Thermally Activated Delayed Fluorescence Molecules: Effi cient HOMO-LUMO Separation by the Multiple Resonance Effect", Advanced Materials, Apr. 2016, vol. 28, No. 14, pp. 2777-2781, <DOI:10.1002/adma.201505491>.
Hirohiko Fukagawa et al., "Highly Efficient and Stable Red Phosphorescent Organic Light-Emitting Diodes Using Platinum Complexes," Adv. Mater., 2012, vol. 24, pp. 5099-5103.
Hoe-Joo Seo et al., "Blue phosphorescent iridium(III) complexes containing carbazole-functionalized phenyl pyridine for organic light-emitting diodes: energy transfer from carbazolyl moieties to iridium(III) cores", RSC Advances, 2011, 1, pp. 755-757.
Holmes, R. et al., "Efficient, deep-blue organic electrophosphorescence by guest charge trapping", Applied Physics Letters, Nov. 2003 [available online Oct. 2003], vol. 83, No. 18, pp. 3818-3820 <DOI:10.1063/1.1624639>.
Huaijun Tang et al., "Novel yellow phosphorescent iridium complexes containing a carbazoleeoxadiazole unit used in polymeric light-emitting diodes", Dyes and Pigments 91 (2011) pp. 413-421.
Imre et al (1996). "Liquid-liquid demixing ffrom solutions of polystyrene. 1. A review. 2. Improved correlation with solvent properties," J. Phys. Chem. Ref. Data, 25, 637-61.
Ivaylo Ivanov et al., "Comparison of the INDO band structures of polyacetylene, polythiophene, polyfuran, and polypyrrole," Synthetic Metals, vol. 116, Issues 1-3, Jan. 1, 2001, pp. 111-114.
Jack W. Levell et al., "Carbazole/iridium dendrimer side-chain phosphorescent copolymers for efficient light emitting devices", New J. Chem., 2012, vol. 36, pp. 407-413.
Jan Kalinowski et al., "Light-emitting devices based on organometallic platinum complexes as emitters," Coordination Chemistry Reviews, vol. 255, 2011, pp. 2401-2425.
Jeong et al. (2010). "Improved efficiency of bulk heterojunction poly (3-hexylthiophene): [6,6]-phenyl-C61-butyric acid methyl ester photovoltaic devices using discotic liquid crystal additives," Appl. Phys. Lett . . . 96, 183305. (3 pages).
Jeonghun Kwak et al., "Bright and Efficient Full-Color Colloidal Quantum Dot Light-Emitting Diodes Using an Inverted Device Structure," Nano Letters 12, Apr. 2, 2012, pp. 2362-2366.
Ji Hyun Seo et al., "Efficient blue-green organic light-emitting diodes based on heteroleptic tris-cyclometalated iridium (III) complexes". Thin Solid Films, vol. 517, pp. 1807-1810 (2009).
JP2009267244, English Translation from EPO, Nov. 2009, 80 pages.
JP2010135689, English translation from EPO, dated Jun. 2010, 95 pages.
Kai Li et al., "Light-emitting platinum(II) complexes supported by tetradentate dianionic bis(N-heterocyclic carbene) ligands: towards robust blue electrophosphors," Chem. Sci., 2013, vol. 4, pp. 2630-2644.
Ke Feng et al., "Norbornene-Based Copolymers Containing Platinum Complexes and Bis(carbazolyl)benzene Groups in Their Side-Chains," Macromolecules, vol. 42, 2009, pp. 6855-6864.
Kim et al (2009). "Altering the thermodynamics of phase separation in inverted bulk-heterojunction organic solar cells," Adv. Mater., 21, 3110-15.
Kim et al. (2005). "Device annealing effect in organic solar cells with blends of regioregular poly (3-hexylthiophene) and soluble fullerene," Appl. Phys. Lett. 86, 063502. (3 pages).
Kim, HY. et al., "Crystal Organic Light-Emitting Diodes with Perfectly Oriented Non-Doped Pt-Based Emitting Layer", Advanced Functional Materials, Feb. 2016, vol. 28, No. 13, pp. 2526-2532 <DOI:10.1002/adma.201504451>.
Kim, JJ., "Setting up the new efficiency limit of OLEDs; Abstract" [online], Electrical Engineering—Princeton University, Aug. 2014 [retrieved on Aug. 24, 2016], retrieved from the internet: <URL:http://ee.princeton.edu/events/setting-new-efficiency-limit-oled> 2 pages.
Kim, SY. et al., "Organic Light-Emitting Diodes with 30% External Quantum Efficiency Based on a Horizontally Oriented Emitter", Advanced Functional Materials, Mar. 2013, vol. 23, No. 31, pp. 3896-3900 <DOI:10.1002/adfm.201300104 >.
Kroon et al. (2008). "Small bandgap olymers for organic solar cells," Polymer Reviews, 48, 531-82.
Kwon-Hyeon Kim et al., "Controlling Emitting Dipole Orientation with Methyl Substituents on Main Ligand of Iridium Complexes for Highly Efficient Phosphorescent Organic Light-Emitting Diodes", Adv. Optical Mater. 2015, 3, pp. 1191-1196.
Kwon-Hyeon Kim et al., "Crystal Organic Light-Emitting Diodes with Perfectly Oriented Non-Doped Pt-Based Emitting Layer", Adv. Mater. 2016, 28, pp. 2526-2532.
Kwong, R. et al., "High operational stability of electrophosphorescent devices", Applied Physics Letters, Jul. 2002 [available online Jun. 2002], vol. 81, No. 1, pp. 162-164 <DOI:10.1063/1.1489503>.
Lamansky, S. et al., "Cyclometalated IR complexes in polymer organic light-emitting devices", Journal of Applied Physics, Aug. 2002 [available online Jul. 2002], vol. 92, No. 3, pp. 1570-1575 <10.1063/1.1491587>.
Lamansky, S. et al., "Synthesis and Characterization of Phosphorescent Cyclometalated Iridium Complexes", Inorganic Chemistry, Mar. 2001, vol. 40, No. 7, pp. 1704-1711 <DOI:10.1021/ ic0008969>.
Lampe, T. et al., "Dependence of Phosphorescent Emitter Orientation on Deposition Technique in Doped Organic Films", Chemistry of Materials, Jan. 2016, vol. 28, pp. 712-715 <DOI:10.1021/acs.chemmater.5b04607>.
Lee et al. (2008). "Processing additives for inproved efficiency from bulk heterojunction solar cells," J. Am. Chem. Soc, 130, 3619-23.
Li et al. (2005). "Investigation of annealing effects and film thickness dependence of polymer solar cells based on poly (3-hexylthiophene)," J. Appl. Phys., 98, 043704. (5 pages).
Li et al. (2007). "Solvent annealing effect in polymer solar cells based on poly(3-hexylthiophene) and methanofullerenes," Adv. Funct. Mater, 17, 1636-44.

(56) References Cited

OTHER PUBLICATIONS

Li, J. et al., "Synthesis and characterization of cyclometalated Ir(III) complexes with pyrazolyl ancillary ligands", Polyhedron, Jan. 2004, vol. 23, No. 2-3, pp. 419-428 <DOI: 10.1016/ j.poly.2003.11.028>.
Li, J., "Efficient and Stable OLEDs Employing Square Planar Metal Complexes and Inorganic Nanoparticles", in DOE SSL R&D Workshop (Raleigh, North Carolina, 2016), Feb. 2016, 15 pages.
Li, J., et al., "Synthetic Control of Excited-State Properties in Cyclometalated Ir(III) Complexes Using Ancillary Ligands", Inorganic Chemistry, Feb. 2005, vol. 44, No. 6, pp. 1713-1727 <DOI:10. 1021/ ic048599h>.
Liang, et al. (2010). "For the bright future-bulk heterojunction polymer solar cells with power conversion efficiency of 7.4%," Adv. Mater. 22, E135-38.
Lin, TA et al., "Sky-Blue Organic Light Emitting Diode with 37% External Quantum Efficiency Using Thermally Activated Delayed Fluorescence from Spiroacridine-Triazine Hybrid", Advanced Materials, Aug. 2016, vol. 28, No. 32, pp. 6876-6983 <DOI:10.1002/ adma.201601675>.
Maestri et al., "Absorption Spectra and Luminescence Properties of Isomeric Platinum (II) and Palladium (II) Complexes Containing 1,1'-Biphenyldiyl, 2-Phenylpyridine, and 2,2'-Bipyridine as Ligands," Helvetica Chimica Acta, vol. 71, Issue 5, Aug. 10, 1988, pp. 1053-1059.
Marc Lepeltier et al., "Efficient blue green organic light-emitting devices based on a monofluorinated heteroleptic iridium(III) complex," Synthetic Metals, vol. 199, 2015, pp. 139-146.
Markham, J. et al., "High-efficiency green phosphorescence from spin-coated single-layer dendrimer light-emitting diodes", Applied Physics Lettersm Apr. 2002, vol. 80, vol. 15, pp. 2645-2647 <DOI:10.1063/1.1469218>.
Matthew J. Jurow et al., "Understanding and predicting the orientation of heteroleptic phosphors in organic light-emitting materials", Nature Materials, vol. 15, Jan. 2016, pp. 85-93.
Michl, J., "Relationship of bonding to electronic spectra", Accounts of Chemical Research, May 1990, vol. 23, No. 5, pp. 127-128 <DOI:10.1021/ar00173a001>.
Miller, R. et al., "Polysilane high polymers", Chemical Reviews, Sep. 1989, vol. 89, No. 6, pp. 1359-1410 <DOI:10.1021/ cr00096a006>.
Morana et al. (2007). "Organic field-effect devices as tool to characterize the bipolar transport in polymer-fullerene blends: the case of P3HT-PCBM," Adv. Funct. Mat., 17, 3274-83.
Moule et al. (2008). "Controlling morphology in Polymer-Fullerene mixtures," Adv. Mater., 20, 240-45.
Murakami; JP 2007324309, English machine translation from EPO, dated Dec. 13, 2007, 89 pages.
Nazeeruddin, M. et al., "Highly Phosphorescence Iridium Complexes and Their Application in Organic Light-Emitting Devices", Journal of the American Chemical Society, Jun. 2003, vol. 125, No. 29, pp. 8790-8797 <DOI:10.1021/ja021413y>.
Nicholas R. Evans et al., "Triplet Energy Back Transfer in Conjugated Polymers with Pendant Phosphorescent Iridium Complexes," J. Am. Chem. Soc., vol. 128, 2006, pp. 6647-6656.
Nillson et al. (2007). "Morphology and phase segregation of spincasted films of polyfluorene/PCBM Blends," Macromolecules, 40, 8291-8301.
Notice of Allowance dated Dec. 10, 2020 for U.S. Appl. No. 15/905,385 (pp. 1-8).
Olynick et al. (2009). "The link between nanoscale feature development in a negative resist and the Hansen solubility sphere," Journal of Polymer Science: Part B: Polymer Physics, 47, 2091-2105.
Peet et al. (2007). "Efficiency enhancement in low-bandgap polymer solar cells by processing with alkane dithiols," Nature Materials, 6, 497-500.
Pivrikas et al. (2008). "Substituting the postproduction treatment for bulk-heterojunction solar cells using chemical additives," Organic Electronics, 9, 775-82.
Pui Keong Chow et al., "Strongly Phosphorescent Palladium(II) Complexes of Tetradentate Ligands with Mixed Oxygen, Carbon, and Nitrogen Donor Atoms: Photophysics, Photochemistry, and Applications," Angew. Chem. Int. Ed. 2013, 52, 11775-11779.
Pui-Keong Chow et al., "Highly luminescent palladium(II) complexes with sub-millisecond blue to green phosphorescent excited states. Photocatalysis and highly efficient PSF-OLEDs," Chem. Sci., 2016, 7, 6083-6098.
Results from SciFinder Compound Search on Dec. 8, 2016. (17 pages).
Rui Zhu et al., "Color tuning based on a six-membered chelated iridium (III) complex with aza-aromatic ligand,", Chemistry Letters, vol. 34, No. 12, 2005, pp. 1668-1669.
Russell J. Holmes et al., "Blue and Near-UV Phosphorescence from Iridium Complexes with Cyclometalated Pyrazolyl or N-Heterocyclic Carbene Ligands," Inorganic Chemistry, 2005, vol. 44, No. 22, pp. 7995-8003.
Sajoto, T. et al., "Temperature Dependence of Blue Phosphorescent Cyclometalated Ir(III) Complexes", Journal of the American Chemical Society, Jun. 2009, vol. 131, No. 28, pp. 9813-9822 <DOI:10. 1021/ja903317w>.
Sakai, Y. et al., "Simple model-free estimation of orientation order parameters of vacuum-deposited and spin-coated amorphous films used in organic light-emitting diodes", Applied Physics Express, Aug. 2015, vol. 8, No. 9, pp. 096601-1-096601-4 <DOI:10.7567/ APEX.8.096601>.
Saricifci et al. (1993). "Semiconducting polymerbuckminsterfullerene heterojunctions: diodes photodiodes, and photovoltaic cells," Appl. Phys. Lett., 62, 585-87.
Satake et al., "Interconvertible Cationic and Neutral Pyridinylimidazole η3-Allylpalladium Complexes. Structural Assignment by 1H, 13C, and 15N Nmr and X-ray Diffraction", Organometallics, vol. 18, No. 24, 1999, pp. 5108-5111.
Saunders et al. (2008). "Nanoparticle-polymer photovoltaic cells," Advances in Colloid and Interface Science, 138, 1-23.
Senes, A. et al., "Transition dipole moment orientation in films of solution processed fluorescent oligomers: investigating the influence of molecular anisotropy", Journal of Materials Chemistry C, Jun. 2016, vol. 4, No. 26, pp. 6302-6308 <DOI:10.1039/ c5tc03481g>.
Shih-Chun Lo et al. "High-Triplet-Energy Dendrons: Enhancing the Luminescence of Deep Blue Phosphorescent Indium(III) Complexes" J. Am. Chem. Soc., vol. 131, 2009, pp. 16681-16688.
Shin et al. (2010). "Abrupt morphology change upon thermal annealing in Poly(3-hexathiophene)/soluble fullerene blend films for polymer solar cells," Adv. Funct. Mater., 20, 748-54.
Shiro Koseki et al., "Spin-orbit coupling analyses of the geometrical effects on phosphorescence in Ir(ppy)3 and its derivatives", J. Phys. Chem. C, vol. 117, pp. 5314-5327 (2013).
Shizuo Tokito et al. "Confinement of triplet energy on phosphorescent molecules for highly-efficient organic blue-light-emitting devices" Applied Physics Letters, vol. 83, No. 3, Jul. 21, 2003, pp. 569-571.
Stefan Bernhard, "The First Six Years: A Report," Department of Chemistry, Princeton University, May 2008, 11 pages.
Stephen R. Forrest, "The path to ubiquitous and low-cost organic electronic appliances on plastic," Nature, vol. 428, Apr. 29, 2004, pp. 911-918.
Steven C. F. Kui et al., "Robust phosphorescent platinum(II) complexes with tetradentate O^N^C^N ligands: high efficiency OLEDs with excellent efficiency stability," Chem. Commun., 2013, vol. 49, pp. 1497-1499.
Steven C. F. Kui et al., "Robust Phosphorescent Platinum(II) Complexes Containing Tetradentate O^N^C^N Ligands: Excimeric Excited State and Application in Organic White-Light-Emitting Diodes," Chem. Eur. J., 2013, vol. 19, pp. 69-73.
Strouse, G. et al., "Optical Spectroscopy of Single Crystal [Re(bpy)(CO)4](PF6): Mixing between Charge Transfer and Ligand Centered Excited States", Inorganic Chemistry, Oct. 1995, vol. 34, No. 22, pp. 5578-5587 <DOI:10.1021/ic00126a031>.
Supporting Information: Xiao-Chun Hang et al., "Highly Efficient Blue-Emitting Cyclometalated Platinum(II) Complexes by Judicious Molecular Design," Wiley-VCH 2013, 7 pages.

(56) References Cited

OTHER PUBLICATIONS

Sylvia Bettington et al. "Tris-Cyclometalated Iridium(III) Complexes of Carbazole(fluorenyl)pyridine Ligands: Synthesis, Redox and Photophysical Properties, and Electrophosphorescent Light-Emitting Diodes" Chemistry: A European Journal, 2007, vol. 13, pp. 1423-1431.

Tang, C. et al., "Organic electroluminescent diodes", Applied Physics Letters, Jul. 1987, vol. 51, No. 12, pp. 913-915 <DOI:10.1063/1.98799>.

Tsuoboyama, A. et al., "Homoleptic Cyclometalated Iridium Complexes with Highly Efficient Red Phosphorescence and Application to Organic Light-Emitting Diode", Journal of the American Chemical Society, Sep. 2003, vol. 125, No. 42, pp. 12971-12979 <DOI:10.1021/ja034732d>.

Turro, N., "Modern Molecular Photochemistry" (Sausalito, California, University Science Books, 1991), p. 48. (3 pages).

Tyler Fleetham et al., "Efficient "pure" blue OLEDs employing tetradentate Pt complexes with a narrow spectral bandwidth," Advanced Materials (Weinheim, Germany), Vo. 26, No. 41, 2014, pp. 7116-7121.

Tyler Fleetham et al., "Efficient Red-Emitting Platinum Complex with Long Operational Stability," ACS Appl. Mater. Interfaces 2015, 7, 16240-16246.

U.S. Appl. No. 16/751,561, filed Jan. 24, 2020, has not yet published. Inventor: Li.

U.S. Appl. No. 16/751,586, filed on Jan. 24, 2020, has not yet published. Inventor: Li et al.

U.S. Appl. No. 16/668,010, filed Oct. 30, 2019.

U.S. Appl. No. 16/739,480, filed Jan. 10, 2020.

U.S. Appl. No. 61/692,937.

U.S. Appl. No. 61/719,077.

V. Adamovich et al., "High efficiency single dopant white electrophosphorescent light emitting diodes", New J. Chem, vol. 26, pp. 1171-1178. 2002.

V. Thamilarasan et al., "Green-emitting phosphorescent iridium(III) complex: Structural, photophysical and electrochemical properties," Inorganica Chimica Acta, vol. 408, 2013, pp. 240-245.

Vanessa Wood et al., "Colloidal quantum dot light-emitting devices," Nano Reviews 1, Jul. 2010, pp. 5202. (7 pages).

Wang et al. (2010). "The development of nanoscale morphology in polymer: fullerene photovoltaic blends during solvent casting," Soft Matter, 6, 4128-4134.

Wang et al., C(aryl)-C(alkyl) bond formation from Cu(CI04)2-mediated oxidative cross coupling reaction between arenes and alkyllithium reagents through structurally well-defined Ar—Cu(III) intermediates, Chem Commun, 48: 9418-9420 (2012).

Williams, E. et al., "Excimer□Based White Phosphorescent Organic Light□Emitting Diodes with Nearly 100 % Internal Quantum Efficiency", Advanced Materials, Jan. 2007, vol. 19, No. 2, pp. 197-202 <DOI:10.1002/adma.200602174>.

Williams, E. et al., "Organic light-emitting diodes having exclusive near-infrared electrophosphorescence", Applied Physics Letters, Aug. 2006, vol. 89, No. 8, pp. 083506-1-083506-3 <DOI:10.1063/1.2335275>.

Wong. Challenges in organometallic research—Great opportunity for solar cells and OLEDs. Journal of Organometallic Chemistry 2009, vol. 694, pp. 2644-2647.

Xiao-Chu Hang et al., "Highly Efficient Blue-Emitting Cyclometalated Platinum(II) Complexes by Judicious Molecular Design," Angewandte Chemie, International Edition, vol. 52, Issue 26, Jun. 24, 2013, pp. 6753-6756.

Xiaofan Ren et al., "Ultrahigh Energy Gap Hosts in Deep Blue Organic Electrophosphorescent Devices," Chem. Mater., vol. 16, 2004, pp. 4743-4747.

Xin Li et al., "Density functional theory study of photophysical properties of iridium (III) complexes with phenylisoquinoline and phenylpyridine ligands", The Journal of Physical Chemistry C, 2011, vol. 115, No. 42, pp. 20722-20731.

Yakubov, L.A. et al., Synthesis and Properties of Zinc Complexes of mesoHexadecyloxy-Substituted Tetrabenzoporphyrin and Tetrabenzoazaporphyrins, Russian Journal of Organic Chemistry, 2008, vol. 44, No. 5, pp. 755-760.

Yang et al. (2005). "Nanoscale morphology of high-performance polymer solar cells," Nano Lett., 5, 579-83.

Yang, X. et al., "Efficient Blue□ and White□Emitting Electrophosphorescent Devices Based on Platinum(II) [1,3□Difluoro□4,6□di(2□pyridinyl)benzene] Chloride", Advanced Materials, Jun. 2008, vol. 20, No. 12, pp. 2405-2409 <DOI:10.1002/adma.200702940>.

Yao et al. (2008). "Effect of solvent mixture on nanoscale phase separation in polymer solar cells," Adv. Funct. Mater., 18, 1783-89.

Yao et al., Cu(CI04)2-Mediated Arene C—H Bond Halogenations of Azacalixaromatics Using Alkali Metal Halides as Halogen Sources, The Journal of Organic Chemistry, 77(7): 3336-3340 (2012).

Ying Yang et al., "Induction of Circularly Polarized Electroluminescence from an Achiral Light-Emitting Polymer via a Chiral Small-Molecule Dopant," Advanced Materials, vol. 25, Issue 18, May 14, 2013, pp. 2624-2628.

Yu et al. (1995). "Polymer Photovoltaic Cells: Enhanced efficiencies via a network of internal donor-acceptor heterojunctions," Science, 270, 1789-91.

Z Liu et al., "Green and blue-green phosphorescent heteroleptic iridium complexes containing carbazole-functionalized beta-diketonate for non-doped organic light-emitting diodes", Organic Electronics 9 (2008) pp. 171-182.

Z Xu et al., "Synthesis and properties of iridium complexes based 1,3,4-oxadiazoles derivatives", Tetrahedron 64 (2008) pp. 1860-1867.

Zhi-Qiang Zhu et. al., "Efficient Cyclometalated Platinum(II) Complex with Superior Operational Stability," Adv. Mater. 29 (2017) 1605002, pp. 1-5.

Zhi-Qiang Zhu et.al., "Harvesting All Electrogenerated Excitons through Metal Assisted Delayed Fluorescent Materials," Adv. Mater. 27 (2015) 2533-2537.

Zhu, W. et al., "Highly efficient electrophosphorescent devices based on conjugated polymers doped with iridium complexes", Applied Physics Letters, Mar. 2002, vol. 80, No. 12, pp. 2045-2047 <DOI:10.1063/1.1461418>.

Claim set of the U.S. Appl. No. 62/444,973, filed Jan. 11, 2017, Lichang Zeng, 36 pages. (Year: 2017).

Korean Office Action (with English translation) for App. No. KR10-2015-0104260, dated Jan. 12, 2022, 12 pages.

Tyler Fleetham, "Phosphorescent Pt(II) and Pd(II) Complexes for Efficient, High-Color-Quality, and Stable OLEDs", 52 pages, Material Science and Engineering, Arizona State University (Year: 2016).

Machine-translated English version of JP 2012/074444 A, Sekine Noboru, Apr. 12, 2012 (Year: 2012) 75 pages.

T. Fleetham et al., 25 Advanced Materials, 2573-2576 (2013) (Year: 2013).

S. Kunic et al., 54th International Symposium ELMAR-2012, 31-35 (2012) (Year: 2012).

Y. Karzazi, 5 J. Mater. Environ. Sci., 1-12 (2014) (Year: 2014).

J. Park et al., 26 Semicond. Sci. Technol., 1-9 (2011) (Year: 2011).

* cited by examiner

TETRADENTATE PLATINUM (II) COMPLEXES CYCLOMETALATED WITH FUNCTIONALIZED PHENYL CARBENE LIGANDS AND THEIR ANALOGUES

CROSS-REFERENCE TO RELATED APPLICATION

The present application is a continuation of U.S. patent application Ser. No. 15/925,084, filed Mar. 19, 2018, now allowed, which is a continuation of U.S. patent application Ser. No. 14/805,691, filed Jul. 22, 2015, now U.S. Pat. No. 9,923,155, which claims the benefit of U.S. Provisional Patent Application No. 62/028,562, filed Jul. 24, 2014, all of which applications are incorporated herein by reference in their entireties.

TECHNICAL FIELD

This disclosure relates to tetradentate platinum (II) complexes for phosphorescent or delayed fluorescent and phosphorescent emitters in display and lighting applications, and specifically to phosphorescent of delayed fluorescent and phosphorescent tetradentate metal complexes having modified emission spectra.

BACKGROUND

Compounds capable of absorbing and/or emitting light can be ideally suited for use in a wide variety of optical and electroluminescent devices, including, for example, photo-absorbing devices such as solar- and photo-sensitive devices, organic light emitting diodes (OLEDs), photo-emitting devices, and devices capable of both photo-absorption and emission and as markers for bio-applications. Much research has been devoted to the discovery and optimization of organic and organometallic materials for using in optical and electroluminescent devices. Generally, research in this area aims to accomplish a number of goals, including improvements in absorption and emission efficiency and improvements in the stability of devices, as well as improvements in processing ability.

Despite significant advances in research devoted to optical and electro-optical materials (e.g., red and green phosphorescent organometallic materials are commercially available and have been used as phosphors in organic light emitting diodes (OLEDs), lighting, and advanced displays), many currently available materials exhibit a number of disadvantages, including poor processing ability, inefficient emission or absorption, and less than ideal stability, among others.

Good blue emitters are particularly scarce, with one challenge being the stability of the blue devices. The choice of the host materials has an impact on the stability and the efficiency of the devices. The lowest triplet excited state energy of the blue phosphors is very high compared with that of the red and green phosphors, which means that the lowest triplet excited state energy of host materials for the blue devices should be even higher. Thus, one of the problems is that there are limited host materials to be used for the blue devices. Accordingly, a need exists for new materials which exhibit improved performance in optical emitting and absorbing applications.

SUMMARY

A series of tetradentate platinum (II) complexes cyclometalated with functionalized phenyl carbene ligands and their analogues have been designed and synthesized. These complexes provide improved color purity, enhanced operational stability, and reduced or eliminated potential strong intermolecular interaction, and are suitable for luminescent labels, emitters for organic light emitting diodes (OLEDs) and lighting applications, and photon down-converters.

Disclosed herein are complexes of Formula I and Formula II:

Formula I

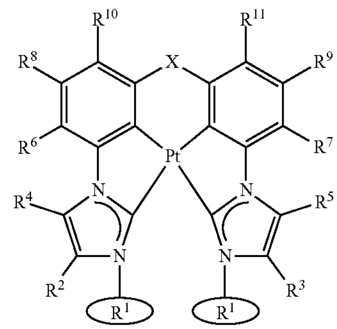

Formula II

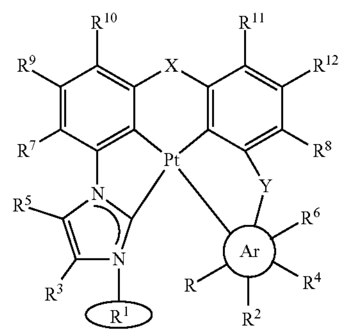

wherein:

Ar is a five-membered heteroaryl, a five-membered carbene, a five-membered N-heterocyclic carbene, a six-membered aryl, or a six-membered heteroaryl, each $R^1$ is independently

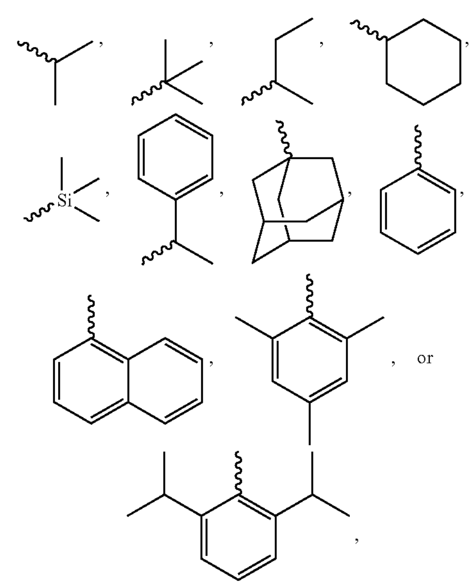

each of R, $R^2$, $R^3$, $R^4$, $R^5$, $R^6$, $R^7$, $R^8$, $R^9$, $R^{10}$, $R^{11}$, and $R^{12}$ is independently hydrogen, halogen, hydroxy, nitro, thiol; or substituted or unsubstituted: $C_1$-$C_4$ alkyl, alkoxy, aryl, or amino, wherein R is absent when Ar is a five-membered ring, X is O, S, S═O, O═S═O, Se, Se═O, O═Se═O, $NR^{2a}$, $PR^{2b}$, $AsR^{2c}$, $CR^{2d}R^{2e}$, $SiR^{2f}R^{2g}$, or $BR^{2h}$, each of $R^{2a}$, $R^{2b}$, $R^{2c}$, $R^{2d}$, $R^{2e}$, $R^{2f}$, $R^{2g}$, and $R^{2h}$ is independently substituted or unsubstituted $C_1$-$C_4$ alkyl or aryl, Y is present or absent, and if present Y is O, S, S═O, O═S═O, Se, Se═O, O═Se═O, $NR^{3a}$, $PR^{3b}$, $AsR^{3c}$, $CR^{3d}R^{3e}$, $SiR^{3f}R^{3g}$, or $BR^{3h}$, and each of $R^{3a}$, $R^{3b}$, $R^{3c}$, $R^{3d}$, $R^{3e}$, $R^{3f}$, $R^{3g}$, and $R^{3h}$ is independently substituted or unsubstituted $C_1$-$C_4$ alkyl or aryl.

In some cases, Ar is pyrazole, imidazole, oxazole, thiazole, pyridine, or the like. In certain cases, any two of R, $R^2$, $R^3$, $R^4$, $R^5$, $R^6$, $R^7$, $R^8$, $R^9$, $R^{10}$, $R^{11}$, and $R^{12}$ on the same ring or adjacent rings are bonded together to form a fused ring system. For example, R and $R^2$, $R^2$ and $R^4$, or $R^4$ and $R^6$ may bond to form a fused ring system with Ar, such as benzimidazole, benzoxazole, benzothiazole, indazole, quinoline, isoquinoline, imidazo[1,5-a]pyridine, or the like.

Also disclosed herein are compositions including one or more complexes disclosed herein, as well as devices, such as OLEDs, including one or more compounds or compositions disclosed herein.

Thus, particular embodiments have been described. Variations, modifications, and enhancements of the described embodiments and other embodiments can be made based on what is described and illustrated. In addition, one or more features of one or more embodiments may be combined. The details of one or more implementations and various features and aspects are set forth in the accompanying drawings, the description, and the claims below.

DETAILED DESCRIPTION

Figure 1:
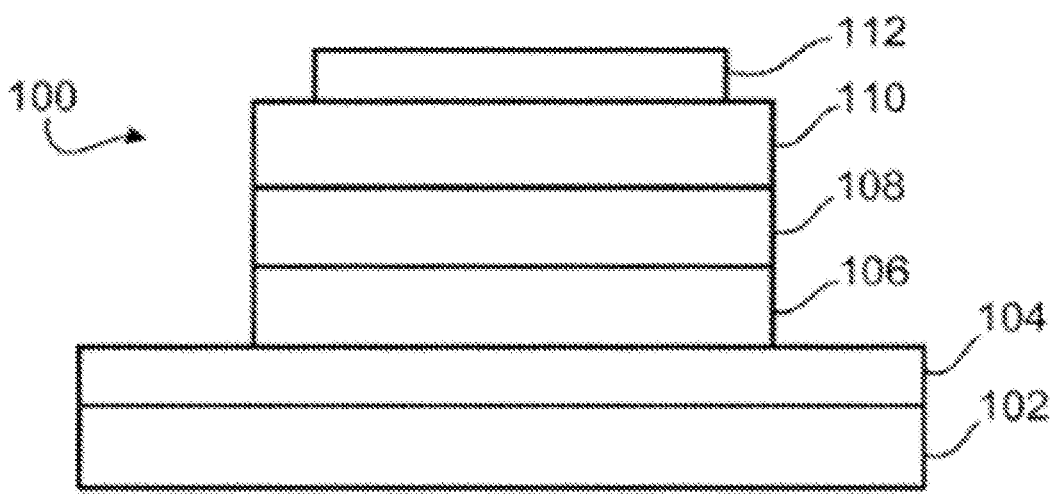
FIG. 1 depicts a cross-sectional view of an exemplary organic light emitting device (OLED).

The present disclosure can be understood more readily by reference to the following detailed description and the Examples included therein.

Before the present complexes, devices, and/or methods are disclosed and described, it is to be understood that they are not limited to specific synthetic methods unless otherwise specified, or to particular reagents unless otherwise specified, as such can, of course, vary. It is also to be understood that the terminology used herein is for the purpose of describing particular aspects only and is not intended to be limiting. Although any methods and materials similar or equivalent to those described herein can be used in the practice or testing, example methods and materials are now described.

As used in the specification and the appended claims, the singular forms "a", "an", and "the" include plural referents unless the context clearly dictates otherwise. Thus, for example, reference to "a component" includes mixtures of two or more components.

As used herein, the terms "optional" or "optionally" means that the subsequently described event or circumstance can or cannot occur, and that the description includes instances where said event or circumstance occurs and instances where it does not.

Disclosed are the components to be used to prepare the compositions described herein as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds cannot be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions. Thus, if there are a variety of additional steps that can be performed it is understood that each of these additional steps can be performed with any specific embodiment or combination of embodiments of the methods.

As referred to herein, a linking atom or group can connect two atoms such as, for example, an N atom and a C atom. A linking atom or group is in one aspect disclosed as X, Y, $Y^1$, $Y^2$, and/or Z herein. The linking atom can optionally, if valency permits, have other chemical moieties attached. For example, in one aspect, an oxygen would not have any other chemical groups attached as the valency is satisfied once it is bonded to two groups (e.g., N and/or C groups). In another aspect, when carbon is the linking atom, two additional chemical moieties can be attached to the carbon. Suitable chemical moieties include amine, amide, thiol, aryl, heteroaryl, cycloalkyl, and heterocyclyl moieties.

The term "cyclic structure" or the like terms used herein refer to any cyclic chemical structure which includes, but is not limited to, aryl, heteroaryl, cycloalkyl, cycloalkenyl, heterocyclyl, carbene, and N-heterocyclic carbene.

As used herein, the term "substituted" is contemplated to include all permissible substituents of organic compounds. In a broad aspect, the permissible substituents include acyclic and cyclic, branched and unbranched, carbocyclic and heterocyclic, and aromatic and nonaromatic substituents of organic compounds. Illustrative substituents include, for example, those described below. The permissible substituents can be one or more and the same or different for appropriate organic compounds. For purposes of this disclosure, the heteroatoms, such as nitrogen, can have hydrogen substituents and/or any permissible substituents of organic compounds described herein which satisfy the valences of the heteroatoms. This disclosure is not intended to be limited in any manner by the permissible substituents of organic compounds. Also, the terms "substitution" or "substituted with" include the implicit proviso that such substitution is in accordance with permitted valence of the substituted atom and the substituent, and that the substitution results in a stable compound, e.g., a compound that does not spontaneously undergo transformation such as by rearrangement, cyclization, elimination, etc. It is also contemplated that, in certain aspects, unless expressly indicated to the contrary, individual substituents can be further optionally substituted (i.e., further substituted or unsubstituted).

In defining various terms, "X" and "Y" are used herein as generic symbols to represent various specific substituents. These symbols can be any substituent, not limited to those disclosed herein, and when they are defined to be certain substituents in one instance, they can, in another instance, be defined as some other substituents.

The term "alkyl" as used herein is a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can be cyclic or acyclic. The alkyl group can be branched or unbranched. The alkyl group can also be substituted or unsubstituted. For example, the alkyl group can be substituted with one or more groups including, but not limited to, alkyl, cycloalkyl, alkoxy, amino, ether, halide, hydroxy, nitro, silyl, sulfo-oxo, or thiol, as described herein. A "lower alkyl" group is an alkyl group containing from one to six (e.g., from one to four) carbon atoms.

Throughout the specification "alkyl" is generally used to refer to both unsubstituted alkyl groups and substituted alkyl groups; however, substituted alkyl groups are also specifically referred to herein by identifying the specific substituent(s) on the alkyl group. For example, the term "halogenated alkyl" or "haloalkyl" specifically refers to an alkyl group that is substituted with one or more halide, e.g., fluorine, chlorine, bromine, or iodine. The term "alkoxyalkyl" specifically refers to an alkyl group that is substituted with one or more alkoxy groups, as described below. The term "alkylamino" specifically refers to an alkyl group that is substituted with one or more amino groups, as described below, and the like. When "alkyl" is used in one instance and a specific term such as "alkylalcohol" is used in another, it is not meant to imply that the term "alkyl" does not also refer to specific terms such as "alkylalcohol" and the like.

This practice is also used for other groups described herein. That is, while a term such as "cycloalkyl" refers to both unsubstituted and substituted cycloalkyl moieties, the substituted moieties can, in addition, be specifically identified herein; for example, a particular substituted cycloalkyl can be referred to as, e.g., an "alkylcycloalkyl." Similarly, a substituted alkoxy can be specifically referred to as, e.g., a "halogenated alkoxy," a particular substituted alkenyl can be, e.g., an "alkenylalcohol," and the like. Again, the practice of using a general term, such as "cycloalkyl," and a specific term, such as "alkylcycloalkyl," is not meant to imply that the general term does not also include the specific term.

The term "cycloalkyl" as used herein is a non-aromatic carbon-based ring composed of at least three carbon atoms. Examples of cycloalkyl groups include, but are not limited to, cyclopropyl, cyclobutyl, cyclopentyl, cyclohexyl, norbornyl, and the like. The term "heterocycloalkyl" is a type of cycloalkyl group as defined above, and is included within the meaning of the term "cycloalkyl," where at least one of the carbon atoms of the ring is replaced with a heteroatom such as, but not limited to, nitrogen, oxygen, sulfur, or phosphorus. The cycloalkyl group and heterocycloalkyl group can be substituted or unsubstituted. The cycloalkyl group and heterocycloalkyl group can be substituted with one or more groups including, but not limited to, alkyl, cycloalkyl, alkoxy, amino, ether, halide, hydroxy, nitro, silyl, sulfo-oxo, or thiol as described herein.

The term "polyalkylene group" as used herein is a group having two or more $CH_2$ groups linked to one another. The polyalkylene group can be represented by the formula $—(CH_2)_a—$, where "a" is an integer of from 2 to 500.

The terms "alkoxy" and "alkoxyl" as used herein to refer to an alkyl or cycloalkyl group bonded through an ether linkage; that is, an "alkoxy" group can be defined as $—OA^1$ where $A^1$ is alkyl or cycloalkyl as defined above. "Alkoxy" also includes polymers of alkoxy groups as just described; that is, an alkoxy can be a polyether such as $—OA^1\text{-}OA^2$ or $—OA^1\text{-}(OA^2)_a\text{-}OA^3$, where "a" is an integer of from 1 to 200 and $A^1$, $A^2$, and $A^3$ are alkyl and/or cycloalkyl groups.

The term "alkenyl" as used herein is a hydrocarbon group of from 2 to 24 carbon atoms with a structural formula containing at least one carbon-carbon double bond. Asymmetric structures such as $(A^1A^2)C{=}C(A^3A^4)$ are intended to include both the E and Z isomers. This can be presumed in structural formulae herein wherein an asymmetric alkene is present, or it can be explicitly indicated by the bond symbol C═C. The alkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkenyl" as used herein is a non-aromatic carbon-based ring composed of at least three carbon atoms and containing at least one carbon-carbon double bound, i.e., C═C. Examples of cycloalkenyl groups include, but are not limited to, cyclopropenyl, cyclobutenyl, cyclopentenyl, cyclopentadienyl, cyclohexenyl, cyclohexadienyl, norbornenyl, and the like. The term "heterocycloalkenyl" is a type of cycloalkenyl group as defined above, and is included within the meaning of the term "cycloalkenyl," where at least one of the carbon atoms of the ring is replaced with a heteroatom such as, but not limited to, nitrogen, oxygen, sulfur, or phosphorus. The cycloalkenyl group and heterocycloalkenyl group can be substituted or unsubstituted. The cycloalkenyl group and heterocycloalkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "alkynyl" as used herein is a hydrocarbon group of 2 to 24 carbon atoms with a structural formula containing at least one carbon-carbon triple bond. The alkynyl group can be unsubstituted or substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkynyl" as used herein is a non-aromatic carbon-based ring composed of at least seven carbon atoms and containing at least one carbon-carbon triple bound. Examples of cycloalkynyl groups include, but are not limited to, cycloheptynyl, cyclooctynyl, cyclononynyl, and the like. The term "heterocycloalkynyl" is a type of cycloalkenyl group as defined above, and is included within the meaning of the term "cycloalkynyl," where at least one of the carbon atoms of the ring is replaced with a heteroatom such as, but not limited to, nitrogen, oxygen, sulfur, or phosphorus. The cycloalkynyl group and heterocycloalkynyl group can be substituted or unsubstituted. The cycloalkynyl group and heterocycloalkynyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "aryl" as used herein is a group that contains any carbon-based aromatic group including, but not limited to, benzene, naphthalene, phenyl, biphenyl, phenoxybenzene, and the like. The term "aryl" also includes "heteroaryl," which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term "non-heteroaryl," which is also included in the term "aryl," defines a group that contains an aromatic group that does not contain a heteroatom. The aryl group can be substituted or unsubstituted. The aryl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein. The term "biaryl" is a specific type of aryl group and is included in the definition of "aryl." Biaryl refers to two aryl groups that are bound together via a fused ring structure, as in naphthalene, or are attached via one or more carbon-carbon bonds, as in biphenyl.

The term "aldehyde" as used herein is represented by the formula —C(O)H. Throughout this specification "C(O)" is a short hand notation for a carbonyl group, i.e., C═O.

The terms "amine" or "amino" as used herein are represented by the formula $—NA^1A^2$, where $A^1$ and $A^2$ can be, independently, hydrogen or alkyl, cycloalkyl, alkenyl, cycloalkenyl, alkynyl, cycloalkynyl, aryl, or heteroaryl group as described herein.

The term "alkylamino" as used herein is represented by the formula —NH(-alkyl) where alkyl is described herein. Representative examples include, but are not limited to, methylamino group, ethylamino group, propylamino group, isopropylamino group, butylamino group, isobutylamino group, (sec-butyl)amino group, (tert-butyl)amino group, pentylamino group, isopentylamino group, (tert-pentyl) amino group, hexylamino group, and the like.

The term "dialkylamino" as used herein is represented by the formula $—N(\text{-alkyl})_2$ where alkyl is a described herein. Representative examples include, but are not limited to, dimethylamino group, diethylamino group, dipropylamino group, diisopropylamino group, dibutylamino group, diisobutylamino group, di(sec-butyl)amino group, di(tert-butyl)amino group, dipentylamino group, diisopentylamino group, di(tert-pentyl)amino group, dihexylamino group, N-ethyl-N-methylamino group, N-methyl-N-propylamino group, N-ethyl-N-propylamino group and the like.

The term "carboxylic acid" as used herein is represented by the formula —C(O)OH.

The term "ester" as used herein is represented by the formula $—OC(O)A^1$ or $—C(O)OA^1$, where $A^1$ can be alkyl, cycloalkyl, alkenyl, cycloalkenyl, alkynyl, cycloalkynyl, aryl, or heteroaryl group as described herein. The term "polyester" as used herein is represented by the formula $-(A^1O(O)C\text{-}A^2\text{-}C(O)O)_a—$ or $-(A^1O(O)C\text{-}A^2\text{-}OC(O))_a—$, where $A^1$ and $A^2$ can be, independently, an alkyl, cycloalkyl, alkenyl, cycloalkenyl, alkynyl, cycloalkynyl, aryl, or heteroaryl group described herein and "a" is an integer from 1 to 500. "Polyester" is as the term used to describe a group that is produced by the reaction between a compound having at least two carboxylic acid groups with a compound having at least two hydroxyl groups.

The term "ether" as used herein is represented by the formula $A^1OA^2$, where $A^1$ and $A^2$ can be, independently, an alkyl, cycloalkyl, alkenyl, cycloalkenyl, alkynyl, cycloalkynyl, aryl, or heteroaryl group described herein. The term "polyether" as used herein is represented by the formula $-(A^1O\text{-}A^2O)_a—$, where $A^1$ and $A^2$ can be, independently, an alkyl, cycloalkyl, alkenyl, cycloalkenyl, alkynyl, cycloalkynyl, aryl, or heteroaryl group described herein and "a" is an integer of from 1 to 500. Examples of polyether groups include polyethylene oxide, polypropylene oxide, and polybutylene oxide.

The term "polymeric" includes polyalkylene, polyether, polyester, and other groups with repeating units, such as, but not limited to $—(CH_2O)_n—CH_3$, $—(CH_2CH_2O)_n—CH_3$, $—[CH_2CH(CH_3)]_n—CH_3$, $—[CH_2CH(COOCH_3)]_n—CH_3$, $—[CH_2CH(COO\ CH_2CH_3)]_n—CH_3$, and $—[CH_2CH(COO^tBu)]_n—CH_3$, where n is an integer (e.g., n>1 or n>2).

The term "halide" as used herein refers to the halogens fluorine, chlorine, bromine, and iodine.

The term "heterocyclyl," as used herein refers to single and multi-cyclic non-aromatic ring systems and "heteroaryl as used herein refers to single and multi-cyclic aromatic ring systems: in which at least one of the ring members is other than carbon. The terms includes azetidine, dioxane, furan, imidazole, isothiazole, isoxazole, morpholine, oxazole, oxazole, including, 1,2,3-oxadiazole, 1,2,5-oxadiazole and 1,3,4-oxadiazole, piperazine, piperidine, pyrazine, pyrazole, pyridazine, pyridine, pyrimidine, pyrrole, pyrrolidine, tetrahydrofuran, tetrahydropyran, tetrazine, including 1,2,4,5-tetrazine, tetrazole, including 1,2,3,4-tetrazole and 1,2,4,5-tetrazole, thiadiazole, including, 1,2,3-thiadiazole, 1,2,5-thiadiazole, and 1,3,4-thiadiazole, thiazole, thiophene, triazine, including 1,3,5-triazine and 1,2,4-triazine, triazole, including, 1,2,3-triazole, 1,3,4-triazole, and the like.

The term "hydroxyl" as used herein is represented by the formula —OH.

The term "ketone" as used herein is represented by the formula $A^1C(O)A^2$, where $A^1$ and $A^2$ can be, independently, an alkyl, cycloalkyl, alkenyl, cycloalkenyl, alkynyl, cycloalkynyl, aryl, or heteroaryl group as described herein.

The term "azide" as used herein is represented by the formula $—N_3$.

The term "nitro" as used herein is represented by the formula $—NO_2$.

The term "nitrile" as used herein is represented by the formula —CN.

The term "silyl" as used herein is represented by the formula $—SiA^1A^2A^3$, where $A^1$, $A^2$, and $A^3$ can be, independently, hydrogen or an alkyl, cycloalkyl, alkoxy, alkenyl, cycloalkenyl, alkynyl, cycloalkynyl, aryl, or heteroaryl group as described herein.

The term "sulfo-oxo" as used herein is represented by the formulas $—S(O)A^1$, $—S(O)_2A^1$, $OS(O)_2A^1$, or $—OS(O)_2OA^1$, where $A^1$ can be hydrogen or an alkyl, cycloalkyl, alkenyl, cycloalkenyl, alkynyl, cycloalkynyl, aryl, or heteroaryl group as described herein. Throughout this specification "S(O)" is a short hand notation for S═O. The term "sulfonyl" is used herein to refer to the sulfo-oxo group represented by the formula $—S(O)_2A^1$, where $A^1$ can be hydrogen or an alkyl, cycloalkyl, alkenyl, cycloalkenyl, alkynyl, cycloalkynyl, aryl, or heteroaryl group as described herein. The term "sulfone" as used herein is represented by the formula $A^1S(O)_2A^2$, where $A^1$ and $A^2$ can be, independently, an alkyl, cycloalkyl, alkenyl, cycloalkenyl, alkynyl, cycloalkynyl, aryl, or heteroaryl group as described herein. The term "sulfoxide" as used herein is represented by the formula $A^1S(O)A^2$, where $A^1$ and $A^2$ can be, independently, an alkyl, cycloalkyl, alkenyl, cycloalkenyl, alkynyl, cycloalkynyl, aryl, or heteroaryl group as described herein.

The term "thiol" as used herein is represented by the formula —SH.

"$R^1$," "$R^2$," "$R^3$," "$R^n$," where n is an integer, as used herein can, independently, possess one or more of the groups listed above. For example, if $R^1$ is a straight chain alkyl group, one of the hydrogen atoms of the alkyl group can optionally be substituted with a hydroxyl group, an alkoxy group, an alkyl group, a halide, and the like. Depending upon the groups that are selected, a first group can be incorporated within second group or, alternatively, the first group can be pendant (i.e., attached) to the second group. For example, with the phrase "an alkyl group comprising an amino group," the amino group can be incorporated within the backbone of the alkyl group. Alternatively, the amino group can be attached to the backbone of the alkyl group. The nature of the group(s) that is (are) selected will determine if the first group is embedded or attached to the second group.

Compounds described herein may contain "optionally substituted" moieties. In general, the term "substituted," whether preceded by the term "optionally" or not, means that one or more hydrogens of the designated moiety are replaced with a suitable substituent. Unless otherwise indicated, an "optionally substituted" group may have a suitable substituent at each substitutable position of the group, and when more than one position in any given structure may be substituted with more than one substituent selected from a specified group, the substituent may be either the same or different at every position. Combinations of substituents envisioned by this invention are preferably those that result in the formation of stable or chemically feasible compounds. In is also contemplated that, in certain aspects, unless expressly indicated to the contrary, individual substituents can be further optionally substituted (i.e., further substituted or unsubstituted).

In some aspects, a structure of a compound can be represented by a formula:

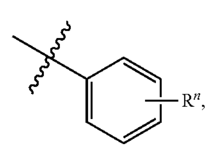

which is understood to be equivalent to a formula:

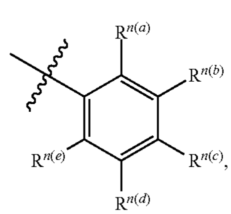

wherein n is typically an integer. That is, $R^n$ is understood to represent five independent substituents, $R^{n(a)}$, $R^{n(b)}$, $R^{n(c)}$, $R^{n(d)}$, $R^{n(e)}$. By "independent substituents," it is meant that each R substituent can be independently defined. For example, if in one instance $R^{n(a)}$ is halogen, then $R^{n(b)}$ is not necessarily halogen in that instance.

Several references to $R^1$, $R^2$, $R^3$, $R^4$, $R^5$, $R^6$, etc. are made in chemical structures and moieties disclosed and described herein. Any description of R, $R^1$, $R^2$, $R^3$, $R^4$, $R^5$, $R^6$ etc. in the specification is applicable to any structure or moiety reciting R, $R^1$, $R^2$, $R^3$, $R^4$, $R^5$, $R^6$, etc. respectively.

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

Excitons decay from singlet excited states to the ground state to yield prompt luminescence, which is fluorescence. Excitons decay from triplet excited states to ground state to generate luminescence, which is phosphorescence. Because the strong spin-orbit coupling of the heavy metal atom enhances intersystem crossing (ISC) very efficiently between singlet and triplet excited states, phosphorescent metal complexes, such as platinum complexes, have demonstrated their potential to harvest both the singlet and triplet excitons to achieve 100% internal quantum efficiency. Thus phosphorescent metal complexes are good candidates as dopants in the emissive layer of organic light emitting devices (OLEDs) and a great deal of attention has been received both in the academic and industrial fields.

However, to date, blue electroluminescent devices remain the most challenging area of this technology, due at least in part to instability of the blue devices. It is generally understood that the choice of host materials is a factor in the stability of the blue devices. But the lowest triplet excited state ($T_1$) energy of the blue phosphors is high, which generally means that the lowest triplet excited state ($T_1$) energy of host materials for the blue devices should be even higher. This leads to difficulty in the development of the host materials for the blue devices.

This disclosure provides a materials design route by introducing a carbon group (C, Si, Ge) bridging to the ligand of the metal complexes. As described herein, it was found that the photoluminescence spectrum of the carbon bridging Pt complex had a significant blue shift comparing to the nitrogen bridging one with the same emissive group. It was also found that chemical structures of the emissive luminophores and the ligands could be modified, and also the metal could be changed to adjust the singlet states energy and the triplet states energy of the metal complexes, which all could affect the optical properties of the complexes.

The metal complexes described herein can be tailored or tuned to a specific application that is facilitated by a particular emission or absorption characteristic. The optical properties of the metal complexes in this disclosure can be tuned by varying the structure of the ligand surrounding the metal center or varying the structure of fluorescent luminophore(s) on the ligands. For example, the metal complexes having a ligand with electron donating substituents or electron withdrawing substituents can generally exhibit different optical properties, including emission and absorption spectra. The color of the metal complexes can be tuned by modifying the conjugated groups on the fluorescent luminophores and ligands.

The emission of such complexes can be tuned, for example, from the ultraviolet to near-infrared, by, for example, modifying the ligand or fluorescent luminophore structure. A fluorescent luminophore is a group of atoms in an organic molecule that can absorb energy to generate singlet excited state(s). The singlet exciton(s) produce(s) decay rapidly to yield prompt luminescence. In one aspect, the complexes can provide emission over a majority of the visible spectrum. In a specific example, the complexes described herein can emit light over a range of from about 400 nm to about 700 nm. In another aspect, the complexes have improved stability and efficiency over traditional emission complexes. In yet another aspect, the complexes can be useful as luminescent labels in, for example, bio-applications, anti-cancer agents, emitters in organic light emitting diodes (OLEDs), or a combination thereof. In another aspect, the complexes can be useful in light emitting devices, such as, for example, compact fluorescent lamps (CFL), light emitting diodes (LEDs), incandescent lamps, and combinations thereof.

Disclosed herein are platinum compounds, compound complexes, or complexes. The terms compound, compound complex, and complex are used interchangeably herein. In one aspect, the compounds disclosed herein have a neutral charge.

The compounds disclosed herein can exhibit desirable properties and have emission and/or absorption spectra that can be tuned via the selection of appropriate ligands. In another aspect, any one or more of the compounds, structures, or portions thereof, specifically recited herein may be excluded.

The compounds disclosed herein are suited for use in a wide variety of optical and electro-optical devices, including, but not limited to, photo-absorbing devices such as solar- and photo-sensitive devices, organic light emitting diodes (OLEDs), photo-emitting devices, or devices capable of both photo-absorption and emission and as markers for bio-applications.

As briefly described above, the disclosed compounds are platinum complexes. In one aspect, the compounds disclosed herein can be used as host materials for OLED applications, such as full color displays.

The compounds disclosed herein are useful in a variety of applications. As light emitting materials, the compounds can be useful in organic light emitting diodes (OLEDs), luminescent devices and displays, and other light emitting devices.

In another aspect, the compounds can provide improved efficiency and/or operational lifetimes in lighting devices, such as, for example, organic light emitting devices, as compared to conventional materials.

Compounds described herein can be made using a variety of methods, including, but not limited to those recited in the examples.

The compounds disclosed herein include delayed fluorescent emitters, phosphorescent emitters, or a combination thereof. In one aspect, the compounds disclosed herein are delayed fluorescent emitters. In another aspect, the compounds disclosed herein are phosphorescent emitters. In yet another aspect, a compound disclosed herein is both a delayed fluorescent emitter and a phosphorescent emitter.

Disclosed herein are complexes of Formula I and Formula II:

Formula I

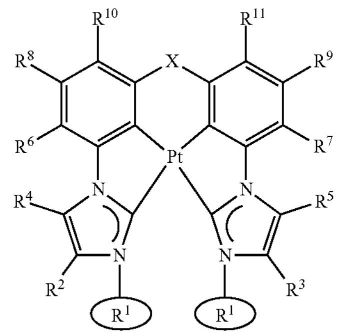

Formula II

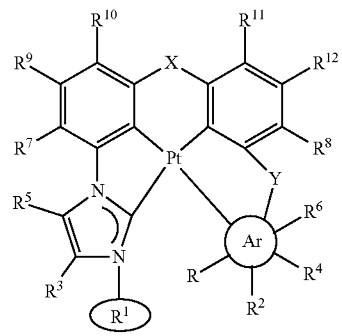

wherein:

Ar is a five-membered heteroaryl, a five-membered carbene, a five-membered N-heterocyclic carbene, a six-membered aryl, or a six-membered heteroaryl, each $R^1$ is independently

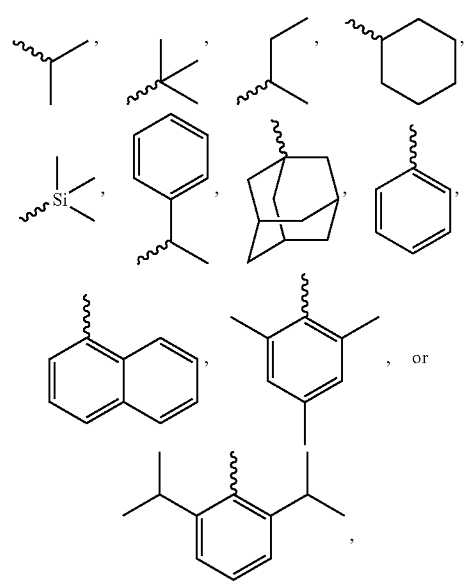

each of R, $R^2$, $R^3$, $R^4$, $R^5$, $R^6$, $R^7$, $R^8$, $R^9$, $R^{10}$, $R^{11}$, and $R^{12}$ is independently hydrogen, halogen, hydroxy, nitro, thiol; substituted or unsubstituted: $C_1$-$C_4$ alkyl, alkoxy, aryl, or amino, wherein R is absent when Ar is a five-membered ring, X is O, S, S═O, O═S═O, Se, Se═O, O═Se═O, $NR^{2a}$, $PR^{2b}$, $AsR^{2c}$, $CR^{2d}R^{2e}$, $SiR^{2f}R^{2g}$, or $BR^{2h}$, each of $R^{2a}$, $R^{2b}$, $R^{2c}$, $R^{2d}$, $R^{2e}$, $R^{2f}$, $R^{2g}$, and $R^{2h}$ is independently substituted or unsubstituted $C_1$-$C_4$ alkyl or aryl, Y is present or absent, and if present Y is O, S, S═O, O═S═O, Se, Se═O, O═Se═O, $NR^{3a}$, $PR^{3b}$, $AsR^{3c}$, $CR^{3d}R^{3e}$, $SiR^{3f}R^{3g}$, or $BR^{3h}$, and each of $R^{3a}$, $R^{3b}$, $R^{3c}$, $R^{3d}$, $R^{3e}$, $R^{3f}$, $R^{3g}$, and $R^{3h}$ is independently substituted or unsubstituted $C_1$-$C_4$ alkyl or aryl.

In some cases, Ar is pyrazole, imidazole, oxazole, thiazole, pyridine, or the like. In certain cases, any two of R, $R^2$, $R^3$, $R^4$, $R^5$, $R^6$, $R^7$, $R^8$, $R^9$, $R^{10}$, $R^{11}$, and $R^{12}$ on the same ring or adjacent rings are bonded together to form a fused ring system. For example, R and $R^2$, $R^2$ and $R^4$, or $R^4$ and $R^6$ may bond to form a fused ring system with Ar, such as benzimidazole, benzoxazole, benzothiazole, indazole, quinoline, isoquinoline, imidazo[1,5-a]pyridine, or the like.

In some cases, X is directly linked to $R^{10}$ or $R^{11}$. In certain cases, Y is directly linked to $R^6$ or $R^8$.

Metal complexes in this disclosure include one or more of the following structures. Metal complexes in this disclosure may also include other structures or portions thereof not specifically recited herein, and the present disclosure is not intended to be limited to those structures or portions thereof specifically recited. In the following structures, "Ad" refers to "adamantyl"; "Mes" refers to "mesityl"; "Dipp" refers to "diisopropylphenyl"; "Np" refers to "neopentyl"; and "Cy" refers to "cyclohexyl."

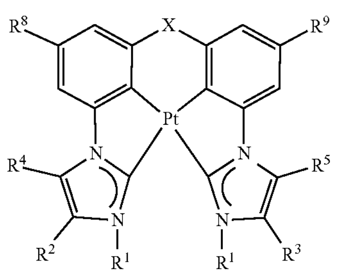

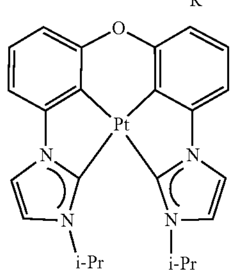

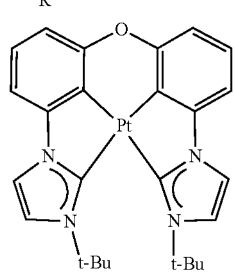

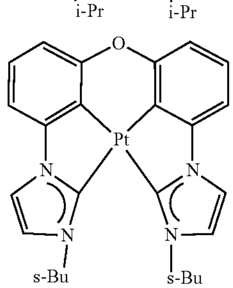

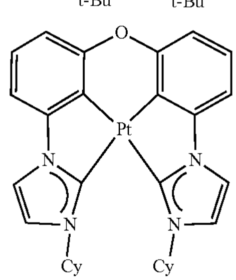

-continued

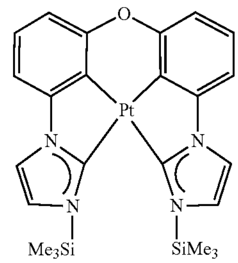

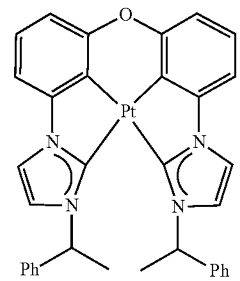

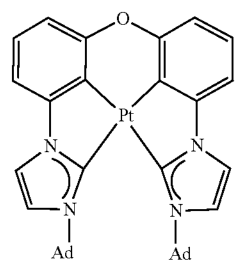

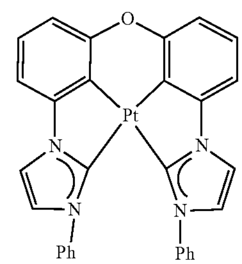

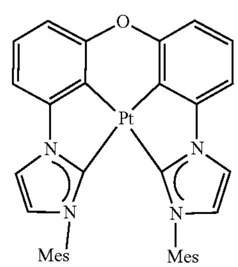

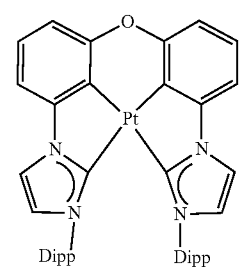

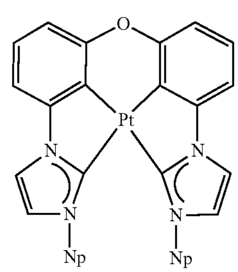

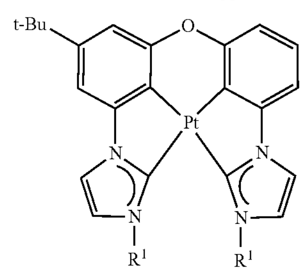

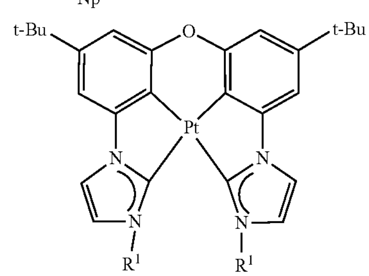

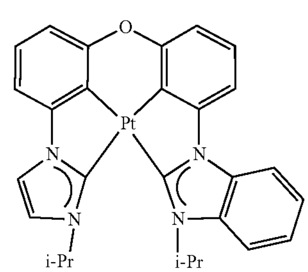

-continued
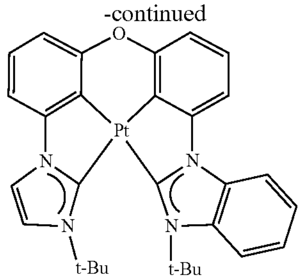
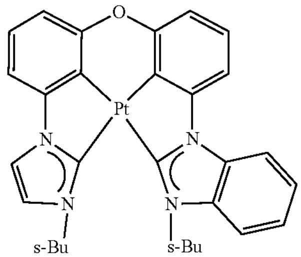
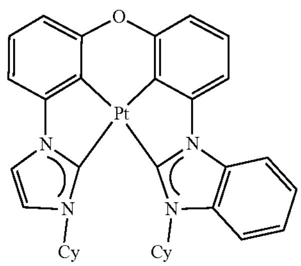
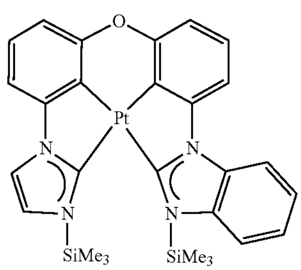
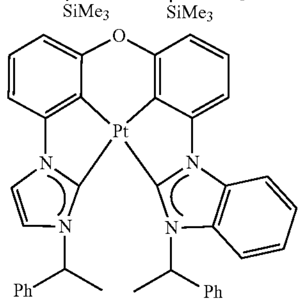
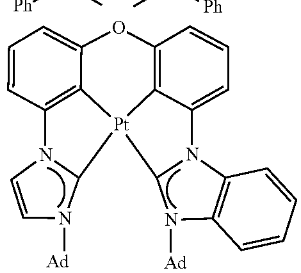
-continued
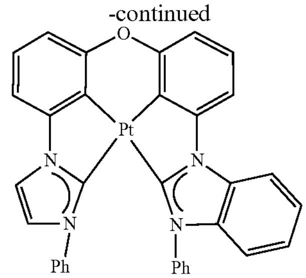
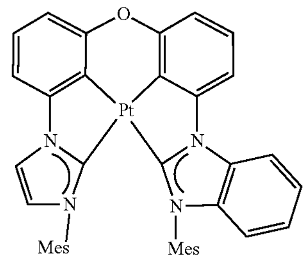
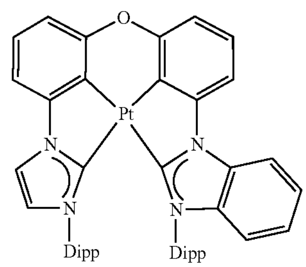
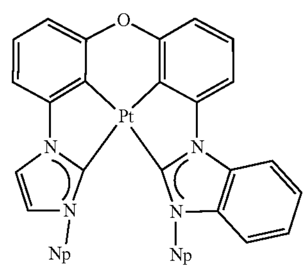
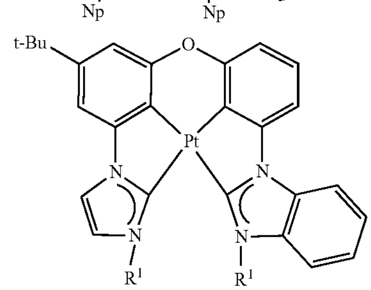
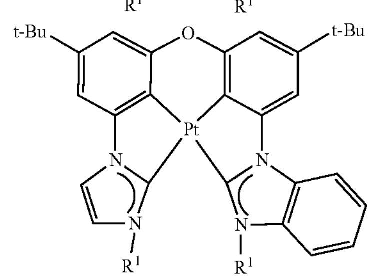

-continued
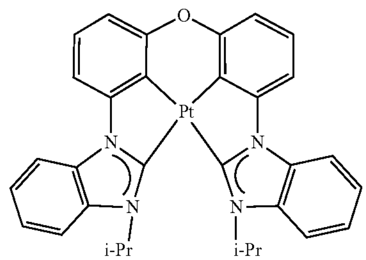
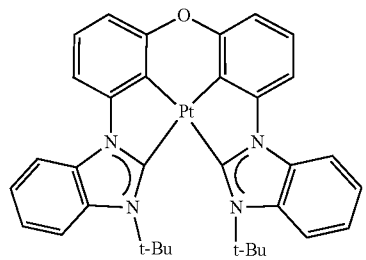
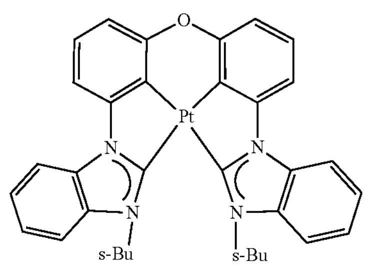
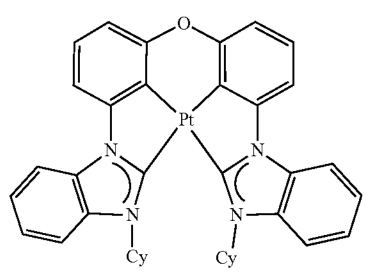
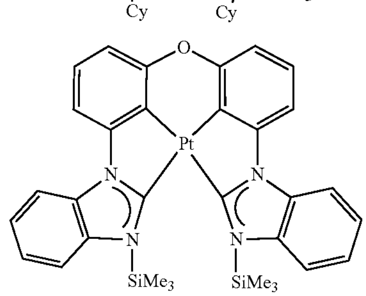
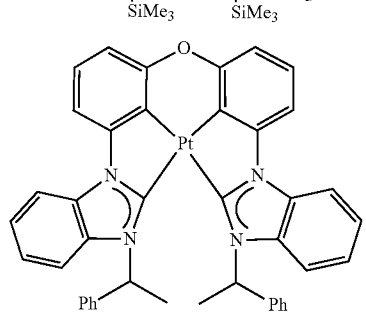
-continued
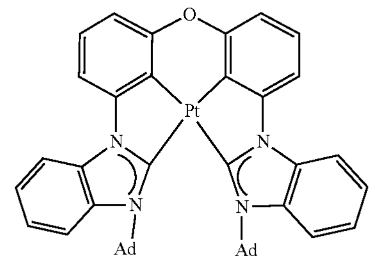
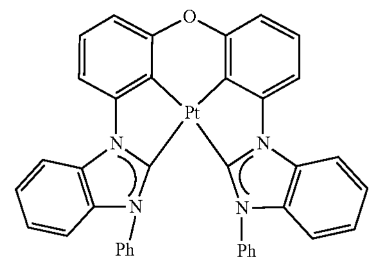
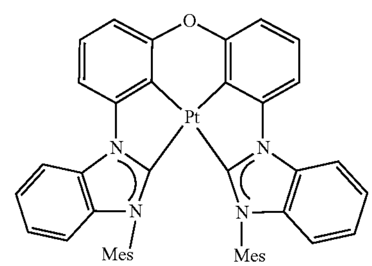
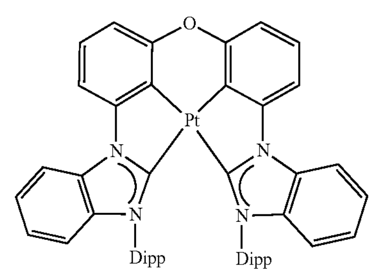
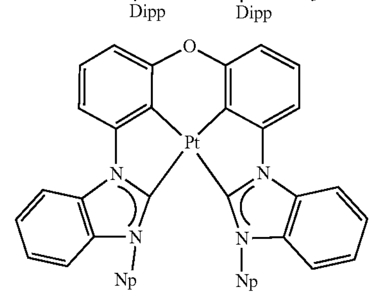
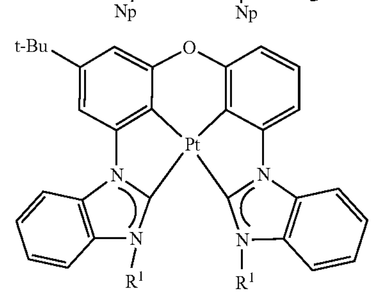

-continued
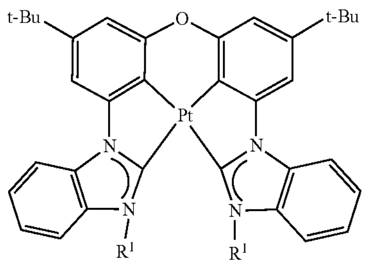
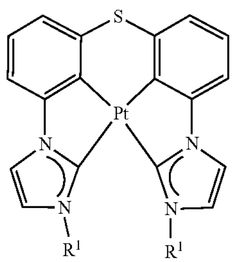
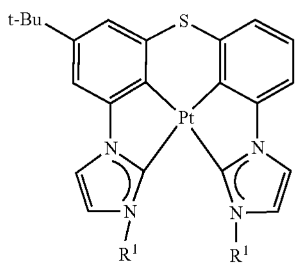
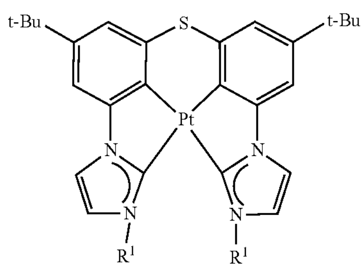
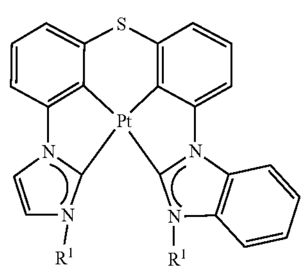
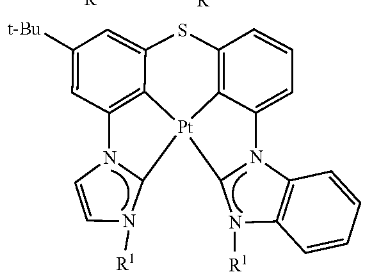
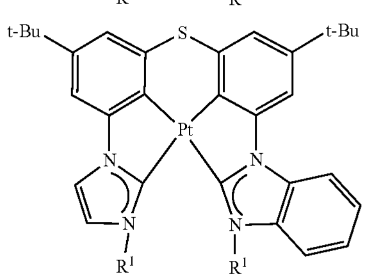
-continued
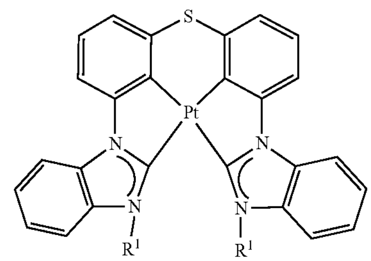
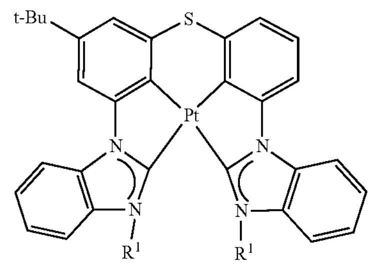
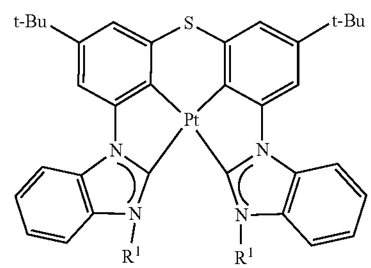
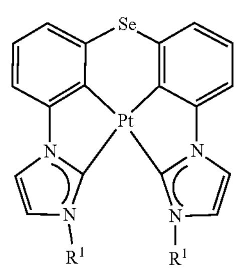
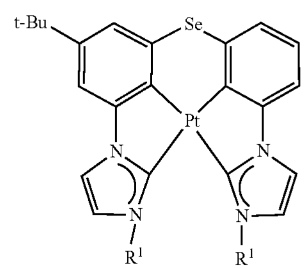
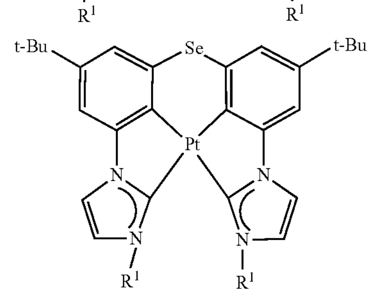
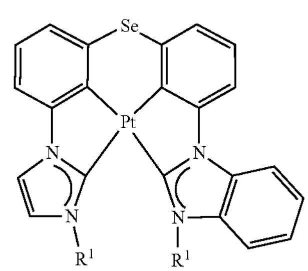

-continued
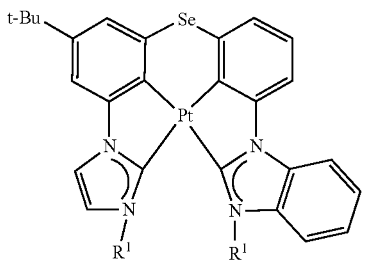
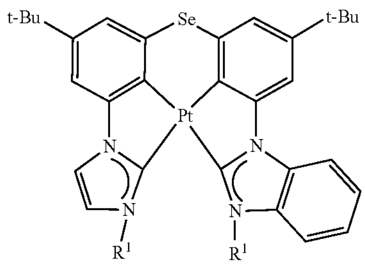
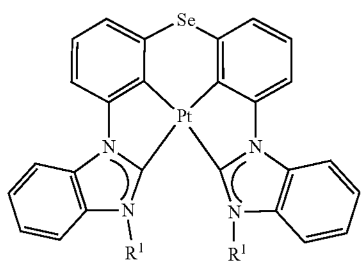
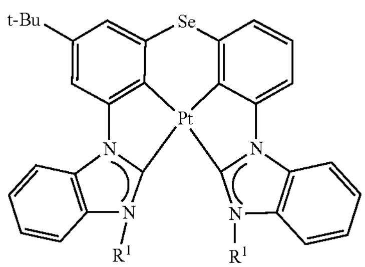
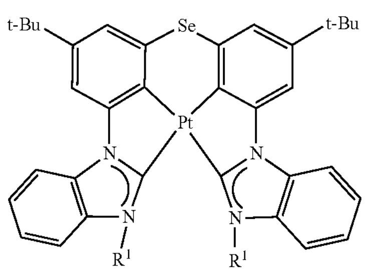
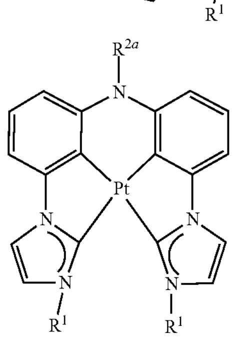
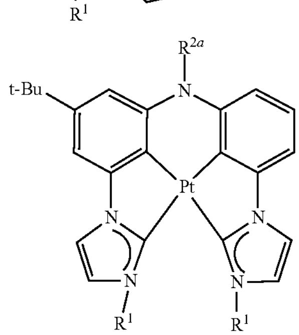
-continued
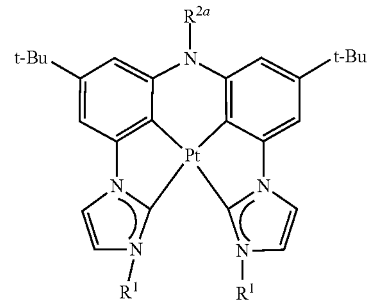
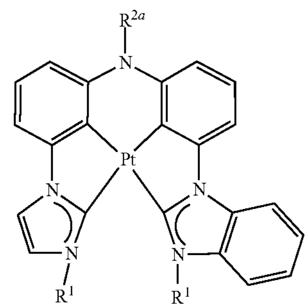
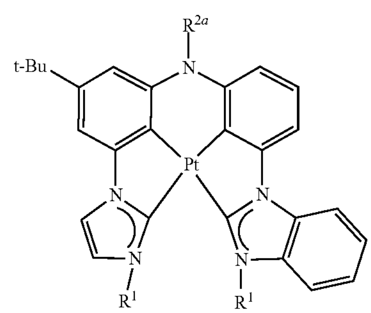
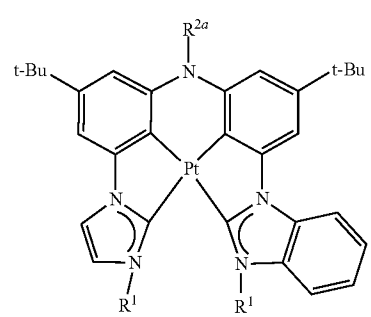
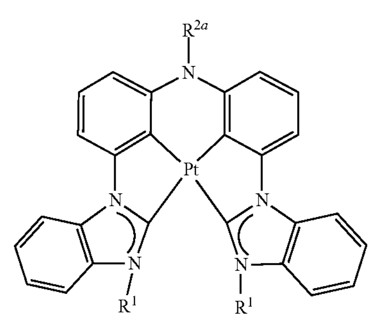

-continued
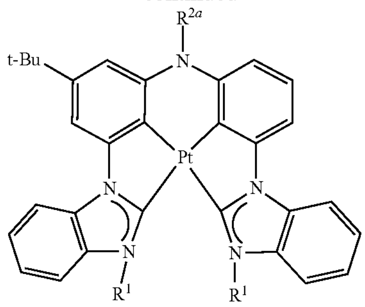
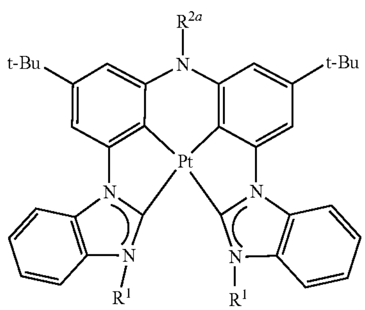
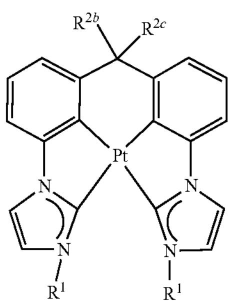
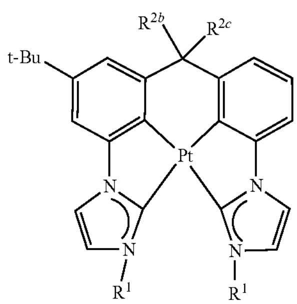
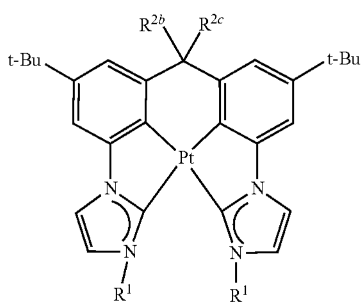
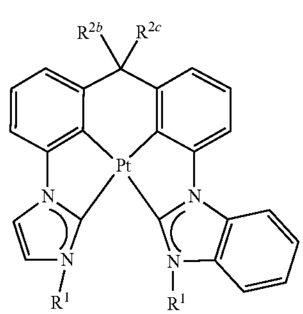
-continued
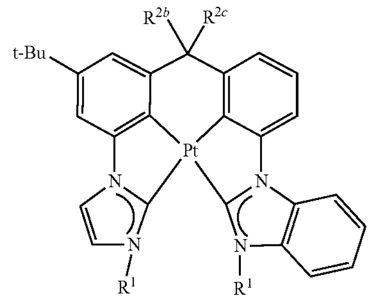
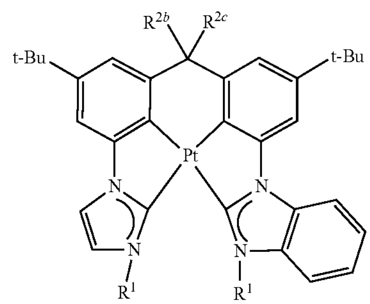
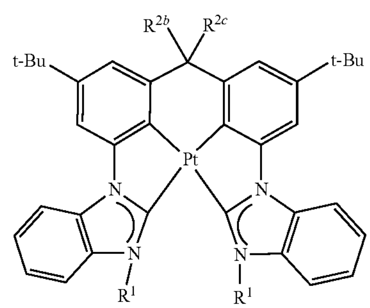
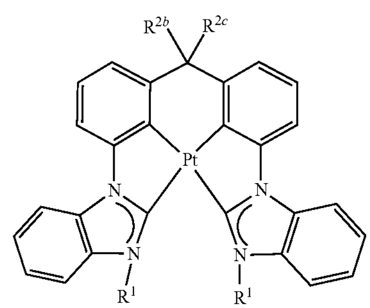
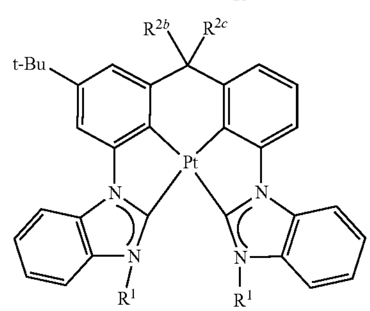

-continued
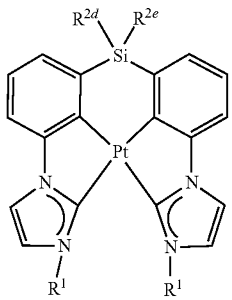
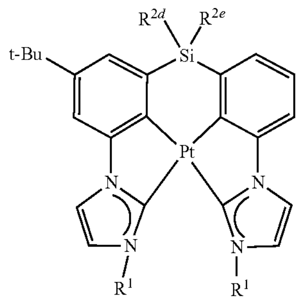
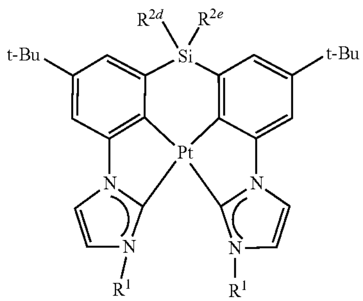
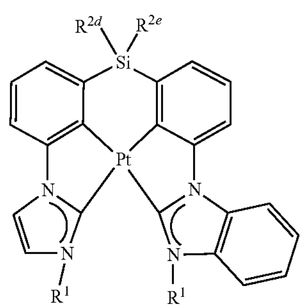
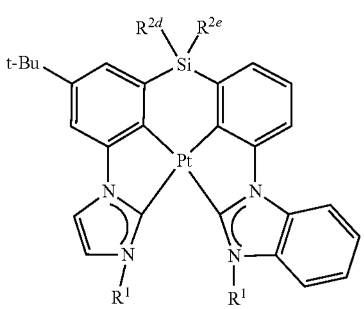
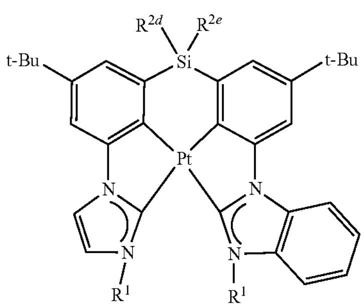
-continued
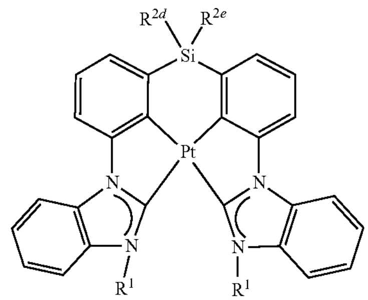
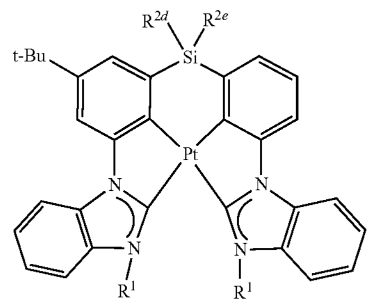
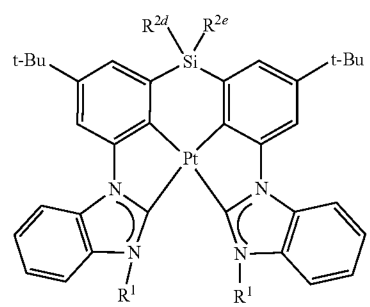
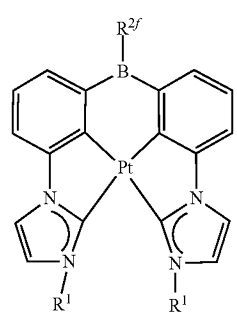
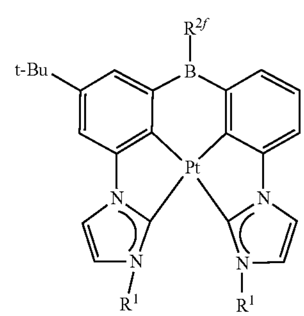
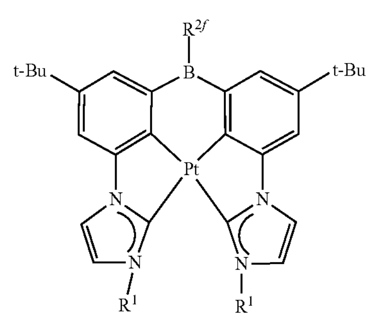

-continued
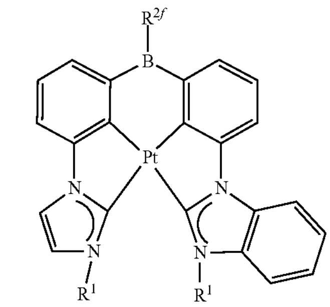
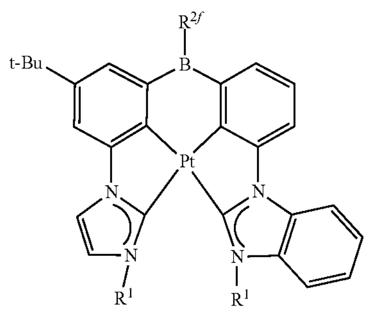
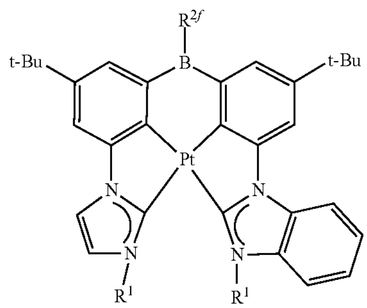
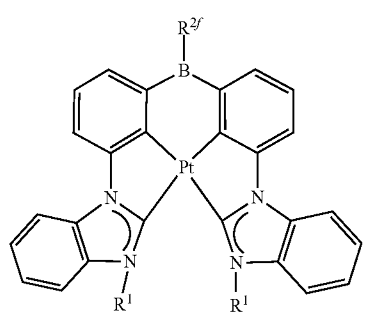
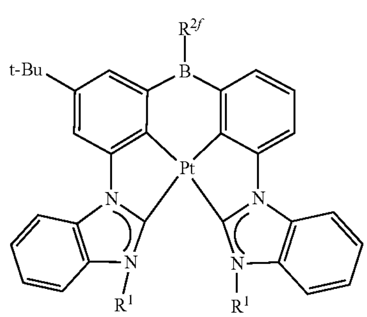
-continued
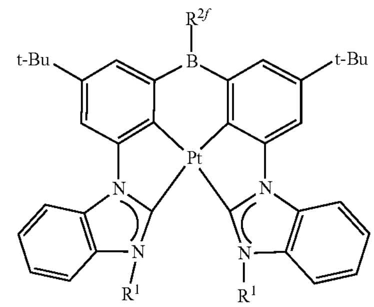
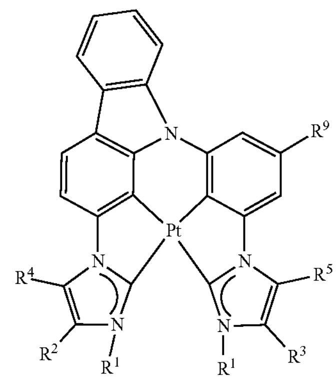
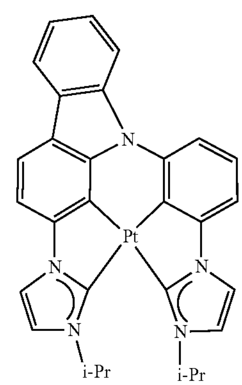
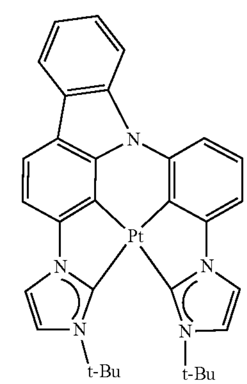
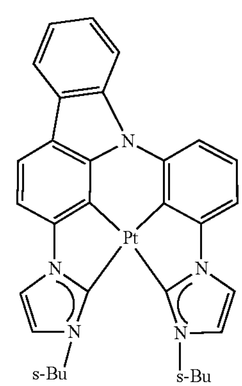
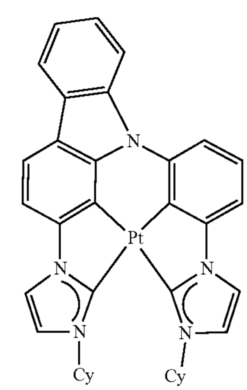

-continued
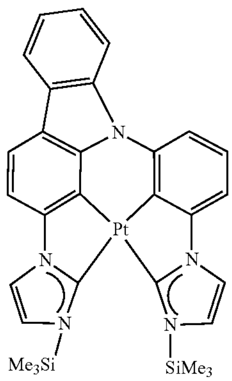
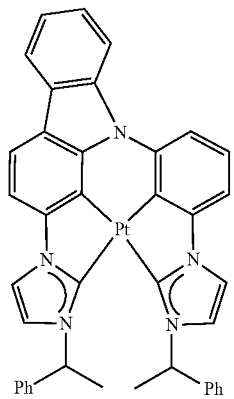
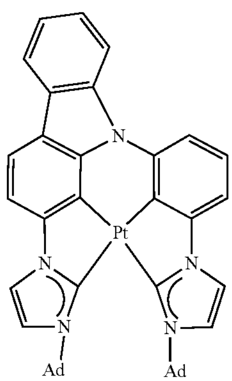
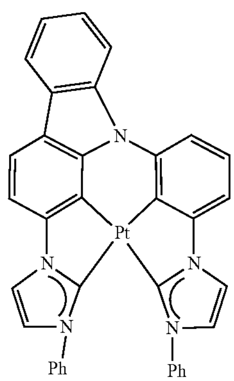
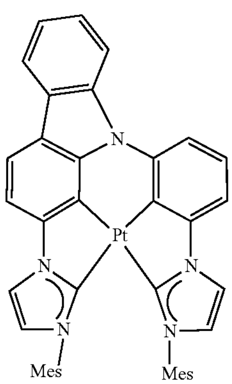
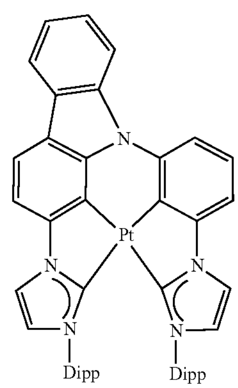
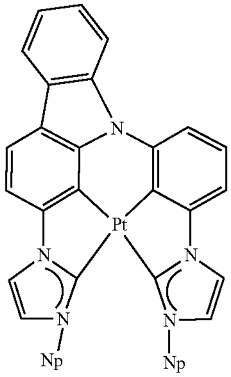
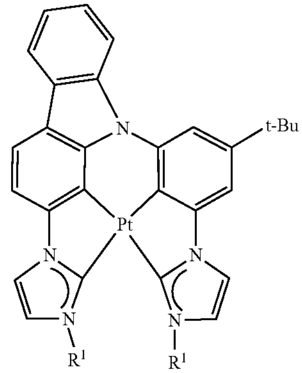
-continued
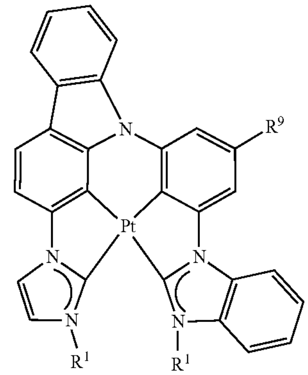
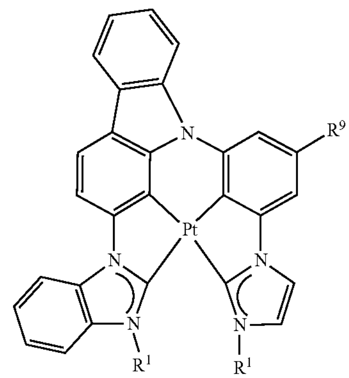
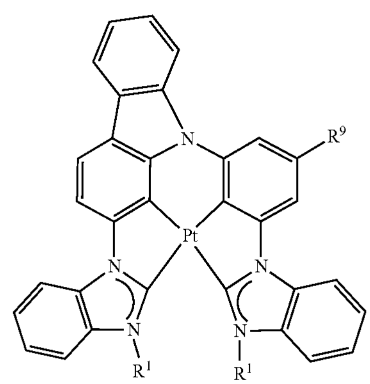
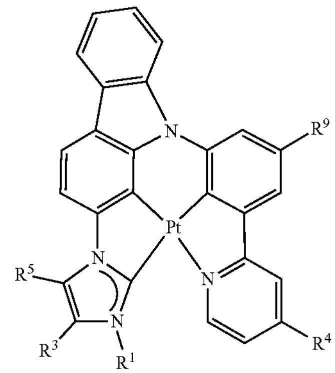

-continued
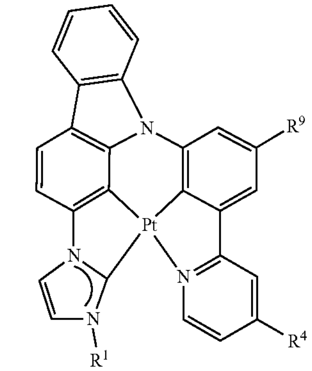
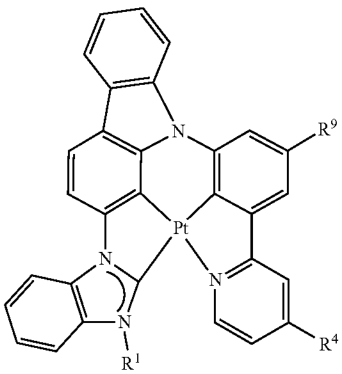
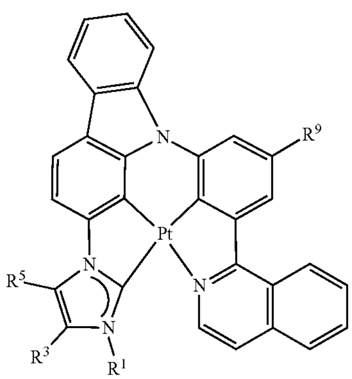
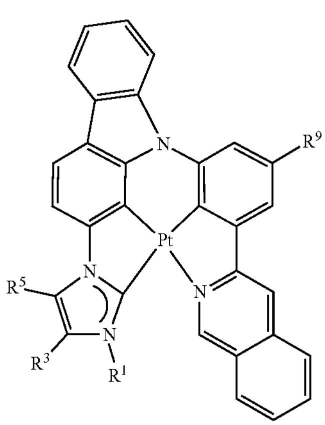
-continued
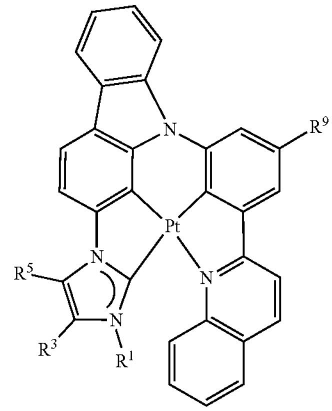
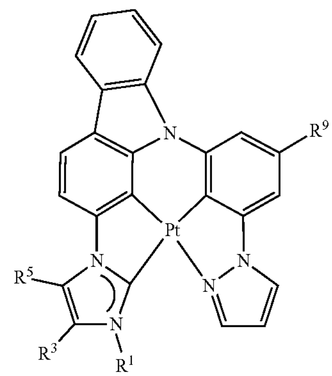
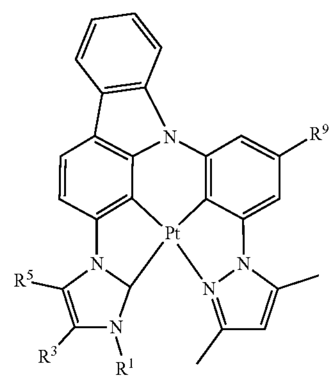
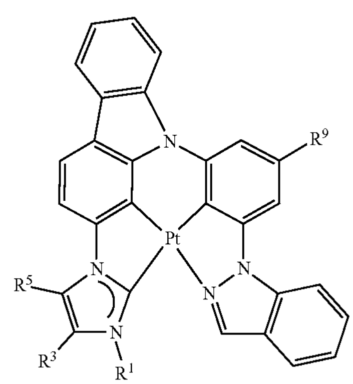

-continued
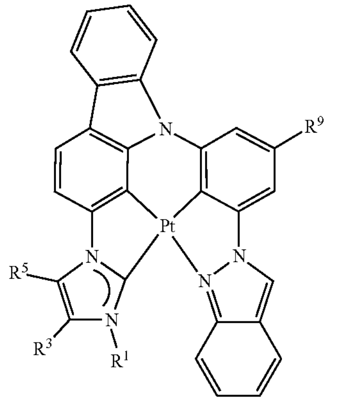
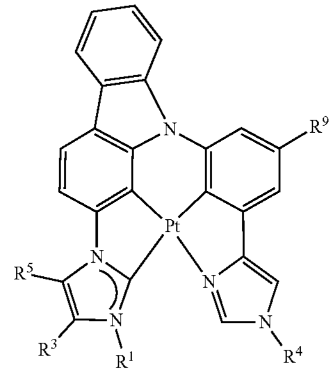
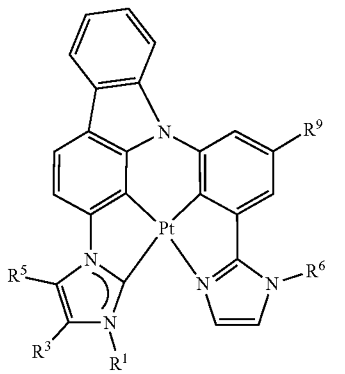
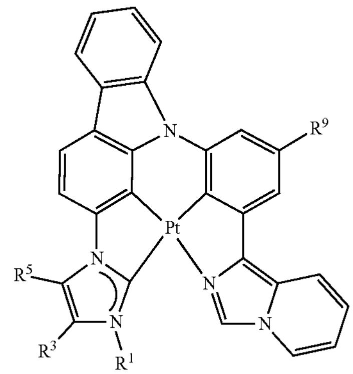
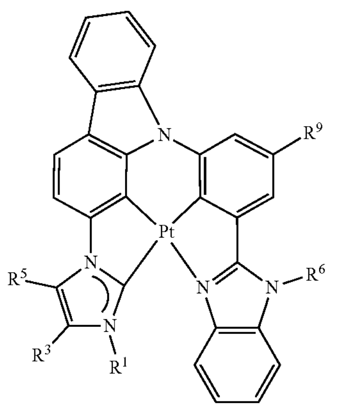
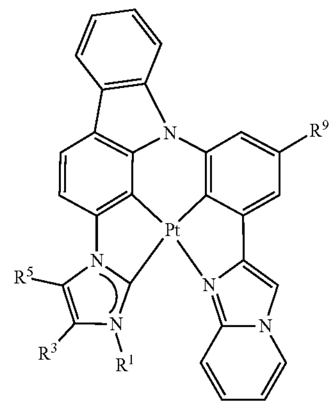
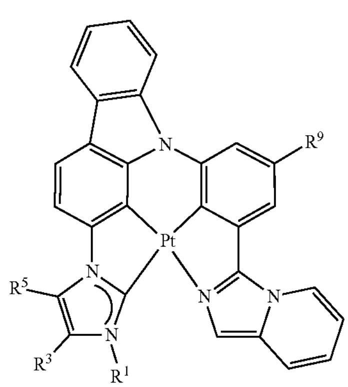
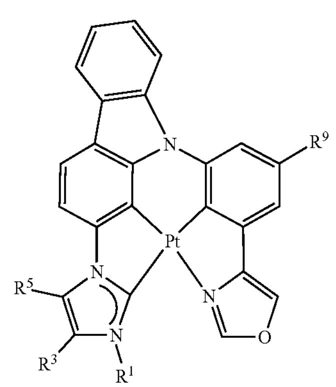

-continued
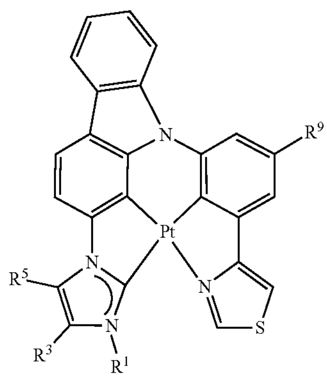
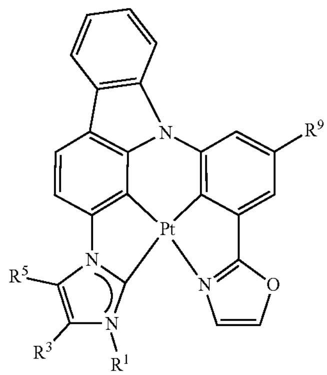
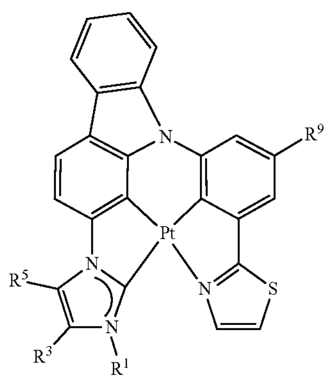
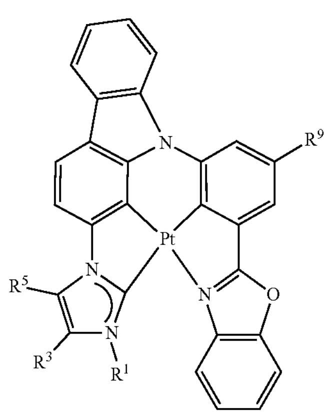
-continued
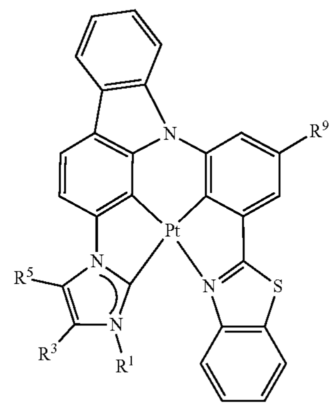
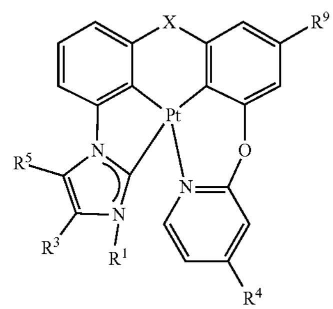
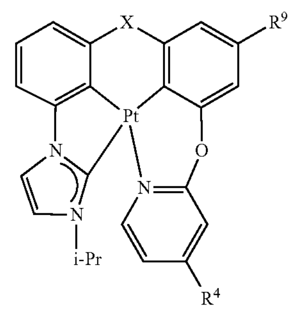
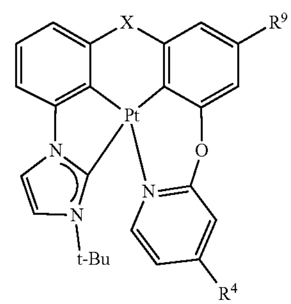
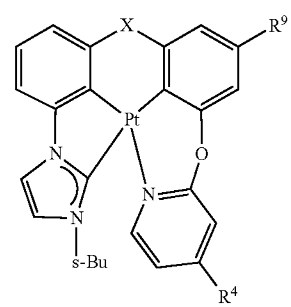

-continued
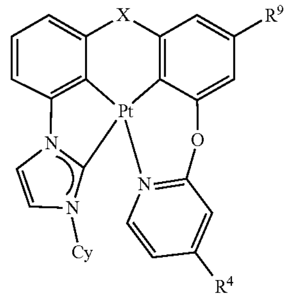
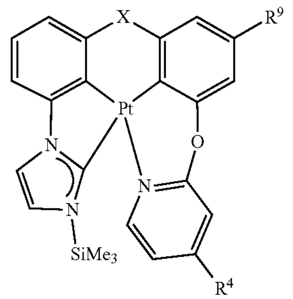
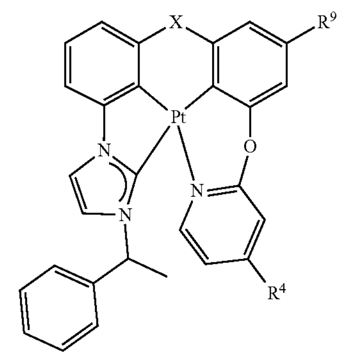
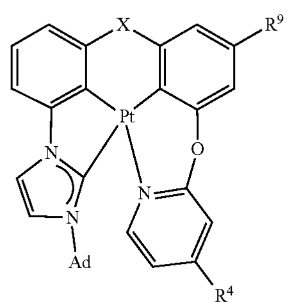
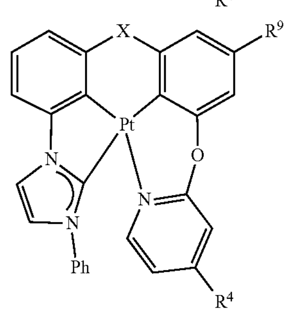
-continued
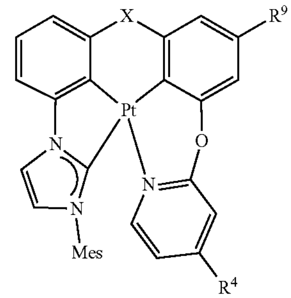
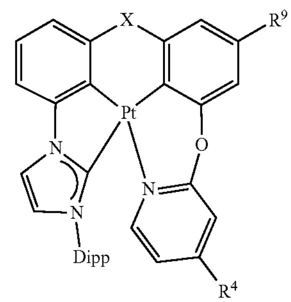
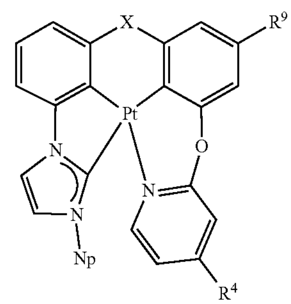
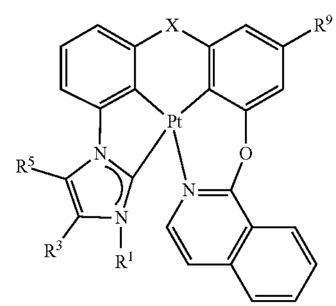
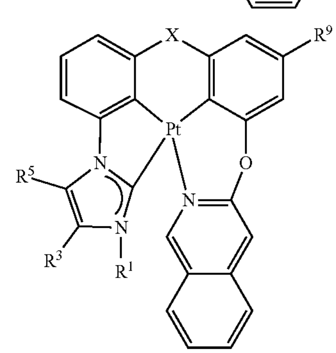

-continued
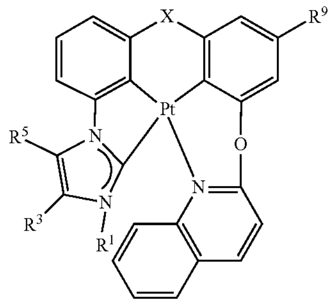
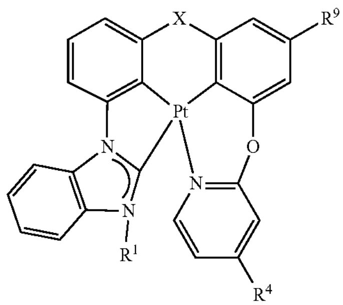
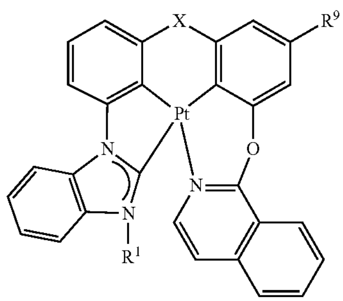
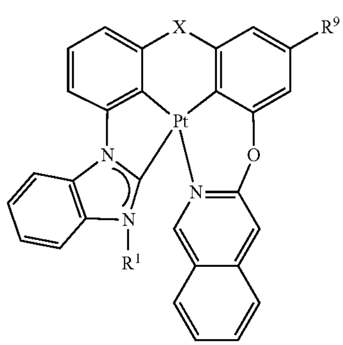
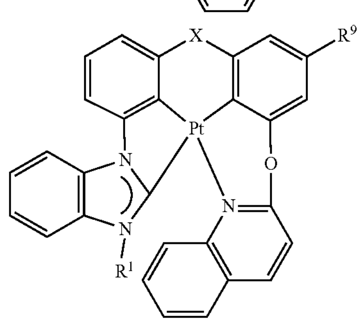
-continued
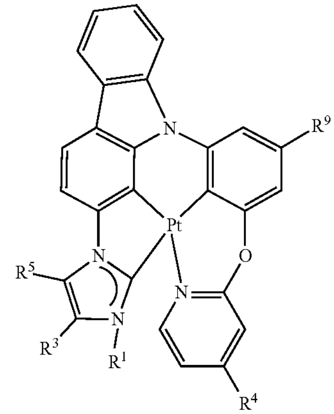
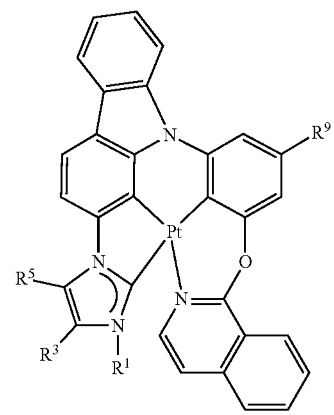
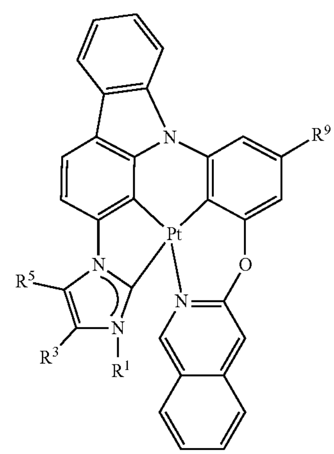
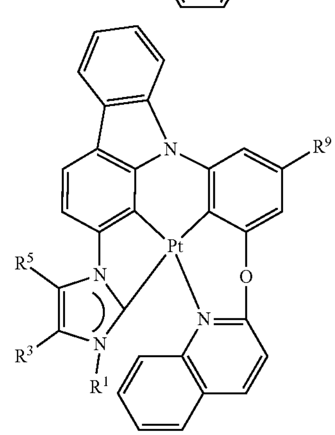

-continued
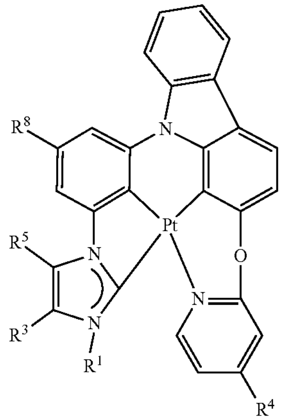
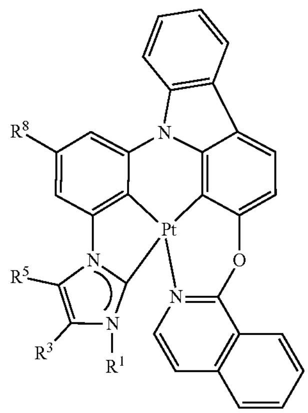
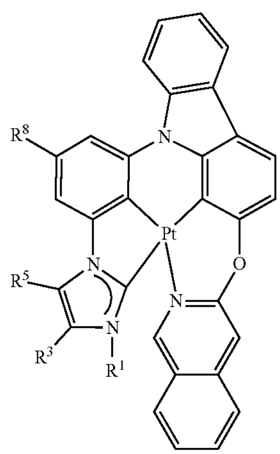
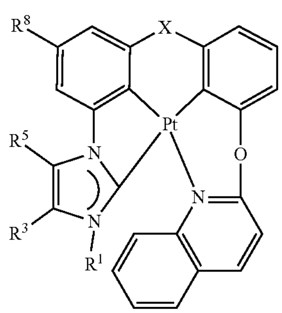
-continued
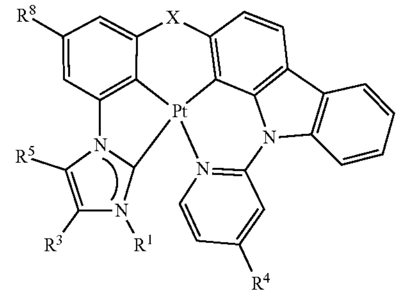
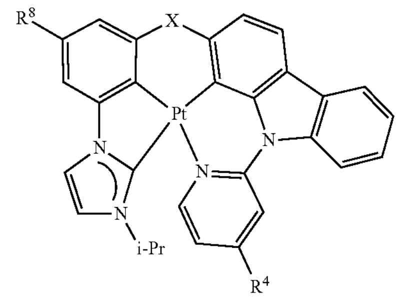
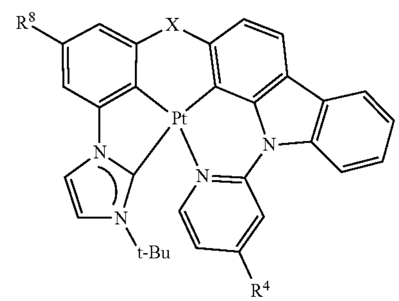
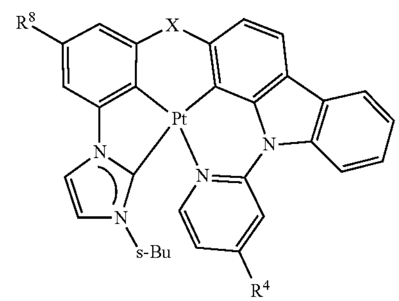
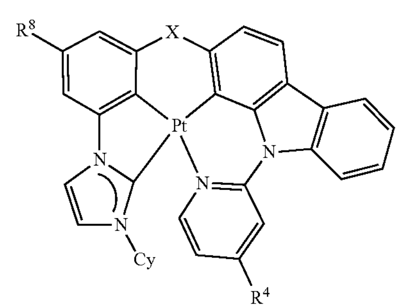

-continued
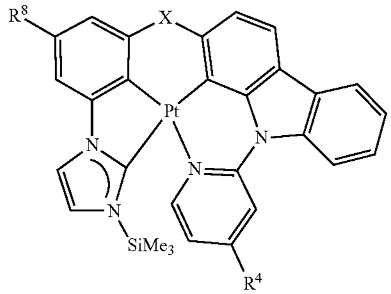
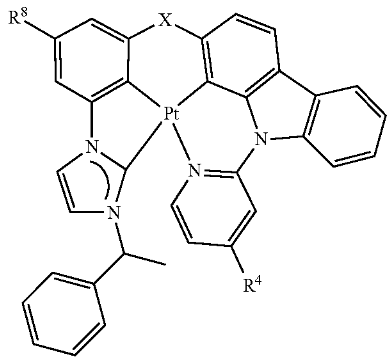
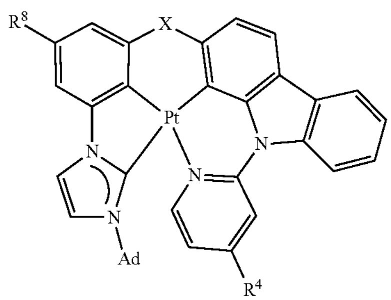
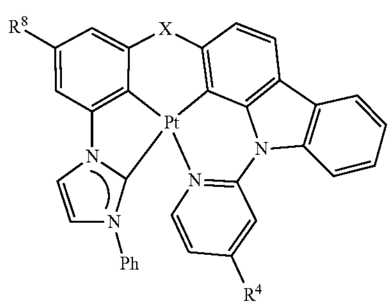
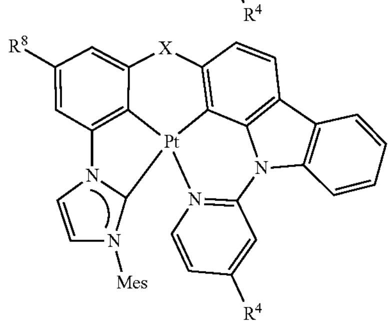
-continued
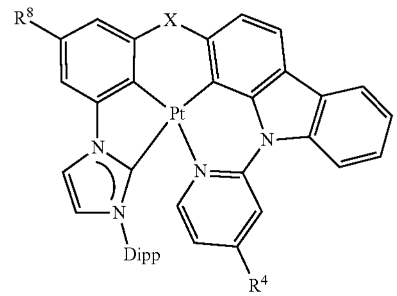
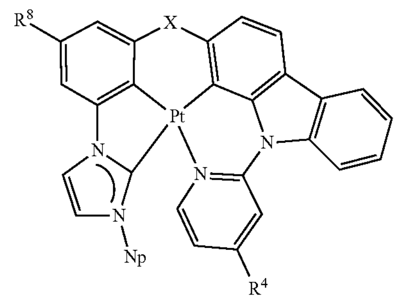
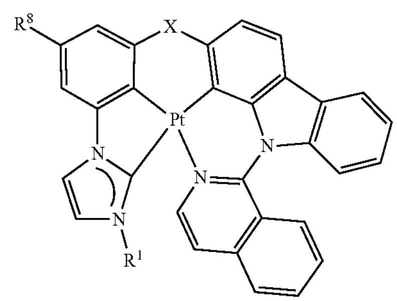
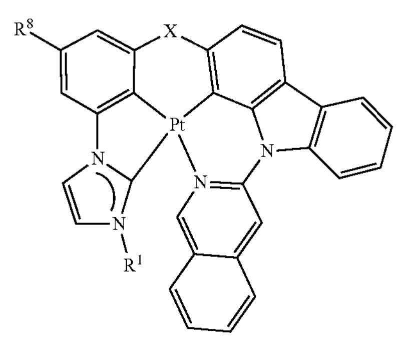
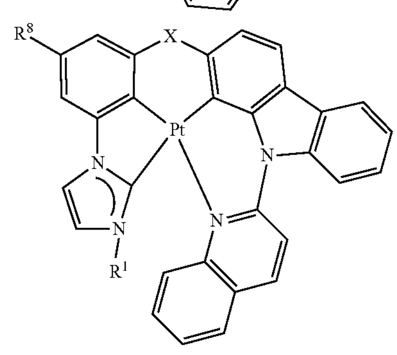

-continued
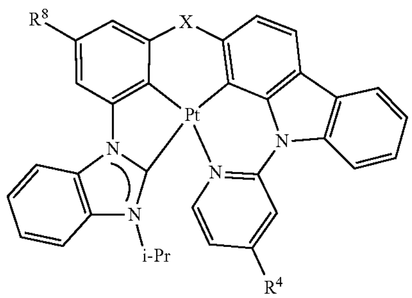
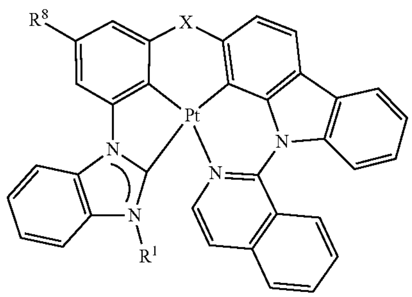
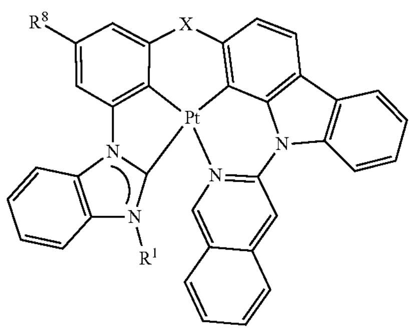
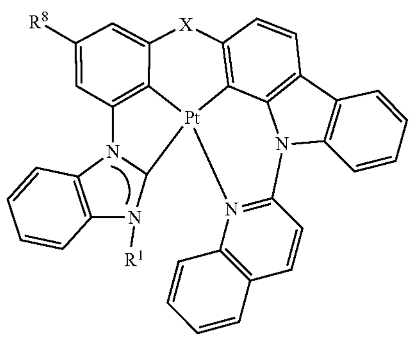
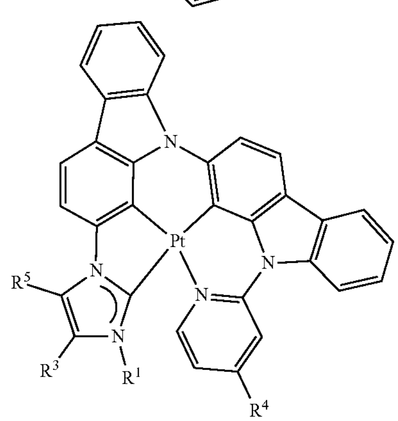
-continued
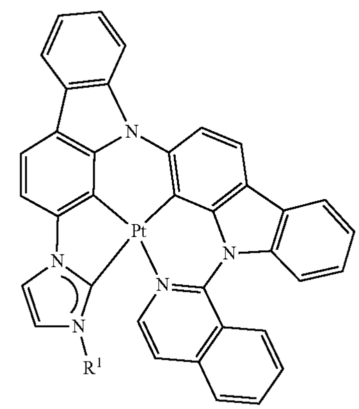
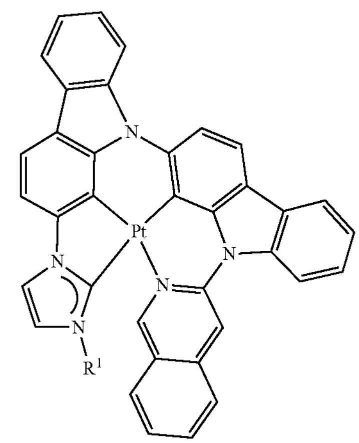
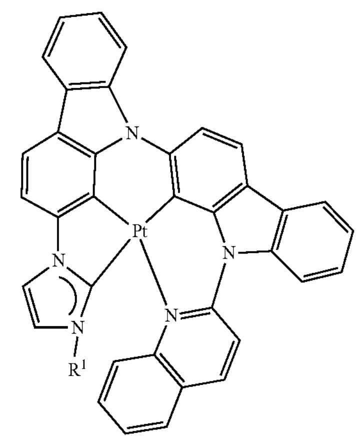
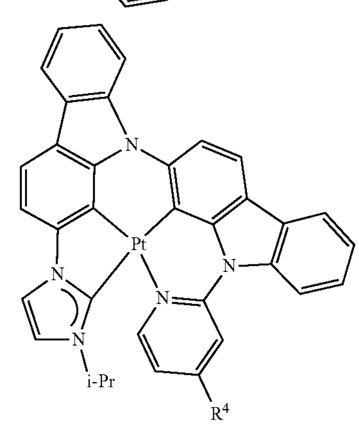

-continued
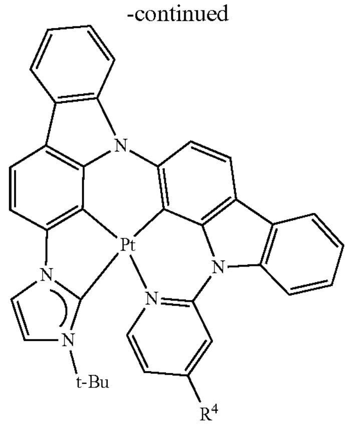
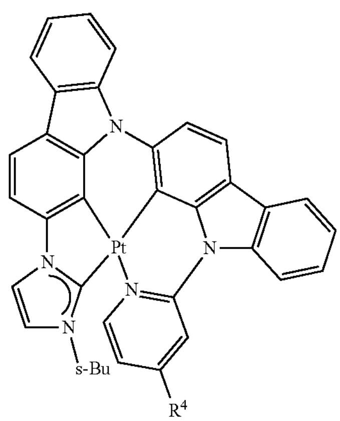
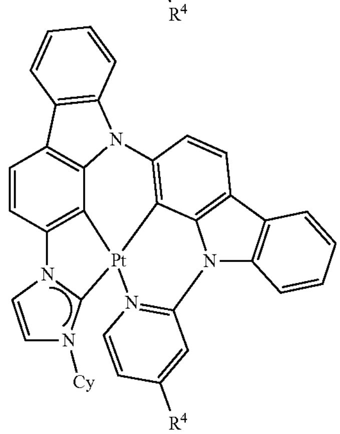
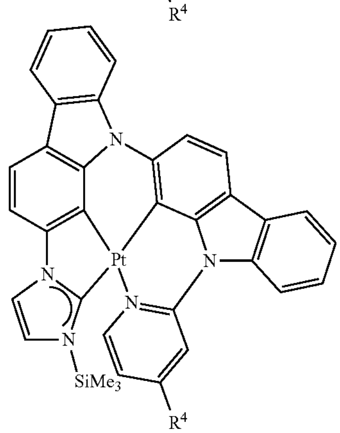
-continued
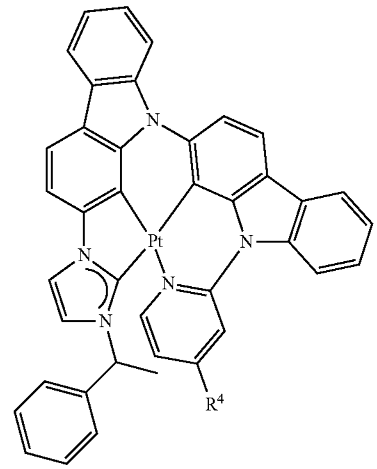
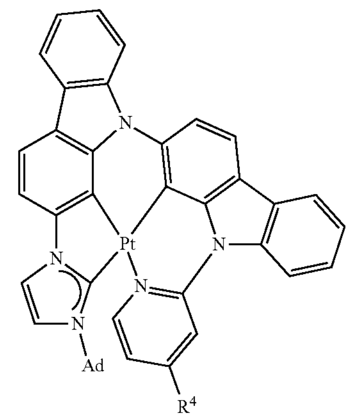
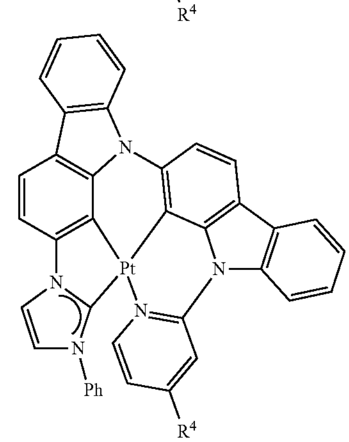
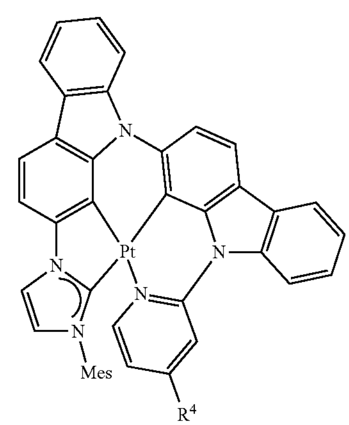

-continued
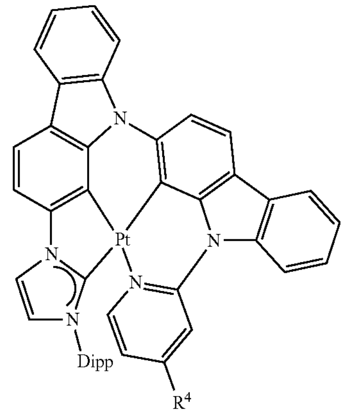
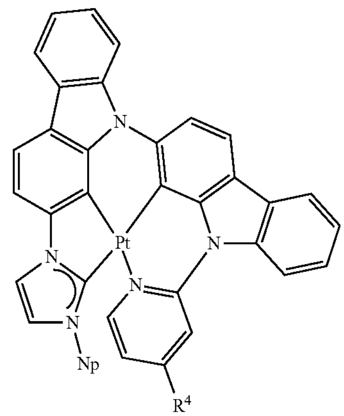
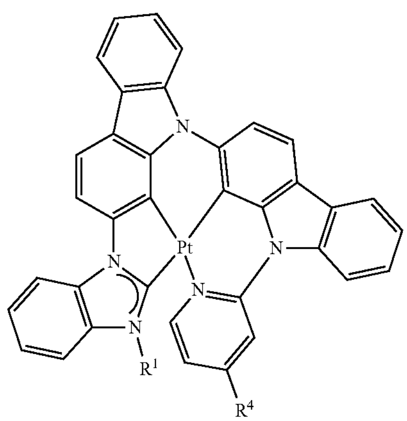
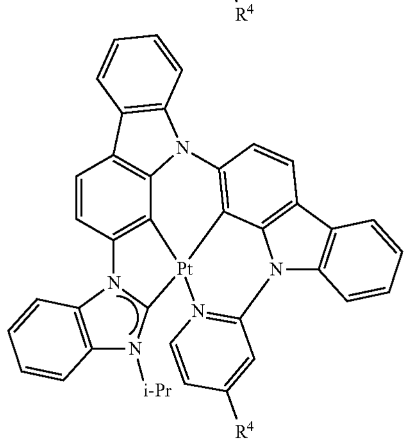
-continued
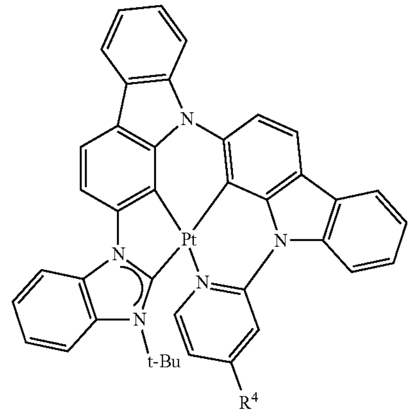
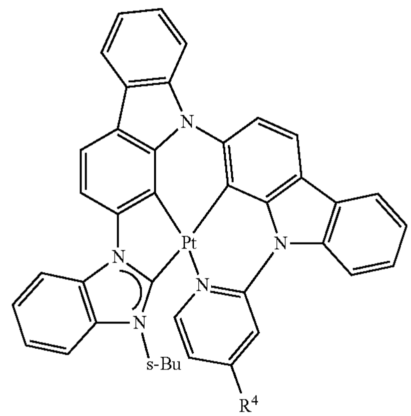
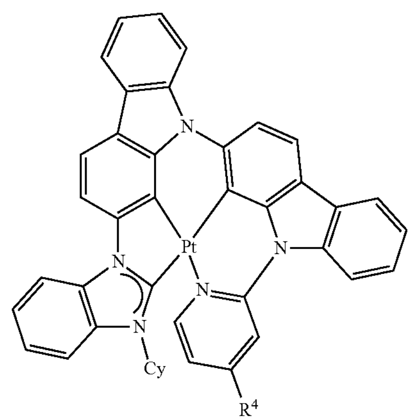
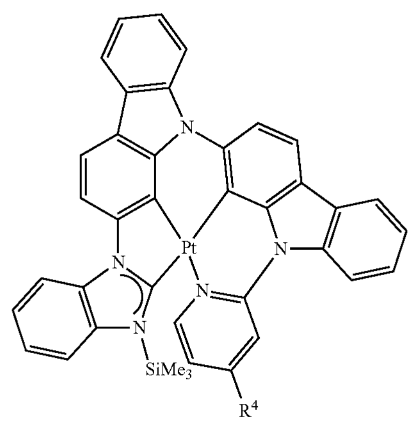

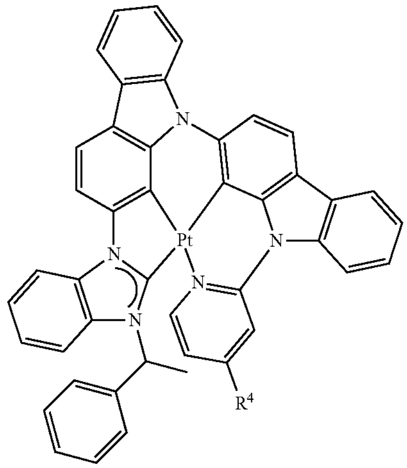
N
Pt
N
N
N
N
R4
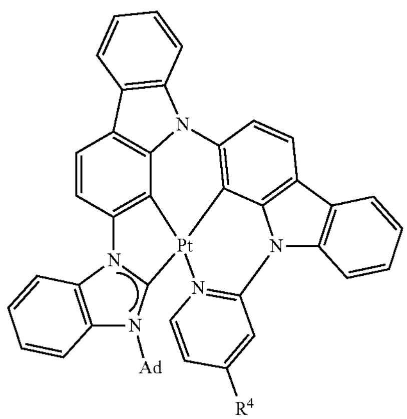
N
Pt
N
N
N
N
Ad
R4
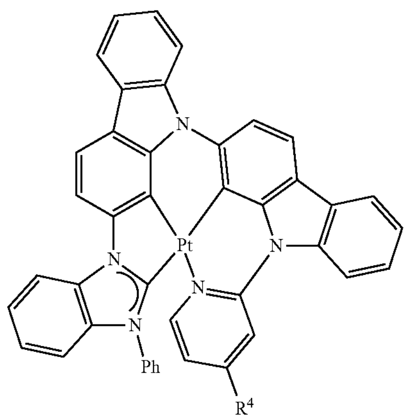
N
Pt
N
N
N
N
Ph
R4
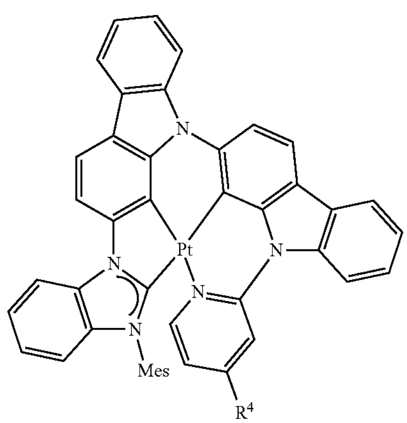
N
Pt
N
N
N
N
Mes
R4
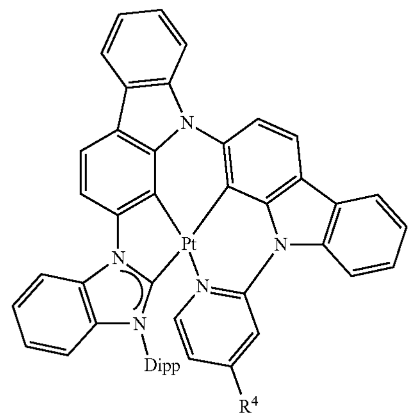
N
Pt
N
N
N
N
Dipp
R4
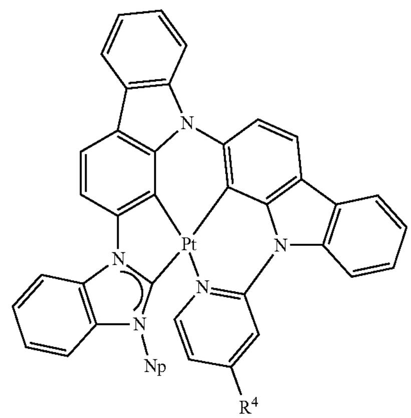
N
Pt
N
N
N
N
Np
R4
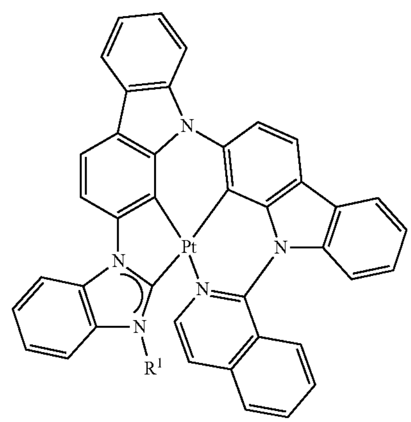
N
Pt
N
N
N
N
R1
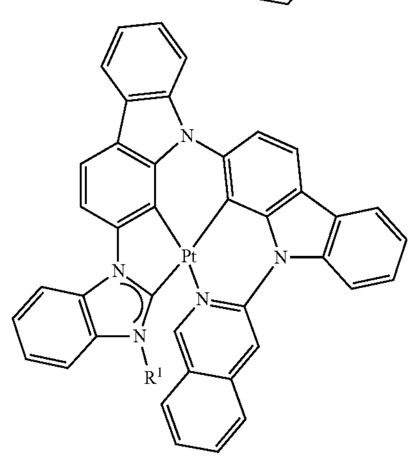
N
Pt
N
N
N
N
R1

54
-continued
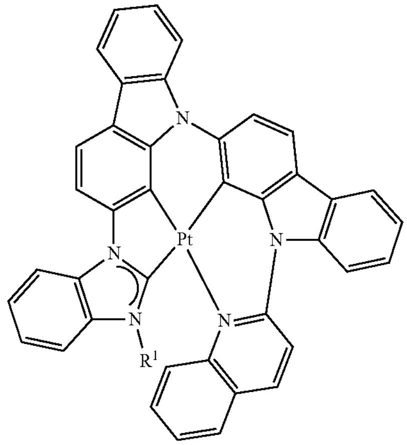
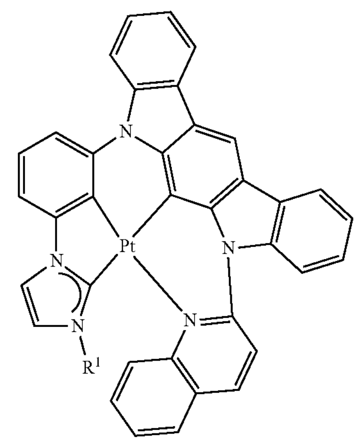
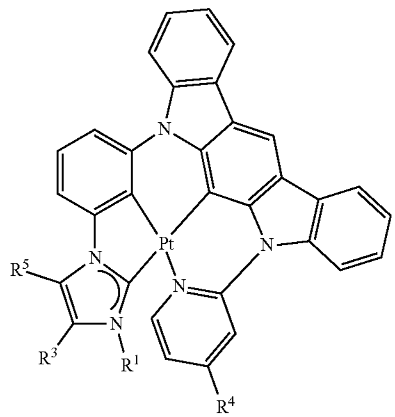
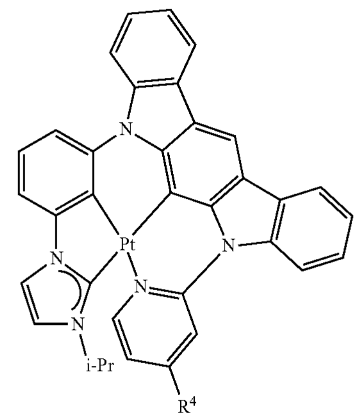
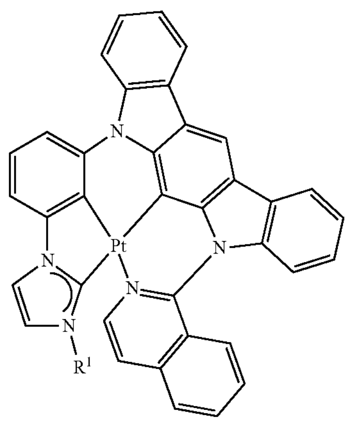
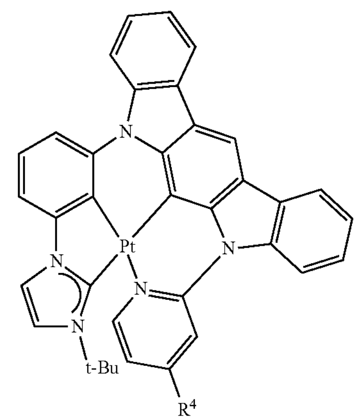
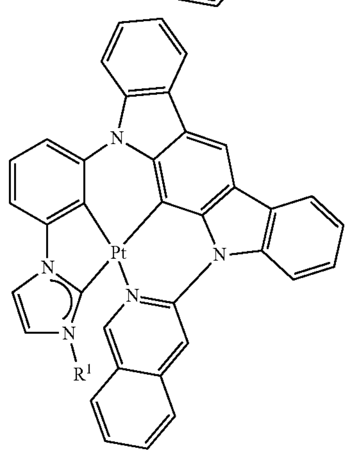
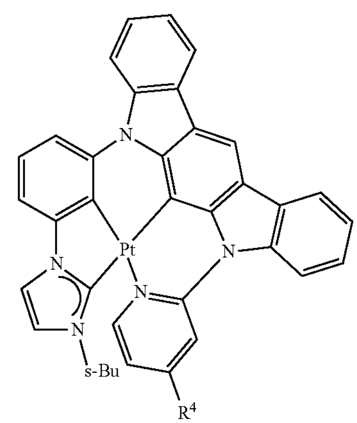

-continued
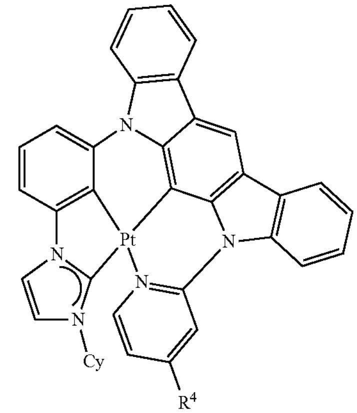
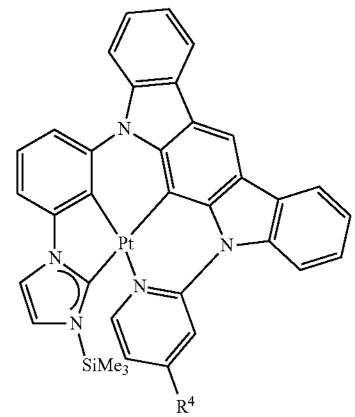
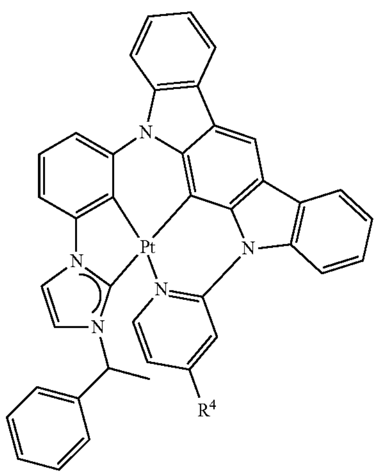
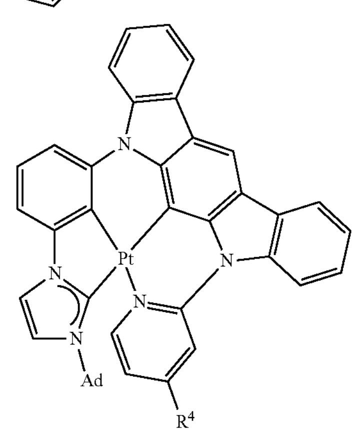
-continued
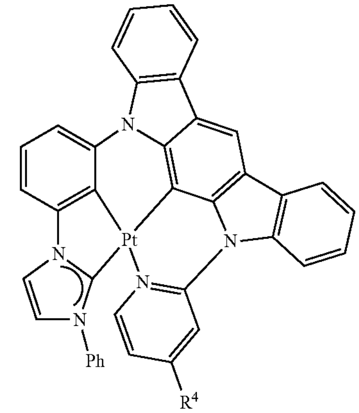
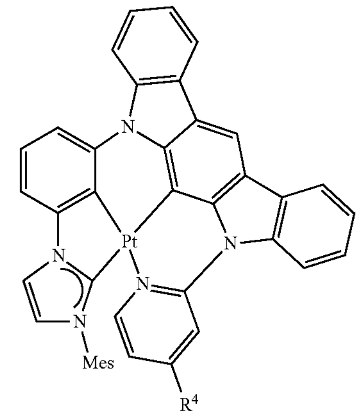
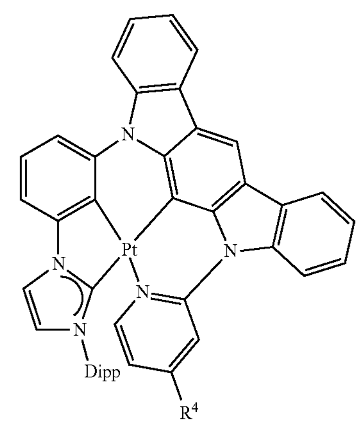
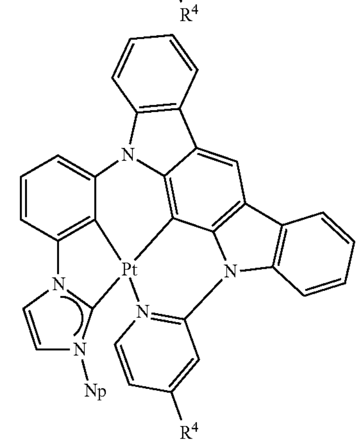

-continued
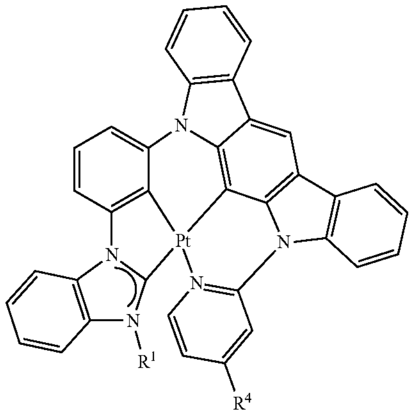
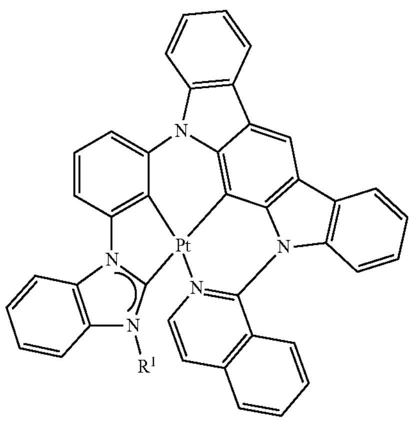
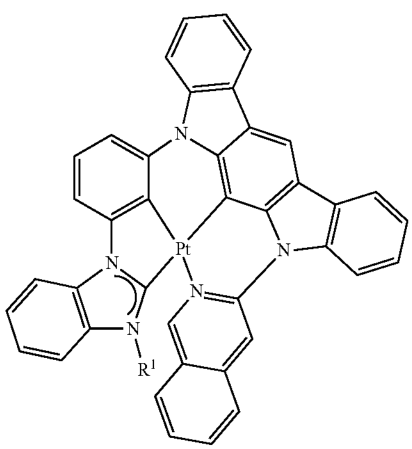
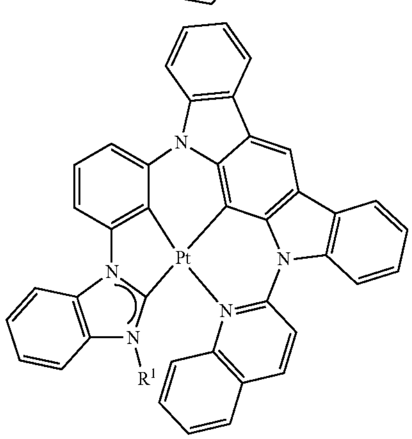
-continued
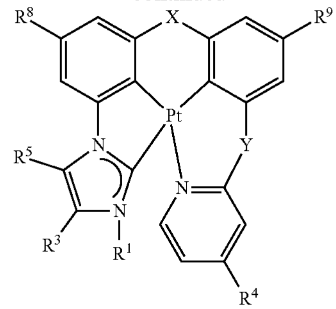
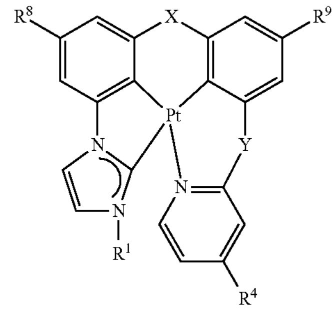
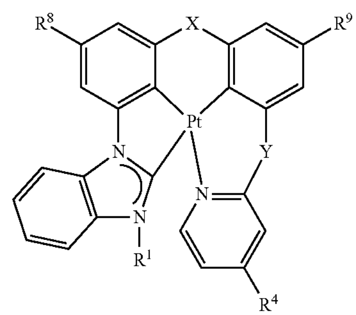
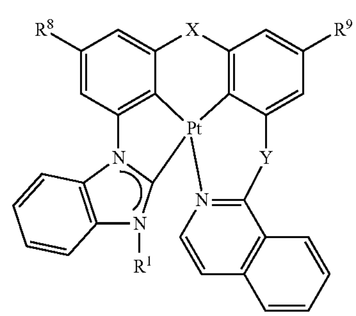
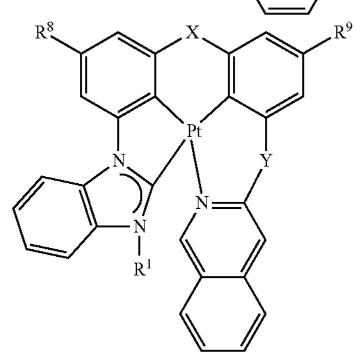

-continued
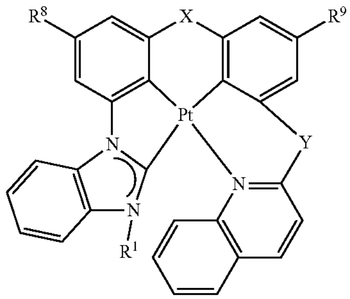
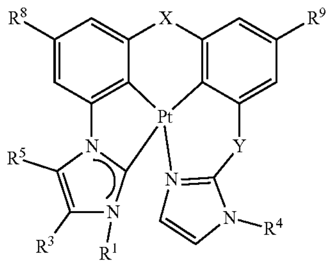
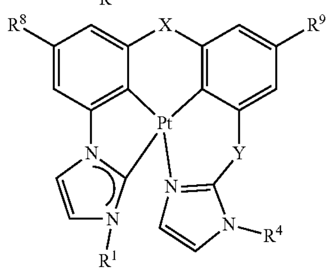
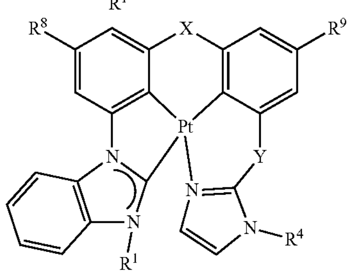
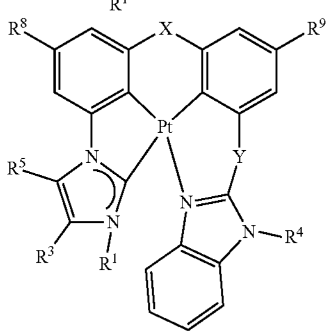
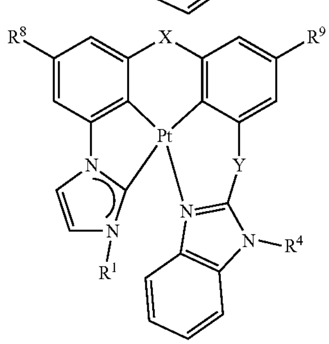
-continued
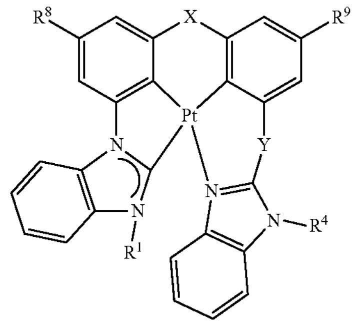
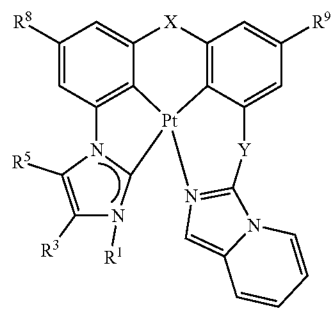
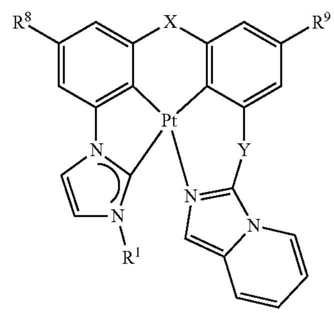
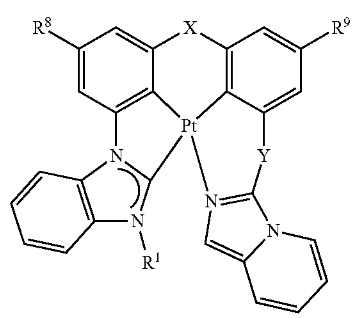
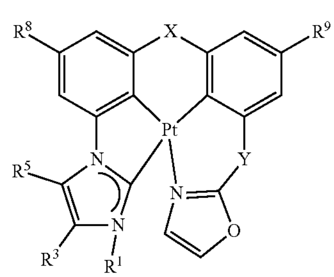

-continued
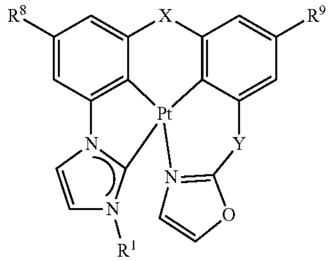
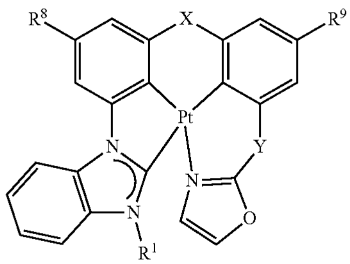
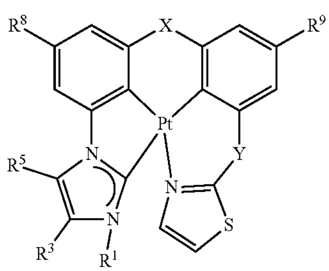
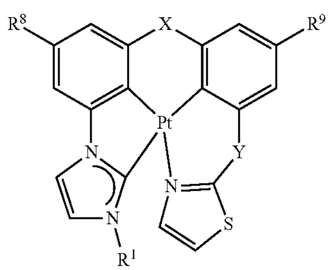
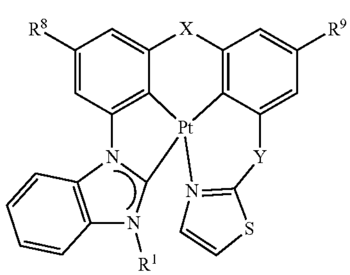
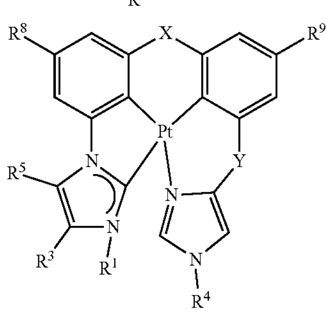
-continued
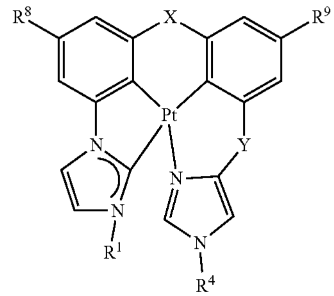
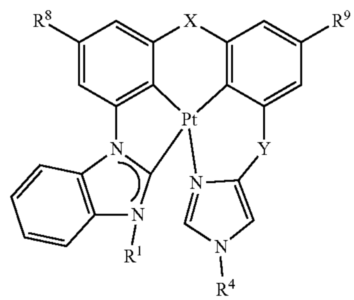
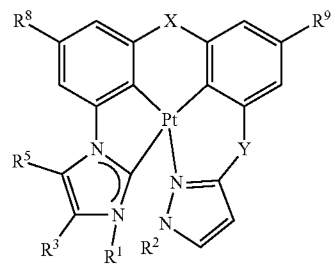
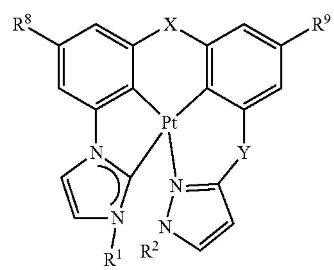
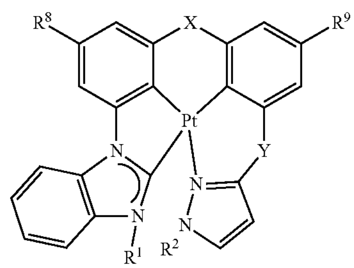
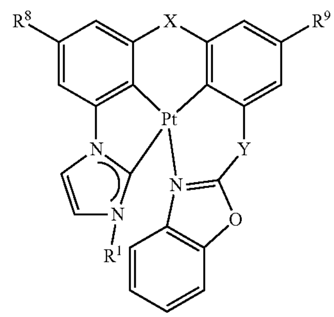

-continued

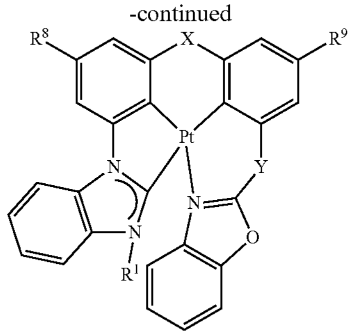

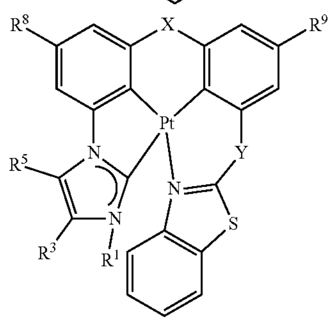

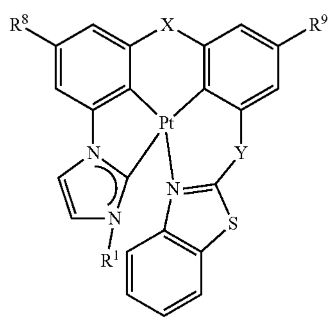

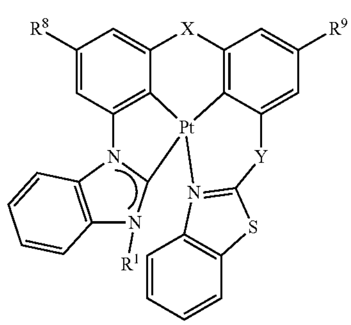

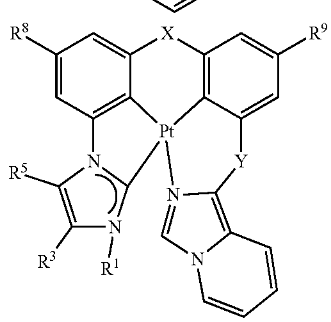

-continued

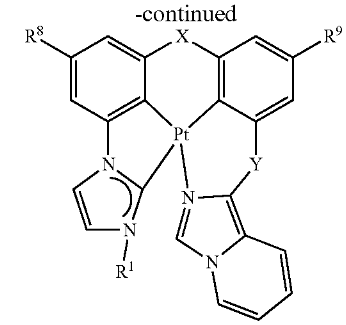

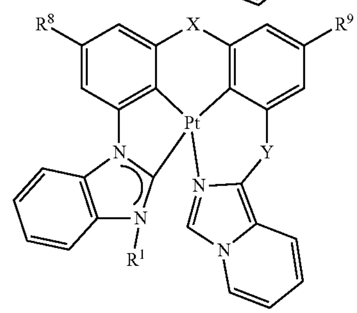

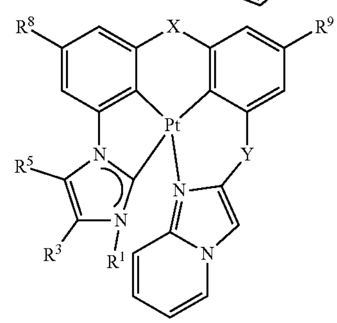

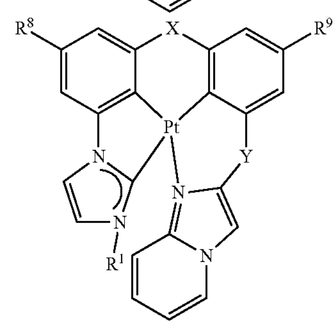

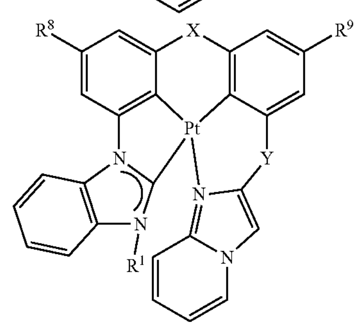

Also disclosed herein are devices including one or more of the complexes disclosed herein.

The complexes disclosed herein are suited for use in a wide variety of devices, including, for example, optical and electro-optical devices, including, for example, photo-absorbing devices such as solar- and photo-sensitive devices, organic light emitting diodes (OLEDs), photo-emitting devices, or devices capable of both photo-absorption and emission and as markers for bio-applications.

Also disclosed herein are devices including one or more of the complexes disclosed herein.

The complexes disclosed herein are suited for use in a wide variety of devices, including, for example, optical and electro-optical devices, including, for example, photo-absorbing devices such as solar- and photo-sensitive devices, organic light emitting diodes (OLEDs), photo-emitting devices, or devices capable of both photo-absorption and emission and as markers for bio-applications.

Complexes described herein can be used in an OLED. FIG. 1 depicts a cross-sectional view of an OLED 100. OLED 100 includes substrate 102, anode 104, hole-transporting material(s) (HTL) 106, light processing material 108, electron-transporting material(s) (ETL) 110, and a metal cathode layer 112. Anode 104 is typically a transparent material, such as indium tin oxide. Light processing material 108 may be an emissive material (EML) including an emitter and a host.

In various aspects, any of the one or more layers depicted in FIG. 1 may include indium tin oxide (ITO), poly(3,4-ethylenedioxythiophene) (PEDOT), polystyrene sulfonate (PSS), N,N'-di-1-naphthyl-N,N-diphenyl-1,1'-biphenyl-4,4'diamine (NPD), 1,1-bis((di-4-tolylamino)phenyl)cyclohexane (TAPC), 2,6-Bis(N-carbazolyl)pyridine (mCpy), 2,8-bis(diphenylphosphoryl)dibenzothiophene (PO15), LiF, Al, or a combination thereof.

Light processing material 108 may include one or more complexes of the present disclosure with a host material or without a host material. The host material can be any suitable known host material. The emission color of an OLED is determined by the emission energy (optical energy gap) of the light processing material 108, which can be tuned by tuning the electronic structure of the emitting complexes and/or the host material. Both the hole-transporting material in the HTL layer 106 and the electron-transporting material(s) in the ETL layer 110 may include any suitable known hole-transporter.

Complexes described herein may exhibit phosphorescence. Phosphorescent OLEDs (i.e., OLEDs with phosphorescent emitters) typically have higher device efficiencies than other OLEDs, such as fluorescent OLEDs. Light emitting devices based on electrophosphorescent emitters are described in more detail in WO2000/070655 to Baldo et al., which is incorporated herein by this reference for its teaching of OLEDs, and in particular phosphorescent OLEDs.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary and are not intended to be limiting in scope. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Various methods for the preparation method of the compounds described herein are recited in the examples. These methods are provided to illustrate various methods of preparation, but are not intended to limit any of the methods recited herein. Accordingly, one of skill in the art in possession of this disclosure could readily modify a recited method or utilize a different method to prepare one or more of the compounds described herein. The following aspects are only exemplary and are not intended to be limiting in scope. Temperatures, catalysts, concentrations, reactant compositions, and other process conditions can vary, and one of skill in the art, in possession of this disclosure, could readily select appropriate reactants and conditions for a desired complex.

$^1H$ spectra were recorded at 400 MHz, $^{13}C$ NMR spectra were recorded at 100 MHz on Varian Liquid-State NMR instruments in $CDCl_3$ or DMSO-$d_6$ solutions and chemical shifts were referenced to residual protiated solvent. If $CDCl_3$ was used as solvent, $^1H$ NMR spectra were recorded with tetramethylsilane (δ=0.00 ppm) as internal reference; $^{13}C$ NMR spectra were recorded with $CDCl_3$ (δ=77.00 ppm) as internal reference. If DMSO-$d_6$ was used as solvent, $^1H$ NMR spectra were recorded with residual $H_2O$ (δ=3.33 ppm) as internal reference; $^{13}C$ NMR spectra were recorded with DMSO-$d_6$ (δ=39.52 ppm) as internal reference. The following abbreviations (or combinations thereof) were used to explain $^1H$ NMR multiplicities: s=singlet, d=doublet, t=triplet, q=quartet, p=quintet, m=multiplet, br=broad.

An exemplary synthetic process for complexes disclosed herein is described with respect to Scheme 1 below for Pt7O7-dipr.

Scheme 1

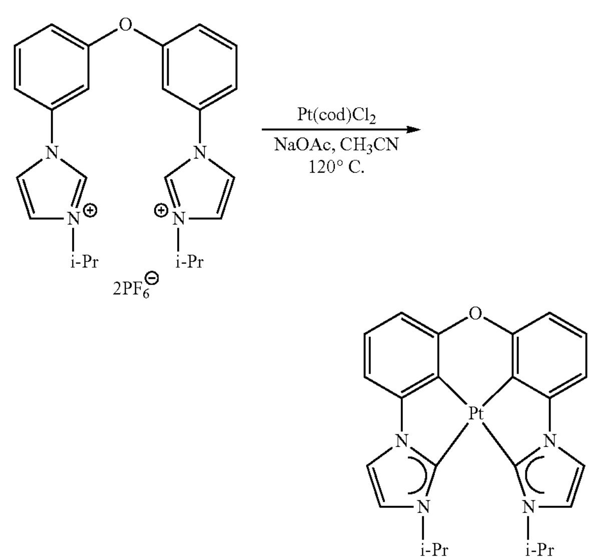

Pt7O7-dipr

Figure 2:
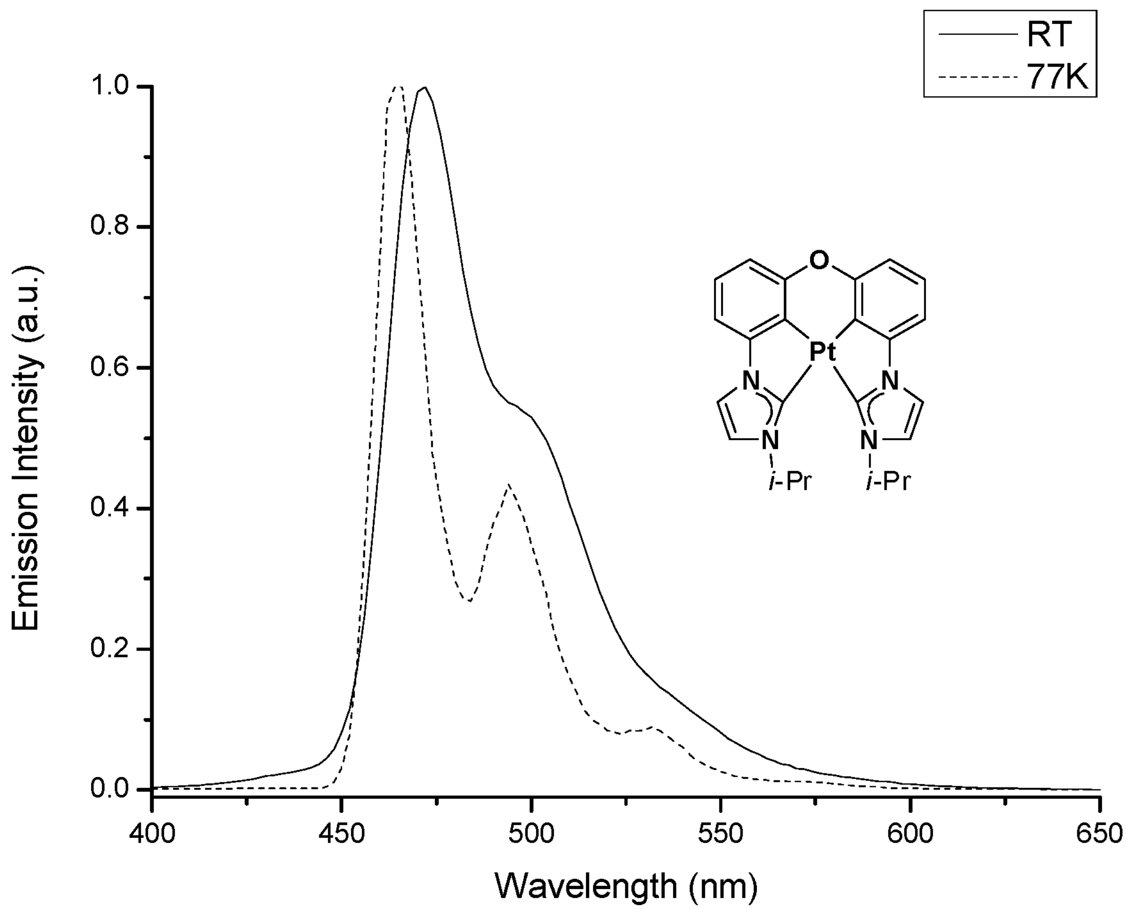
FIG. 2 shows photoluminescence spectra of Pt7O7-dipr at room temperature and 77K.

To an oven-dried flask were added the ligand of Pt7O7-dipr (610 mg, 0.9 mmol), $K_2PtCl_4$ (392 mg, 0.945 mmol), and n-$Bu_4NBr$ (29 mg, 0.09 mmol). The flask was evacuated and backfilled with $N_2$, followed by the addition of HOAc (45 mL, 0.02 M) under the protection of $N_2$. The mixture was then heated at 120° C. for 3 days. The resulting mixture was cooled to room temperature and concentrated under reduced pressure. Purification by flash column chromatography on silica gel (DCM/Hexane=1/1 to 3/1) gave Pt707-dipr as a light yellow solid (99 mg, 19% yield). $^1H$ NMR (DMSO-$d_6$, 400 MHz): δ 8.04 (d, J=2.0 Hz, 2H), 7.65 (d, J=2.0 Hz, 2H), 7.20 (d, J=7.4 Hz, 2H), 7.11 (t, J=7.8 Hz, 2H), 6.96-6.85 (m, 2H), 4.78 (sept, J=6.6 Hz, 2H), 1.47 (d, J=6.6 Hz, 12H). Photoluminescence spectra of Pt7O7-dipr at room temperature and 77K are shown in FIG. 2.

Complexes described herein are suitable as emitters for light emitting devices such as OLEDs (e.g., for full color displays and lighting applications).

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description. Changes may be made in the elements described herein without departing from the spirit and scope as described in the following claims.

What is claimed is:

1. A complex represented by Formula II:

Formula II

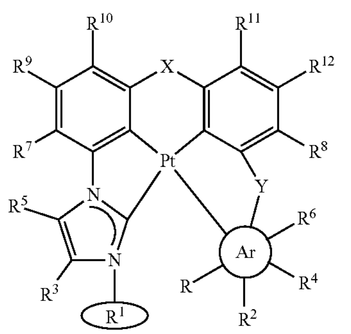

wherein:

Ar is a five-membered heteroaryl, five-membered carbene, five-membered N-heterocyclic carbene, a six-membered aryl, or a six-membered heteroaryl, $R^1$ is selected from the group consisting of

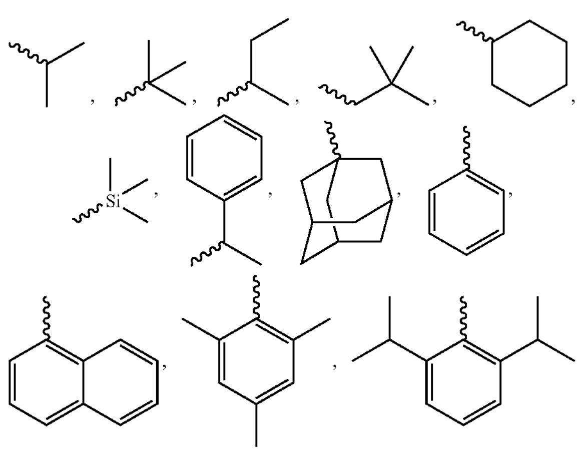

and an aryl group with alkyl substituents,

X is O, S, S═O, O═S═O, Se, Se═O, O═Se═O, $NR^{2a}$, $PR^{2b}$, $AsR^{2c}$, $CR^{2d}R^{2e}$, $SiR^{2f}R^{2g}$, or $BR^{2h}$, each of $R^{2a}$, $R^{2b}$, $R^{2c}$, $R^{2d}$, $R^{2e}$, $R^{2f}$, $R^{2g}$, and $R^{2h}$ is independently substituted or unsubstituted $C_1$-$C_4$ alkyl or aryl, Y is O, S, S═O, O═S═O, Se, Se═O, O═Se═O, $NR^{3a}$, $PR^{3b}$, $AsR^{3c}$, $CR^{3d}R^{3e}$, $SiR^{3f}R^{3g}$, or $BR^{3h}$, and each of $R^{3a}$, $R^{3b}$, $R^{3c}$, $R^{3d}$, $R^{3e}$, $R^{3f}$, $R^{3g}$, and $R^{3h}$ is independently substituted or unsubstituted $C_1$-$C_4$ alkyl or aryl each of R, $R^2$, $R^3$, $R^4$, $R^5$, $R^7$, $R^9$, $R^{11}$, and $R^{12}$ is independently hydrogen, halogen, hydroxy, nitro, thiol; substituted or unsubstituted: $C_1$-$C_5$ alkyl, alkoxy, aryl, or amino, wherein R is absent when Ar is a five-membered ring, each of $R^6$ and $R^8$ is independently hydrogen, halogen, hydroxy, nitro, thiol; substituted or unsubstituted: $C_1$-$C_5$ alkyl, alkoxy, aryl, or amino, or one or both of $R^6$ and $R^8$ independently represents a direct bond to any of $R^{3a}$, $R^{3b}$, $R^{3c}$, $R^{3d}$, $R^{3e}$, $R^{3f}$, $R^{3g}$, and $R^{3h}$, and each of $R^{10}$ and $R^{11}$ is independently hydrogen, halogen, hydroxy, nitro, thiol; substituted or unsubstituted: $C_1$-$C_5$ alkyl, alkoxy, aryl, or amino, or one or both of $R^{10}$ and $R^{11}$ independently represents a direct bond to any of $R^{2a}$, $R^{2b}$, $R^{2c}$, $R^{2d}$, $R^{2e}$, $R^{2f}$, $R^{2g}$, or $R^{2h}$ wherein any two of R, $R^2$, $R^3$, $R^4$, $R^5$, $R^6$, $R^7$, $R^8$, $R^9$, $R^{10}$, $R^{11}$, and $R^{12}$ on the same ring or adjacent rings are optionally bonded together to form a fused ring system that is optionally further substituted.

2. The complex of claim 1, wherein X is $NR^{2a}$, $PR^{2b}$, $AsR^{2c}$, $CR^{2d}R^{2e}$, $SiR^{2f}R^{2g}$, or $BR^{2h}$, and $R^{10}$ represents a direct bond to one of $R^{2a}$, $R^{2b}$, $R^{2c}$, $R^{2d}$, $R^{2e}$, $R^{2f}$, $R^{2g}$, or $R^{2h}$.

3. The complex of claim 1, wherein Y is $NR^{3a}$, $PR^{3b}$, $AsR^{3c}$, $CR^{3d}R^{3e}$, $SiR^{3f}R^{3g}$, or $BR^{3h}$, and $R^6$ or $R^8$ represents a direct bond to $R^{3a}$, $R^{3b}$, $R^{3c}$, $R^{3d}$, $R^{3e}$, $R^{3f}$, $R^{3g}$, or $R^{3h}$.

4. The complex of claim 1, having one of the following chemical structures:

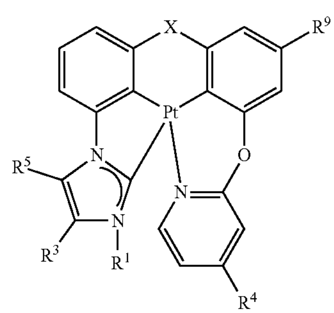

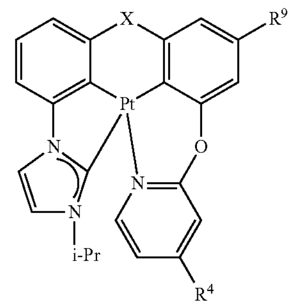

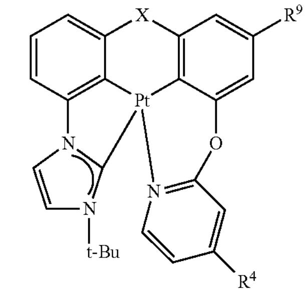
X
R9
Pt
N
O
N
N
t-Bu
R4
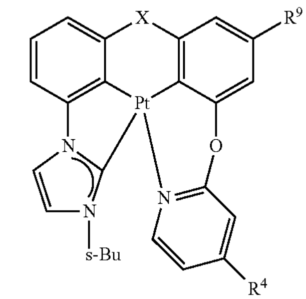
X
R9
Pt
N
O
N
N
s-Bu
R4
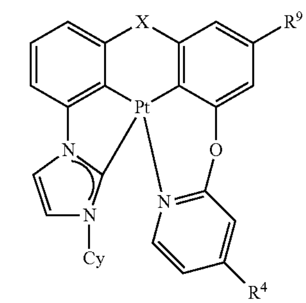
X
R9
Pt
N
O
N
N
Cy
R4
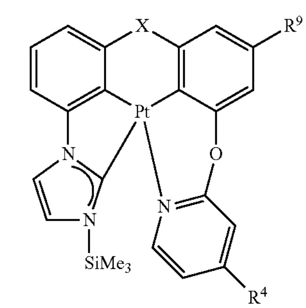
X
R9
Pt
N
O
N
N
SiMe3
R4
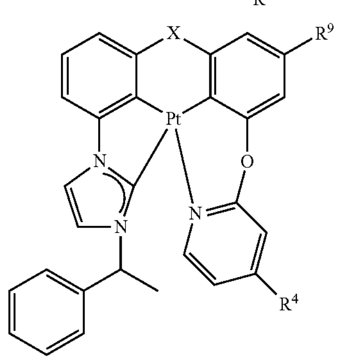
X
R9
Pt
N
O
N
N
R4
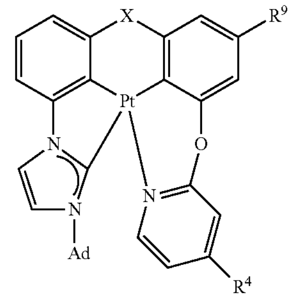
X
R9
Pt
N
O
N
N
Ad
R4
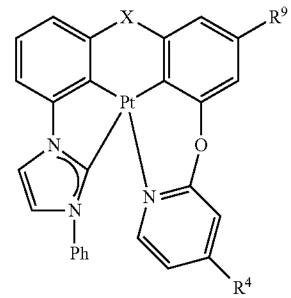
X
R9
Pt
N
O
N
N
Ph
R4
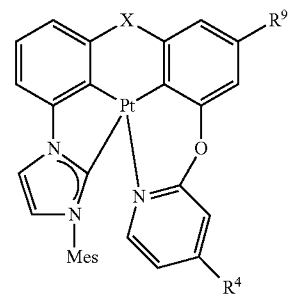
X
R9
Pt
N
O
N
N
Mes
R4
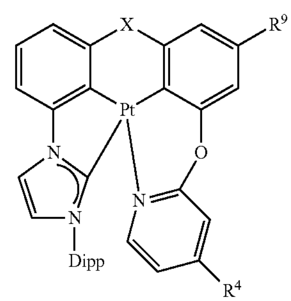
X
R9
Pt
N
O
N
N
Dipp
R4
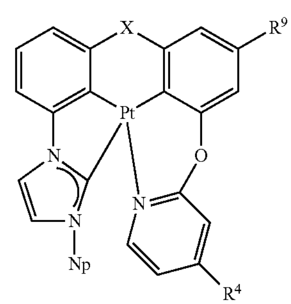
X
R9
Pt
N
O
N
N
Np
R4

-continued
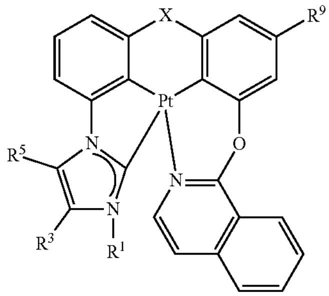
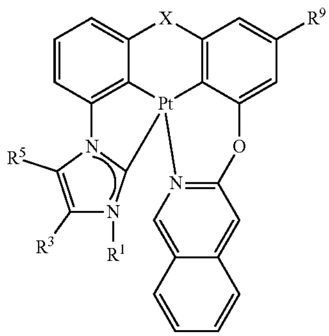
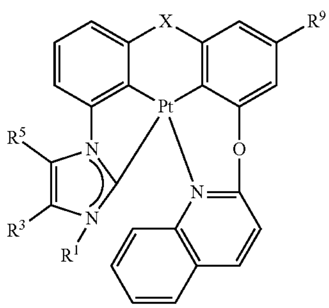
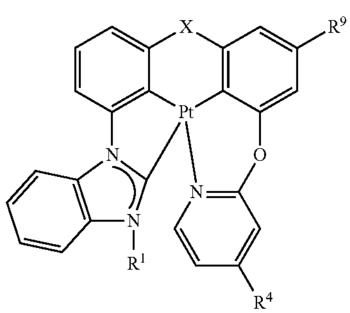
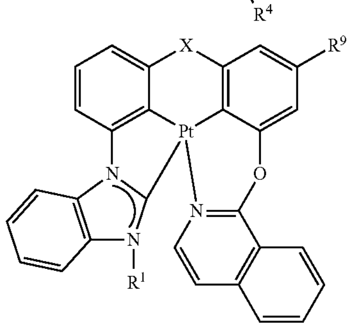
-continued
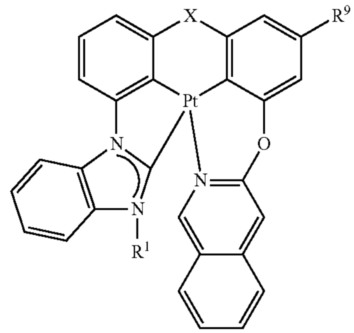
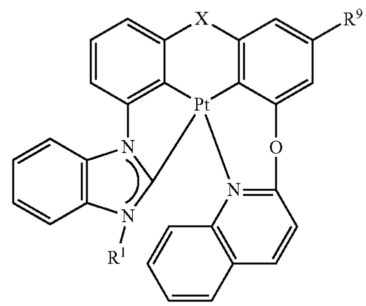
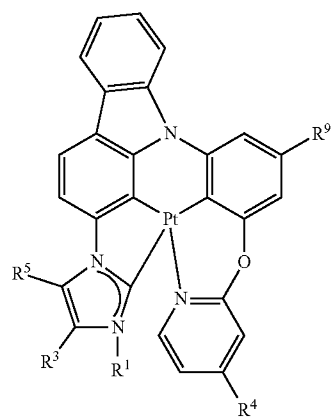
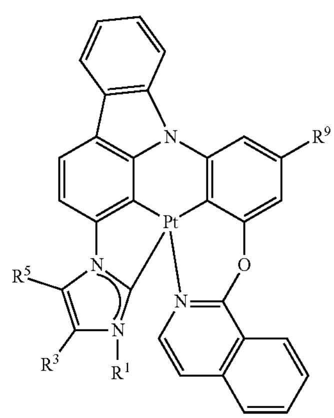

-continued
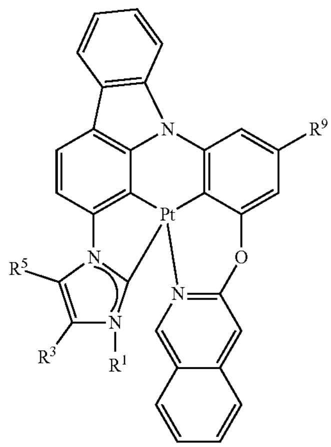
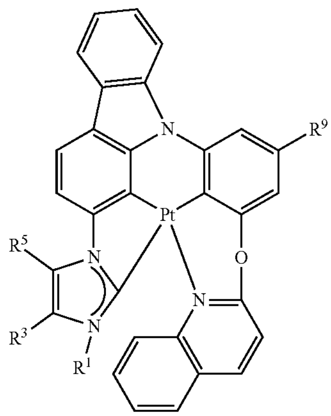
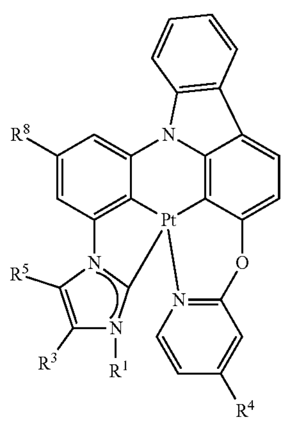
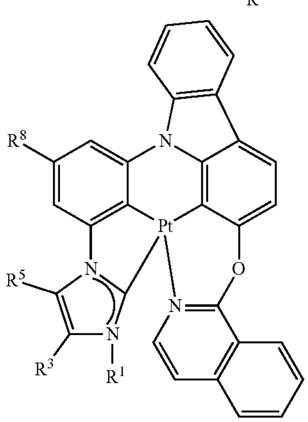
-continued
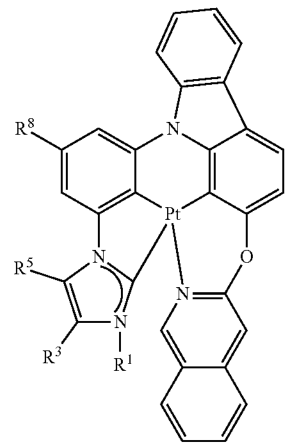
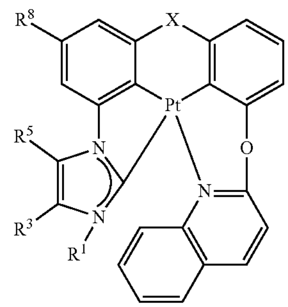
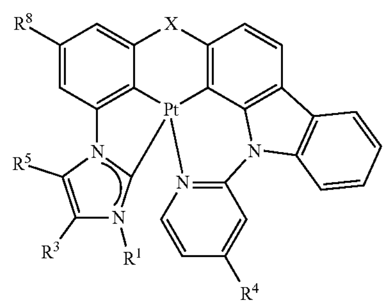
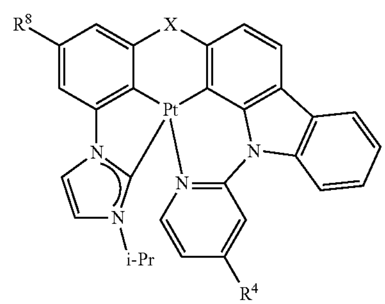
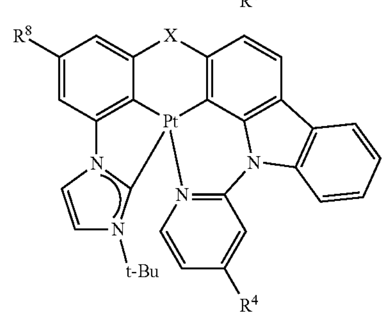

-continued
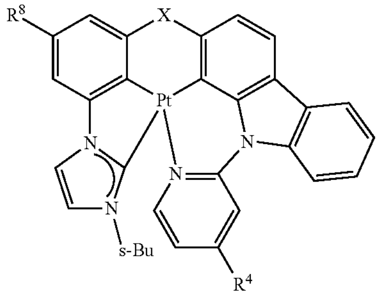
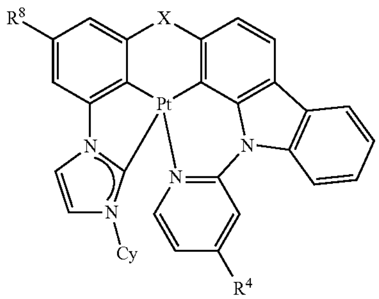
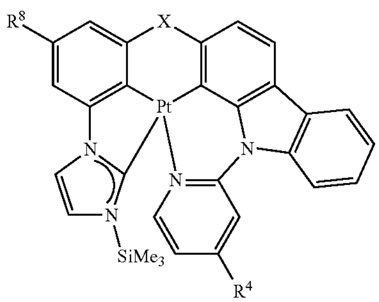
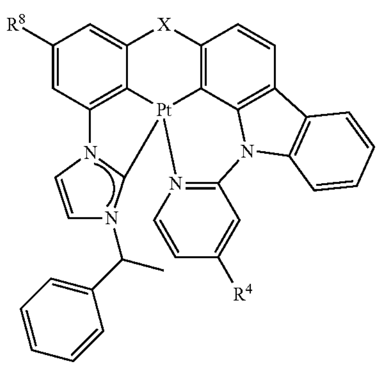
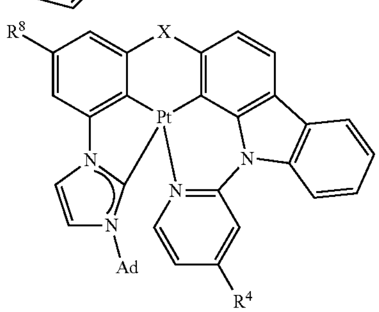
-continued
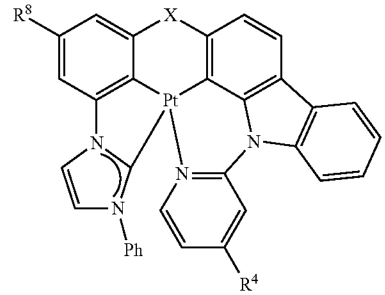
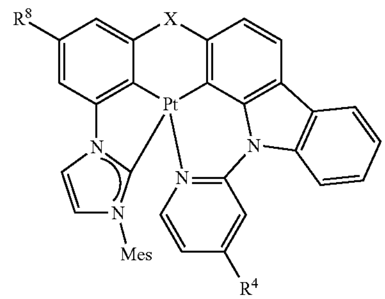
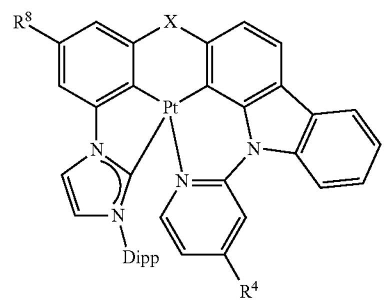
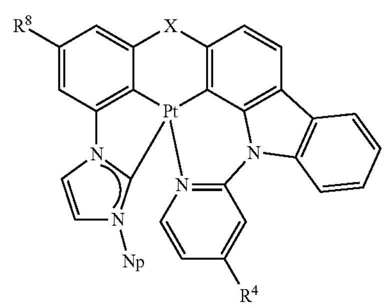
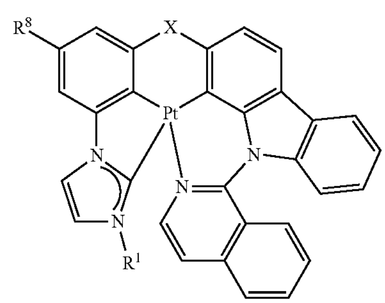

-continued
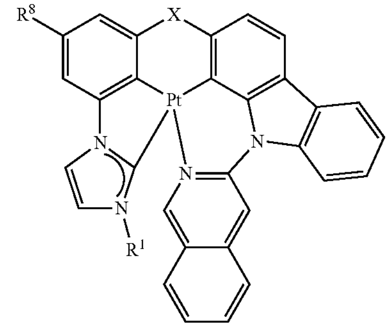
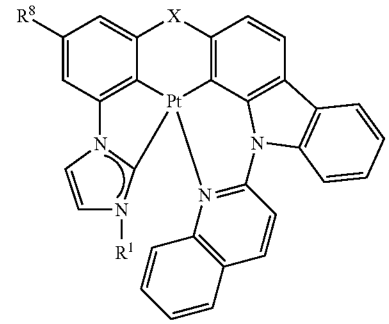
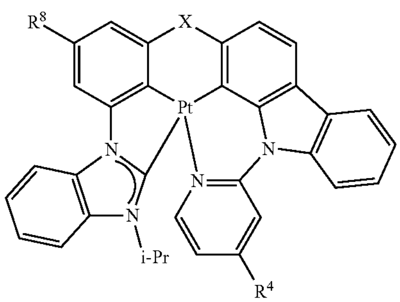
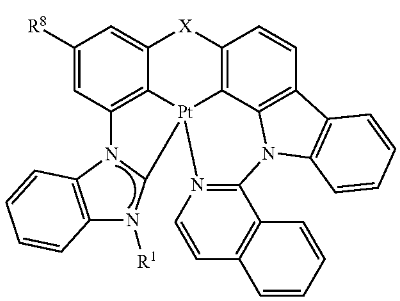
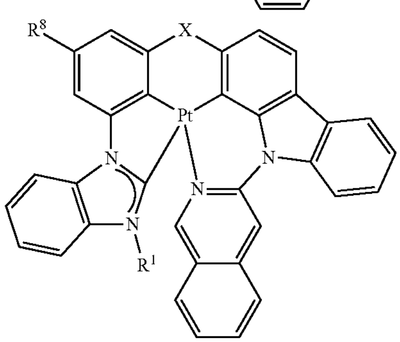
-continued
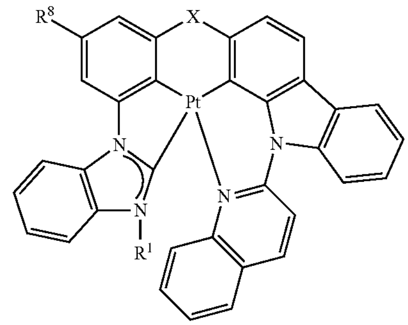
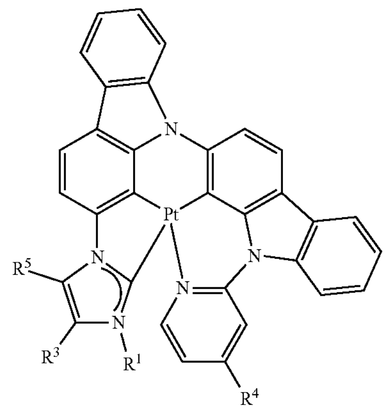
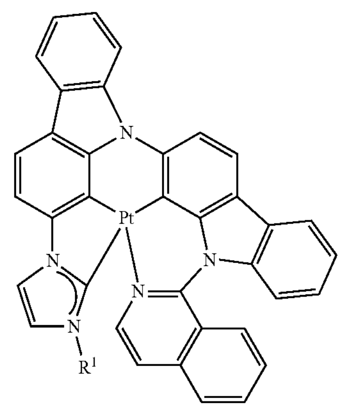
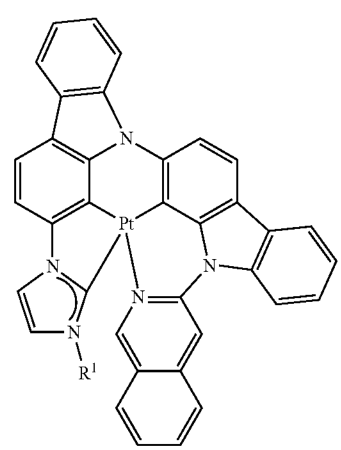

-continued
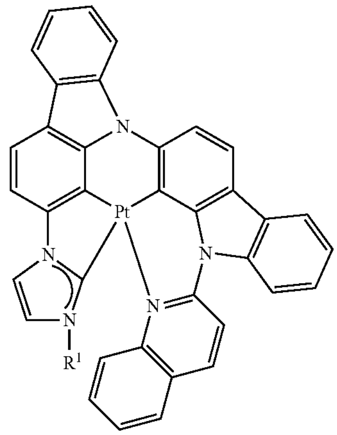
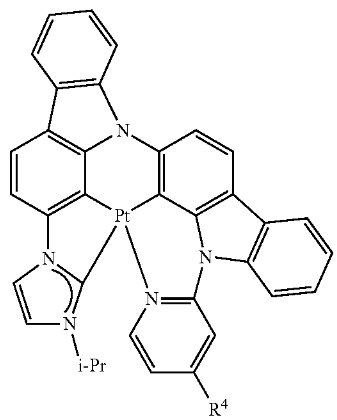
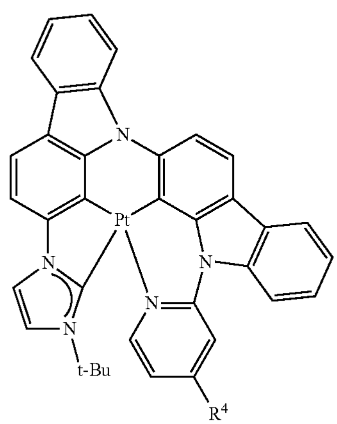
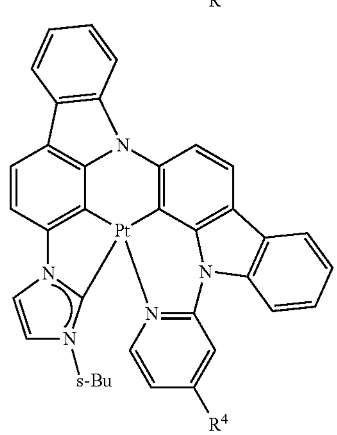
-continued
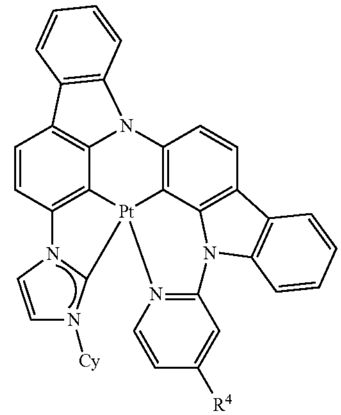
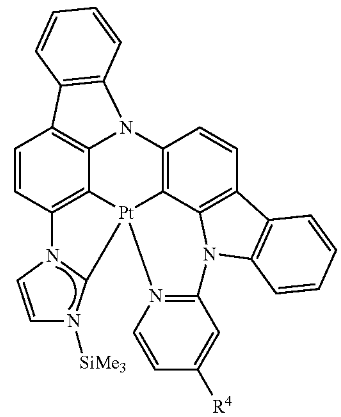
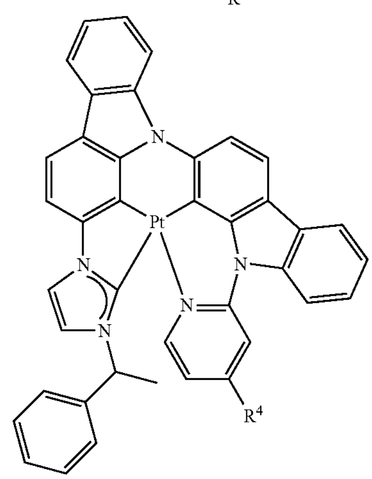
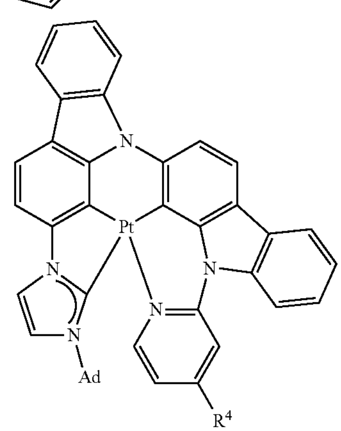

-continued
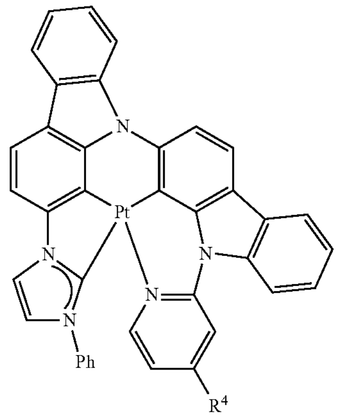
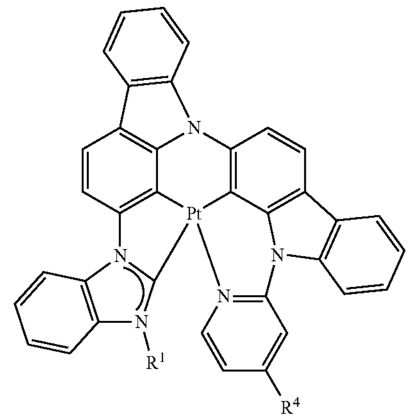
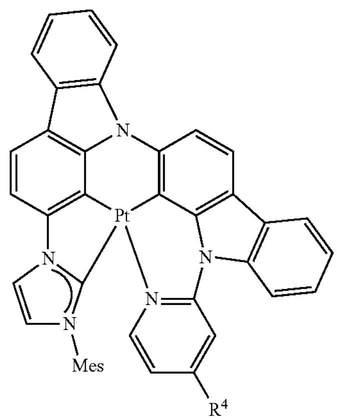
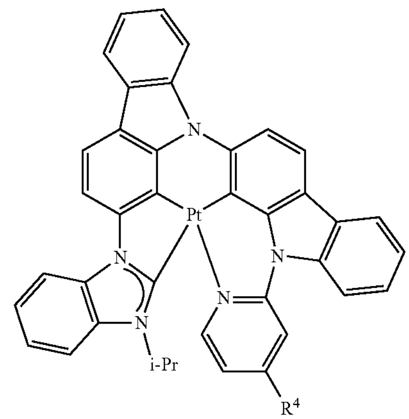
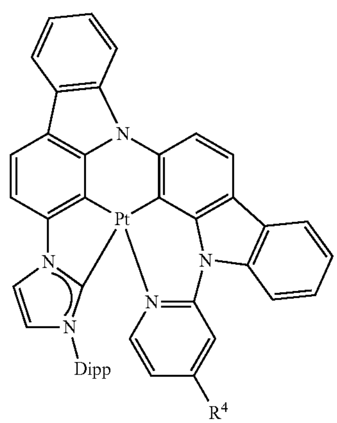
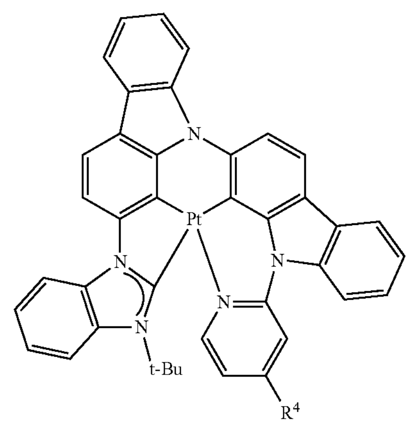
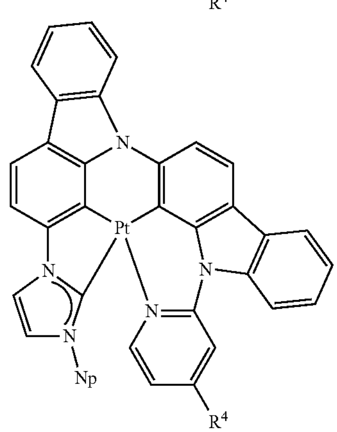
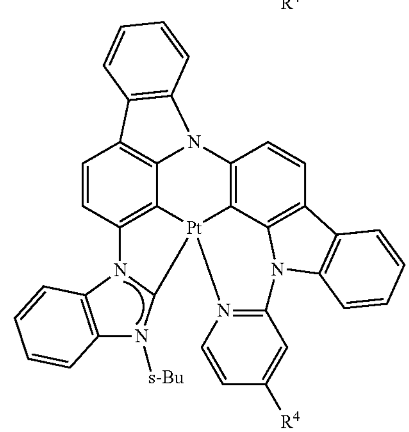

-continued
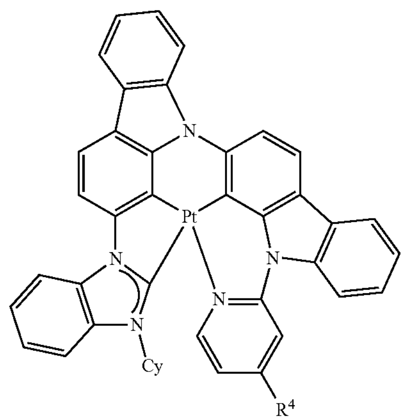
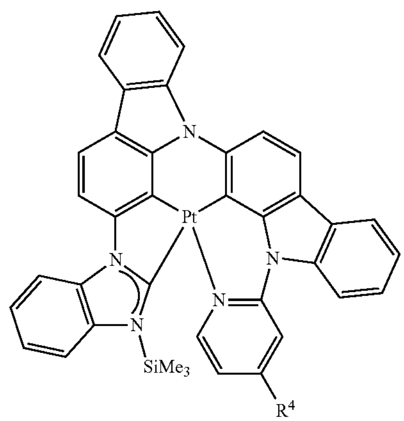
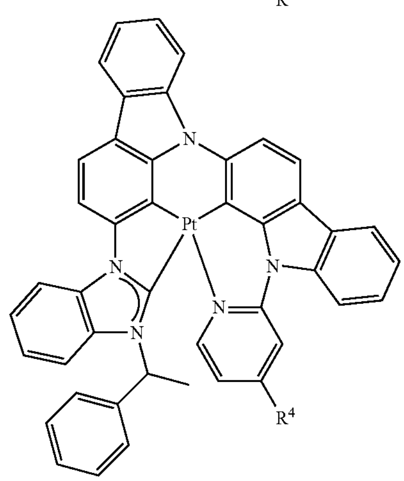
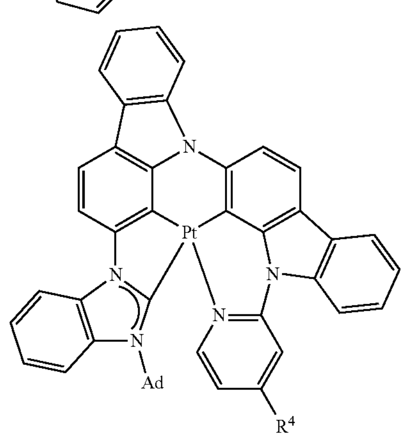
-continued
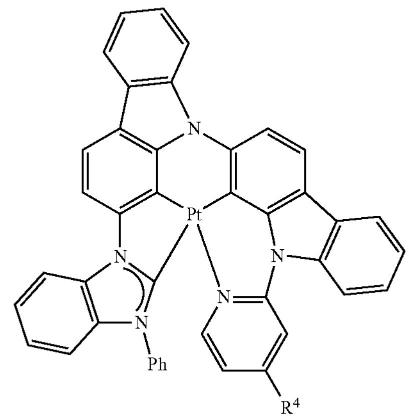
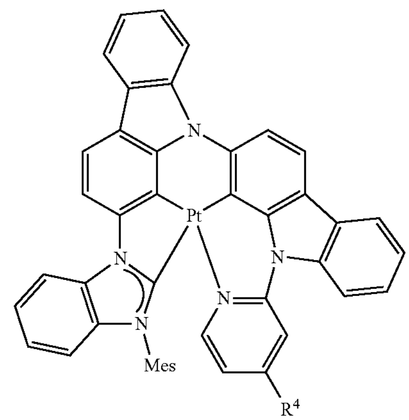
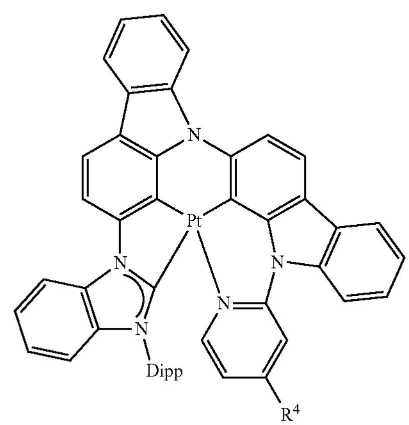
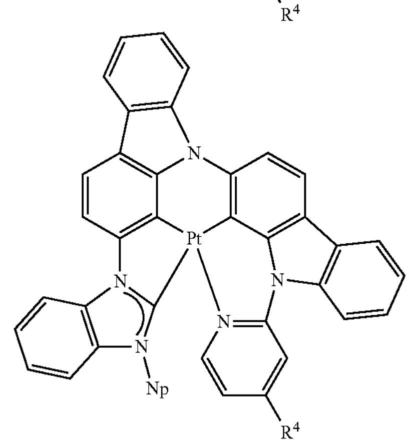

-continued
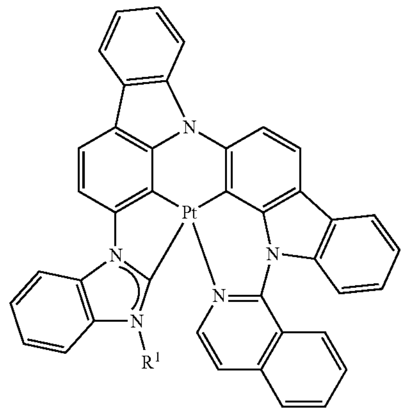
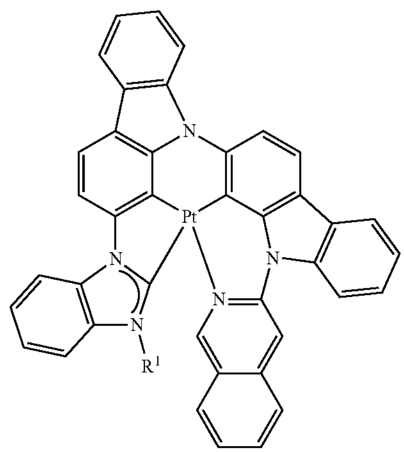
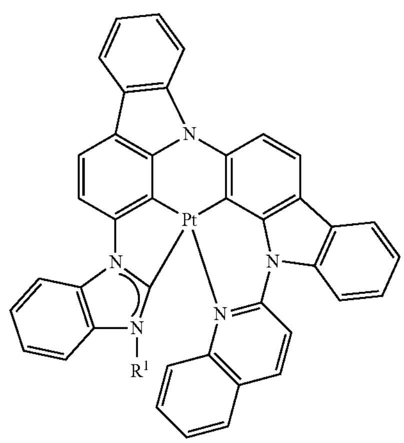
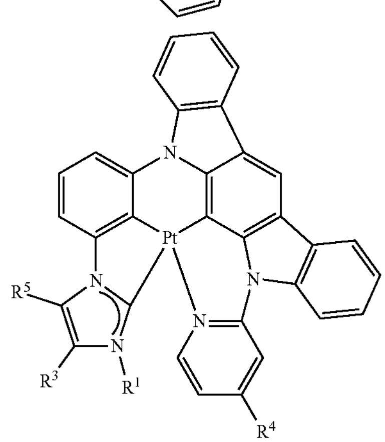
-continued
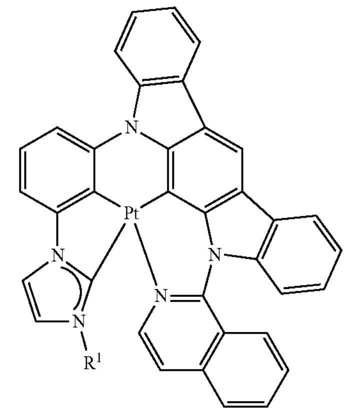
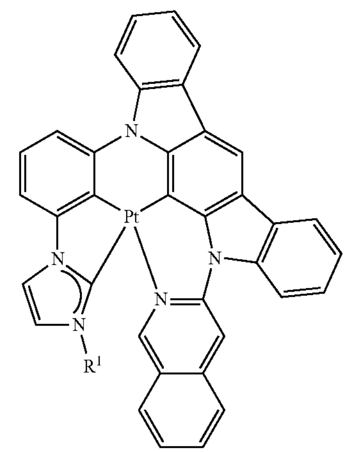
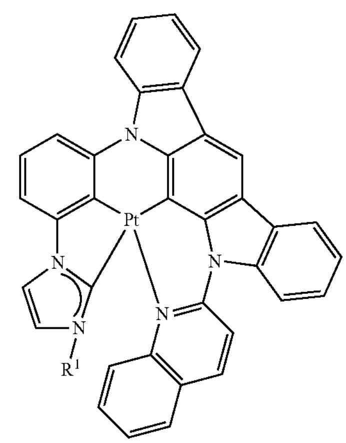
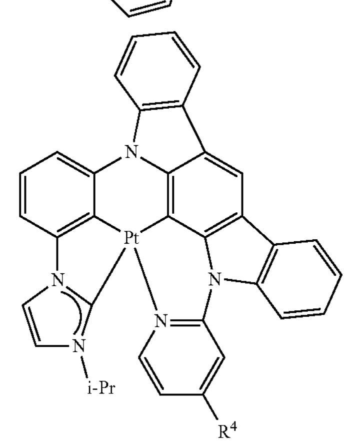

-continued
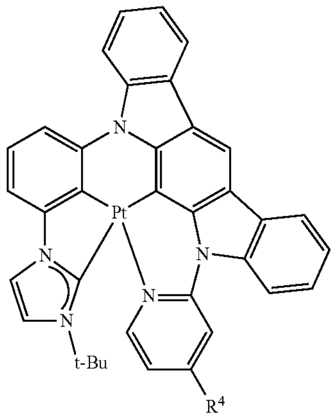
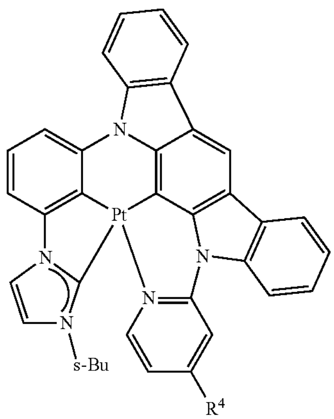
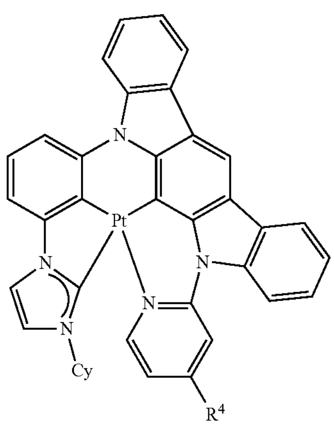
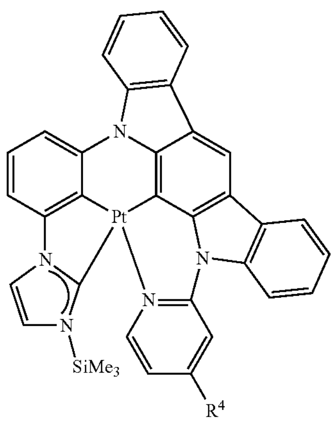
-continued
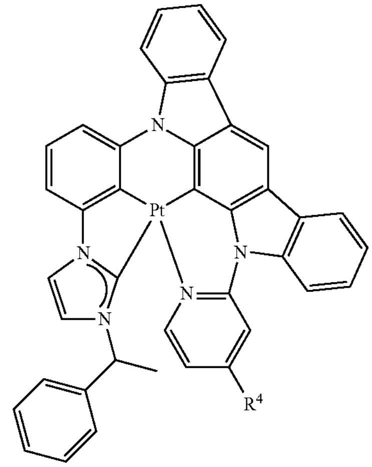
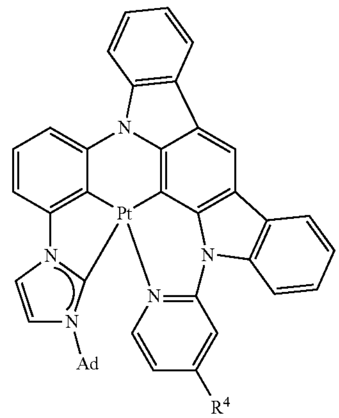
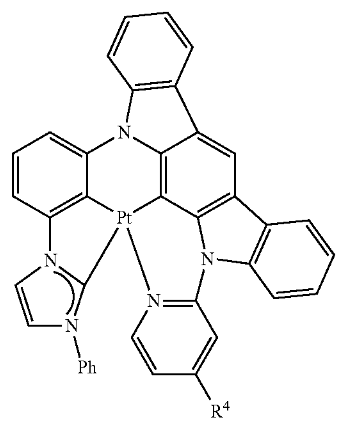
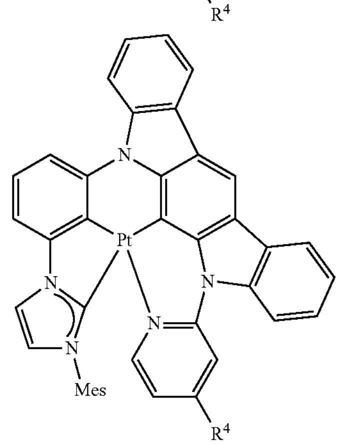

-continued
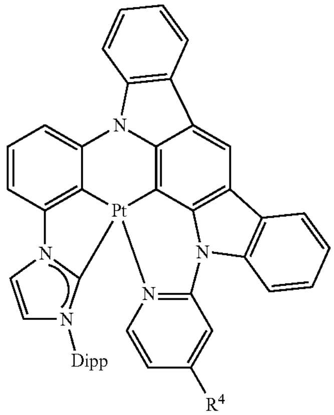
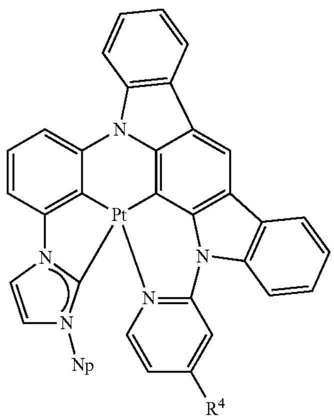
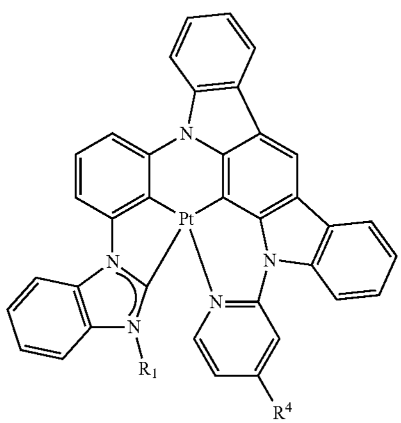
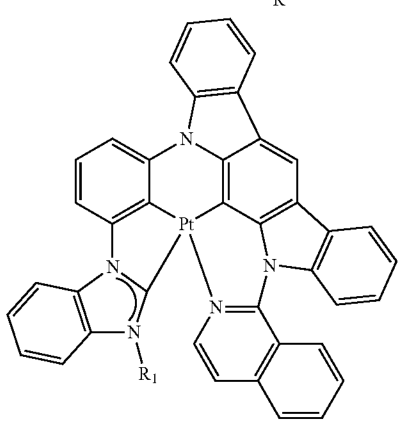
-continued
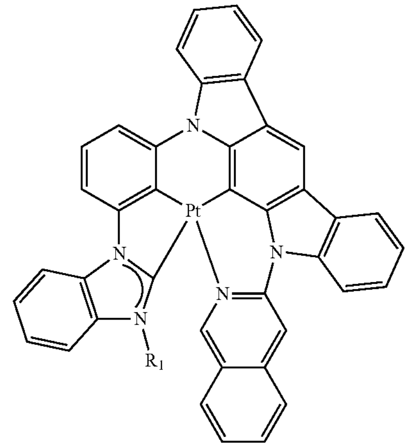
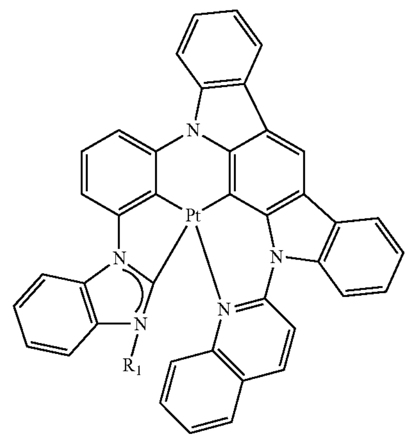
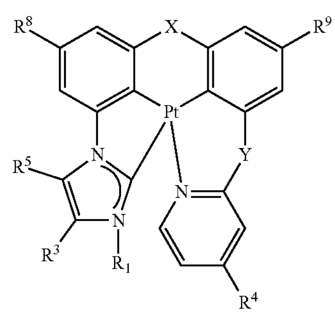
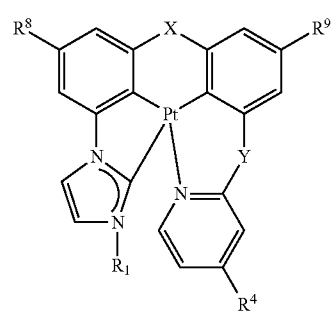

-continued
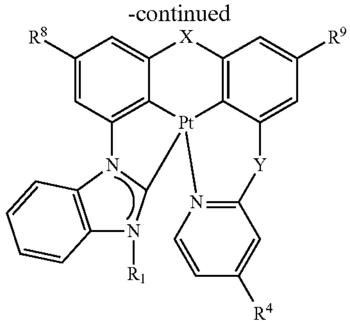
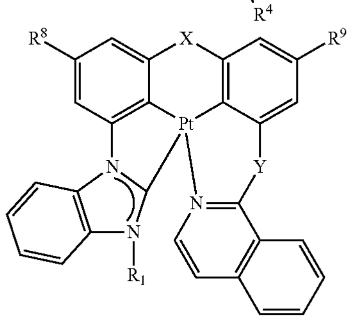
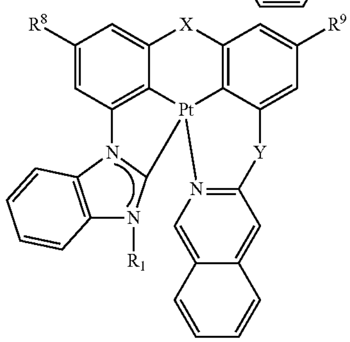
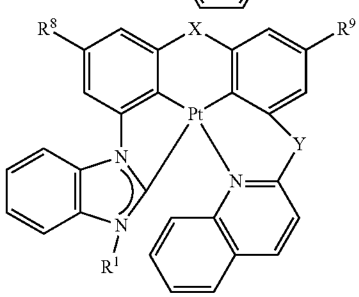
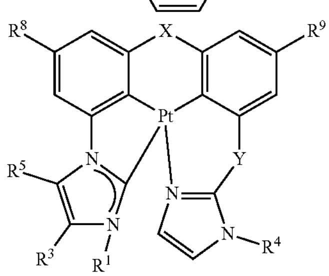
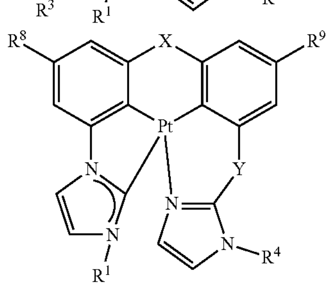
-continued
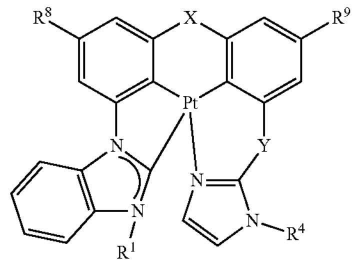
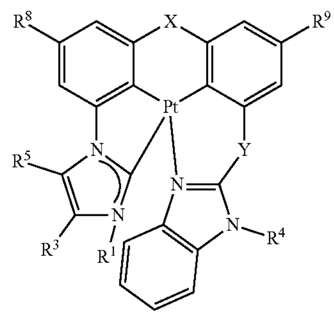
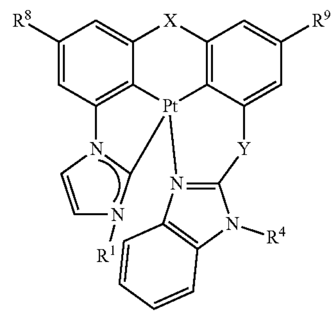
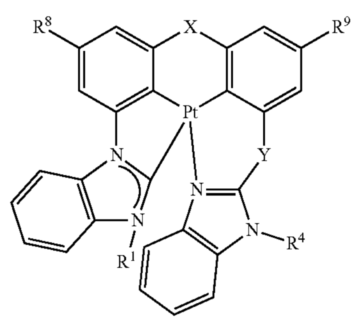
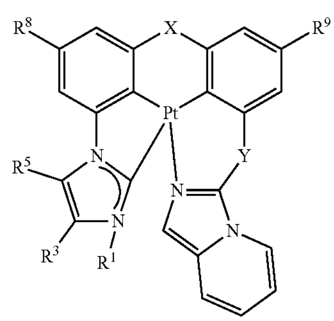

-continued
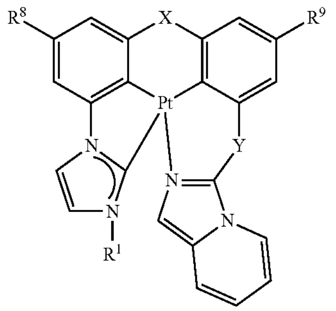
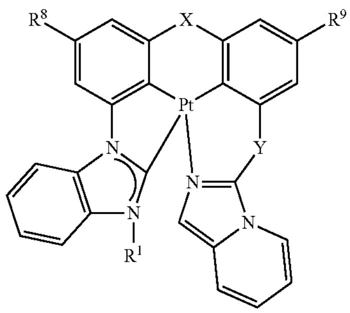
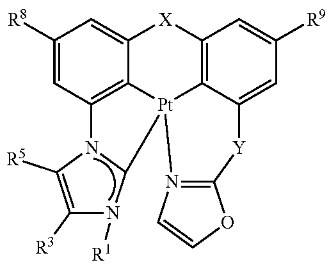
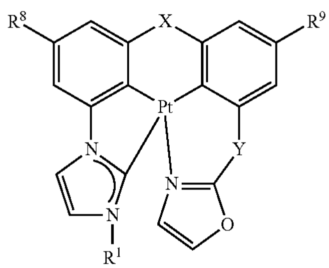
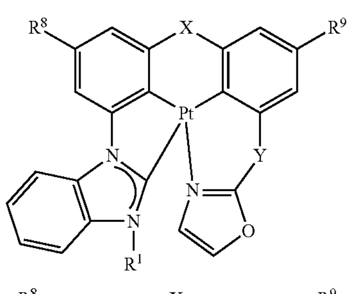
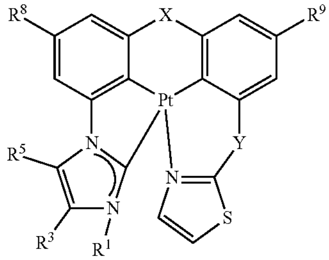
-continued
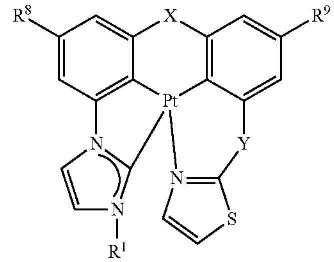
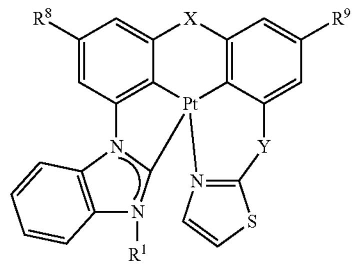
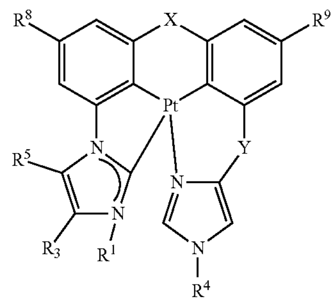
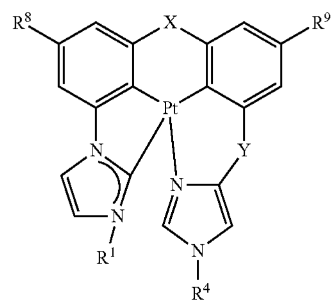
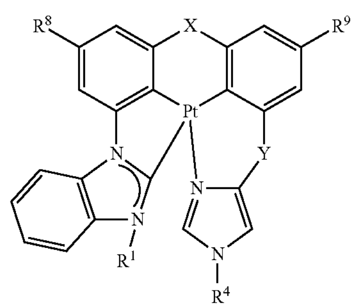
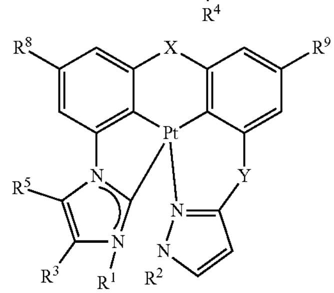

-continued
-continued
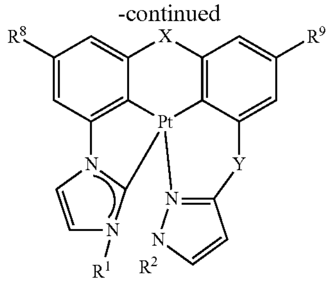
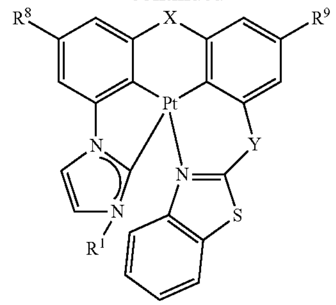
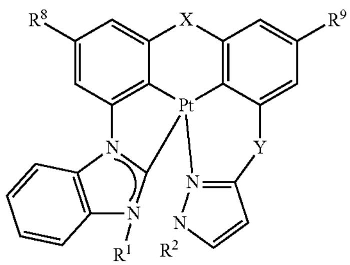
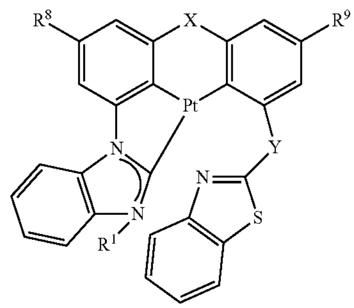
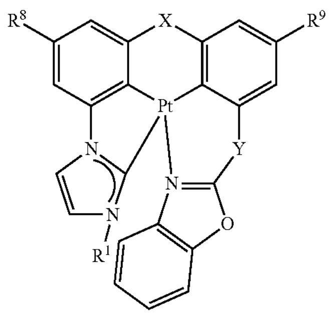
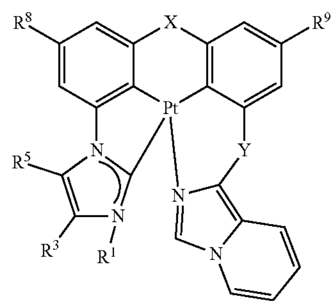
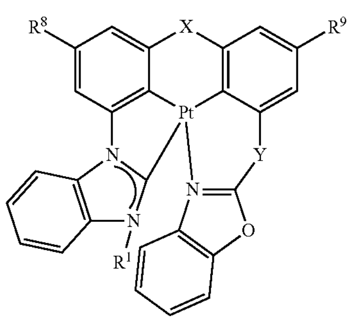
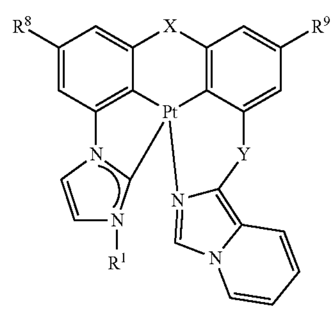
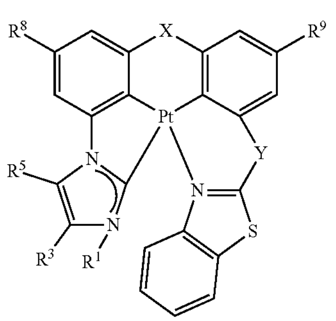
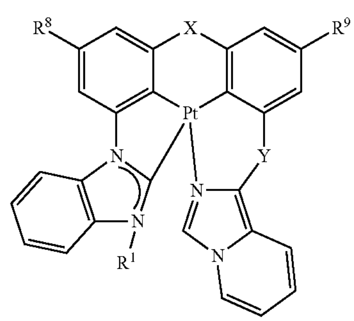

-continued
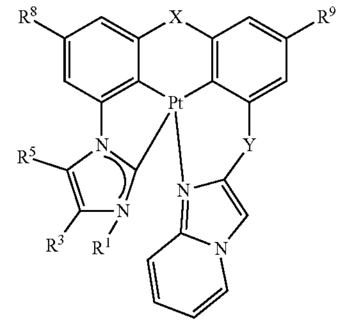
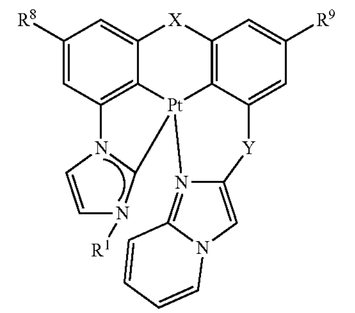
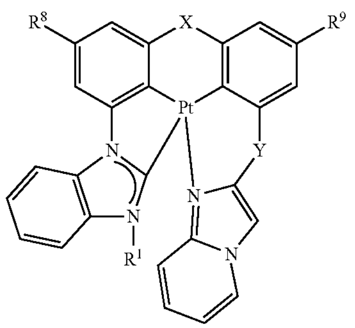
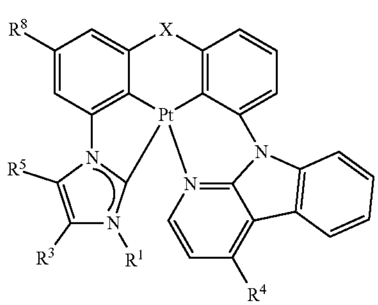
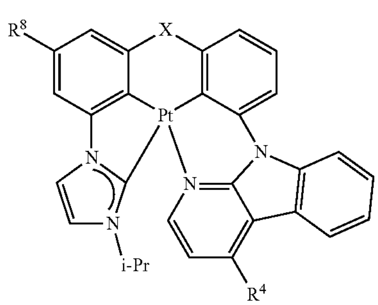
-continued
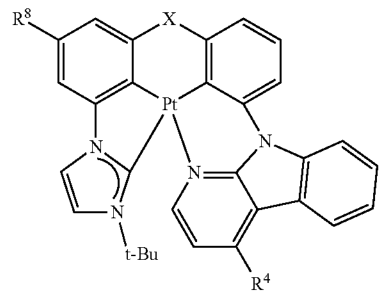
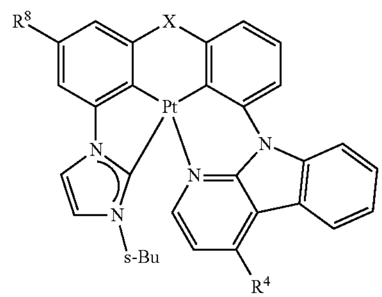
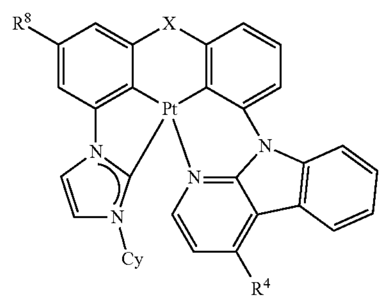
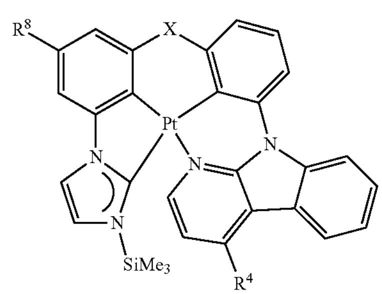
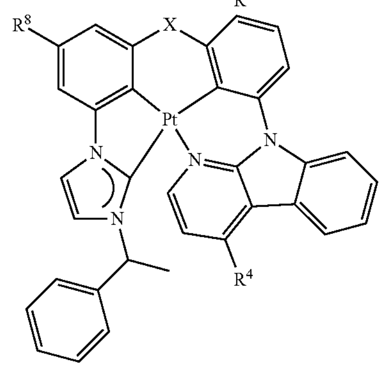

-continued
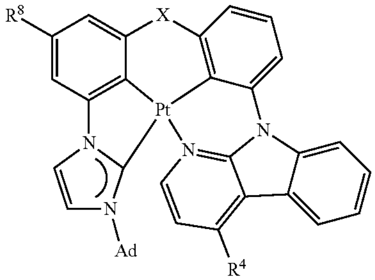
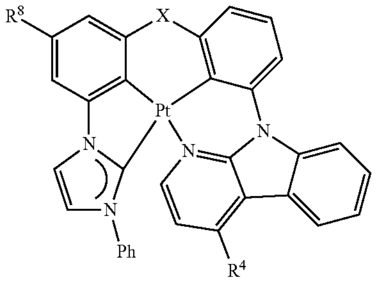
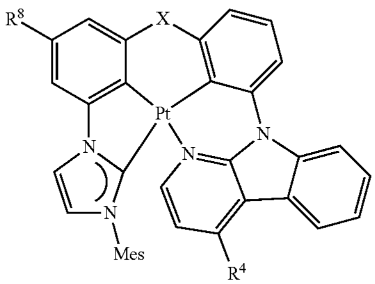
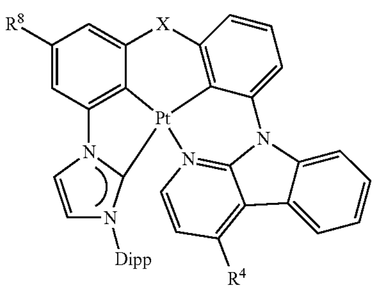
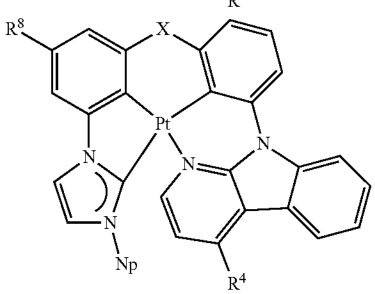
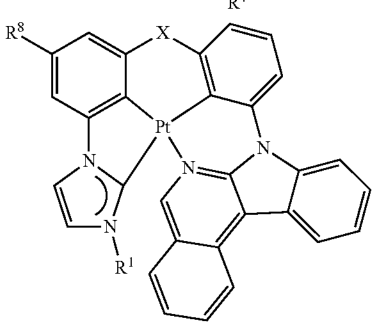
-continued
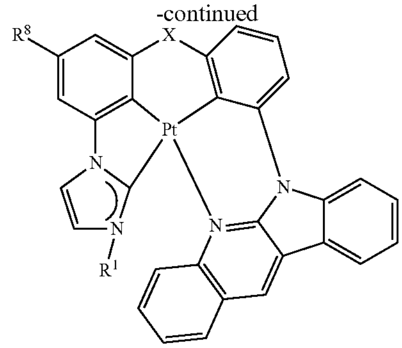
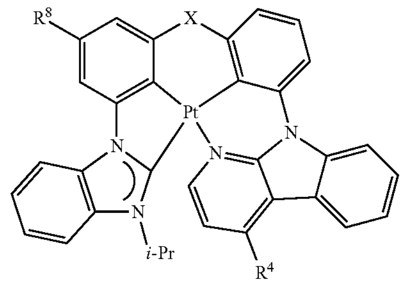
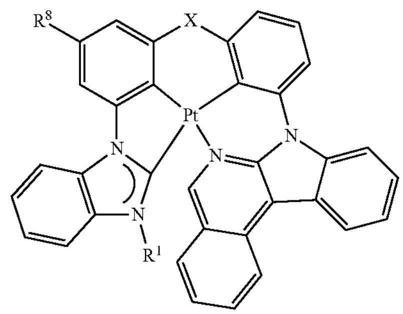
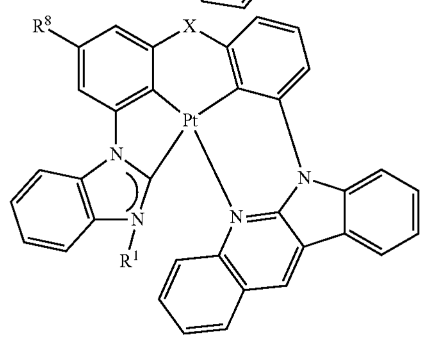
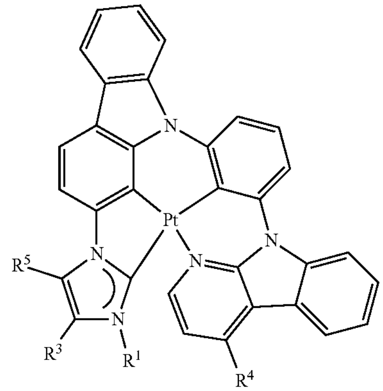

-continued
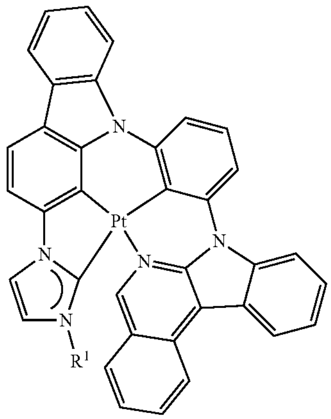
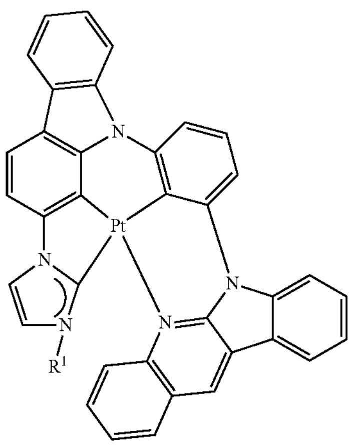
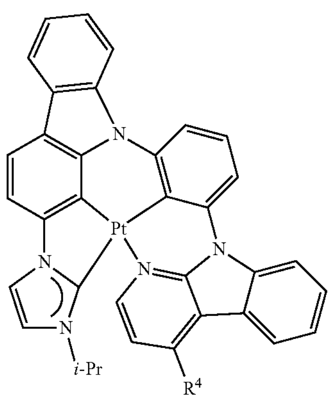
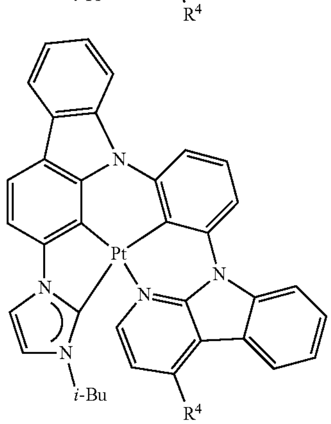
-continued
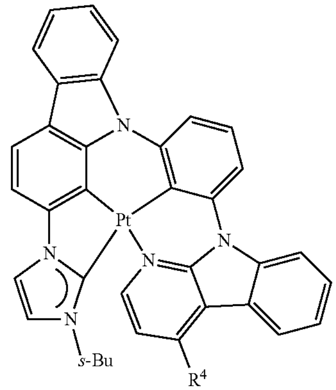
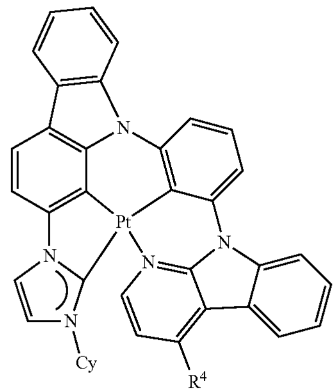
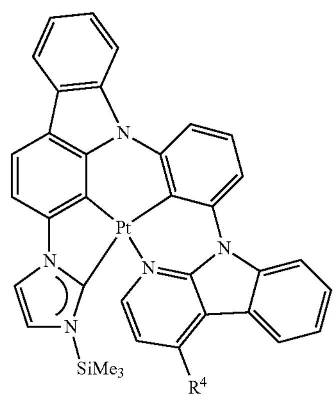
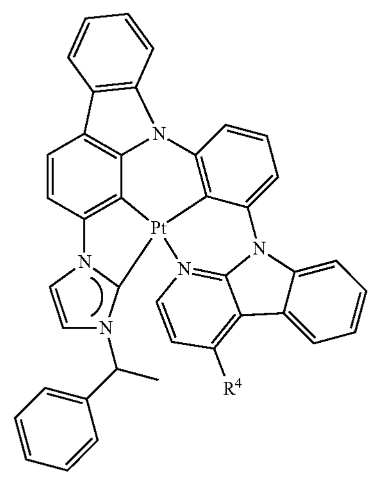

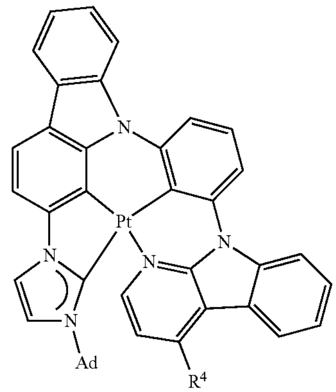
N
Pt
N
N
N
N
Ad
R^4
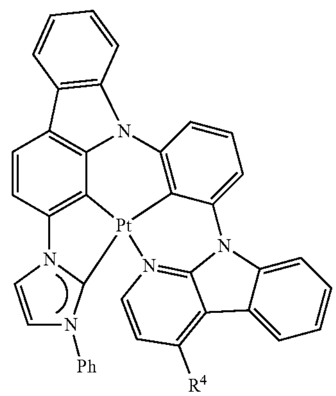
Ph
R^4
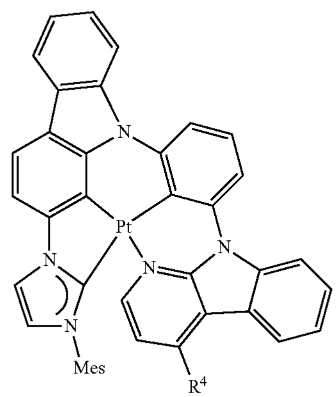
Mes
R^4
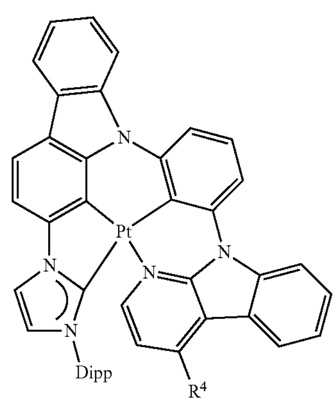
Dipp
R^4
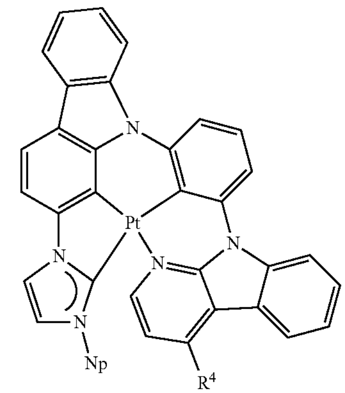
Np
R^4
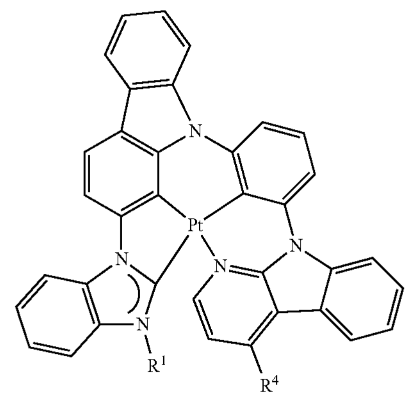
R^1
R^4
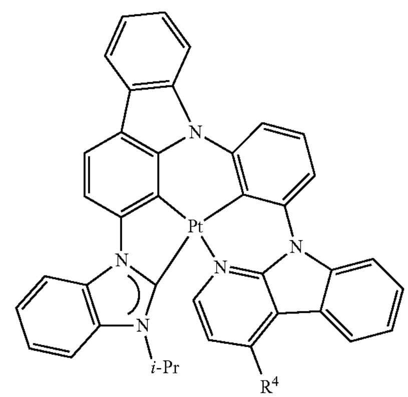
i-Pr
R^4
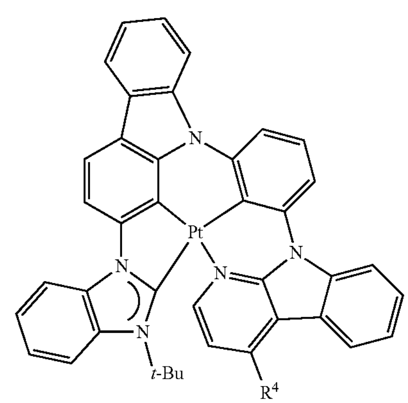
t-Bu
R^4

-continued
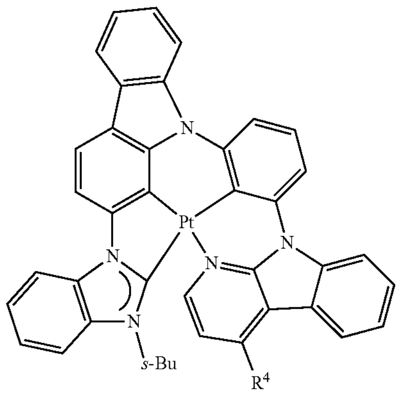
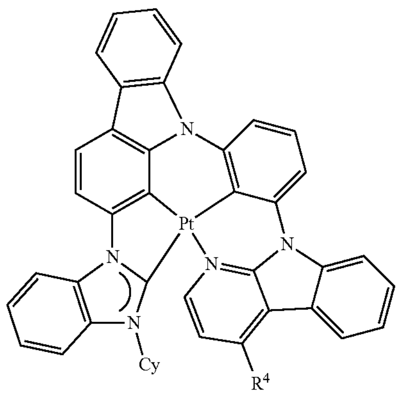
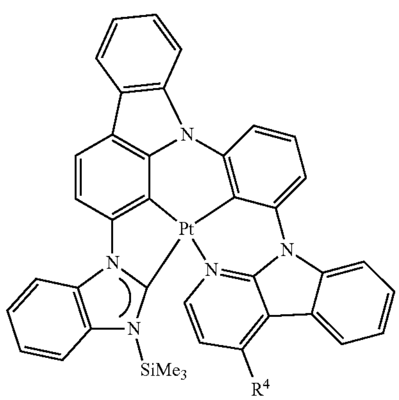
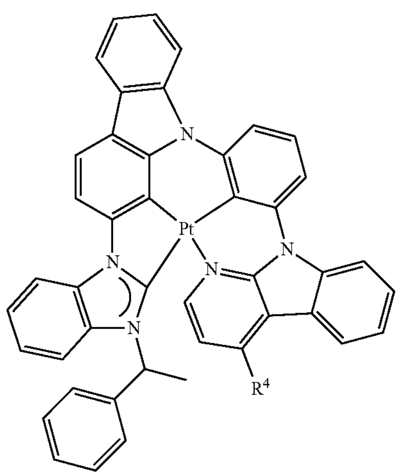
-continued
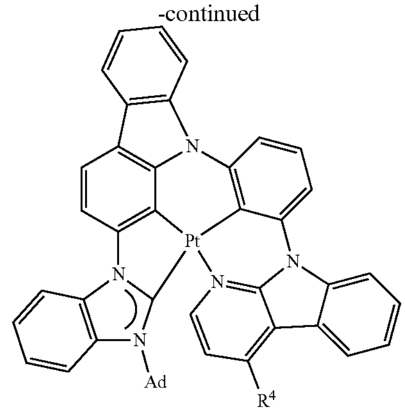
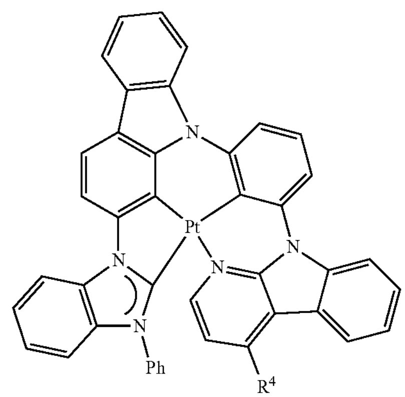
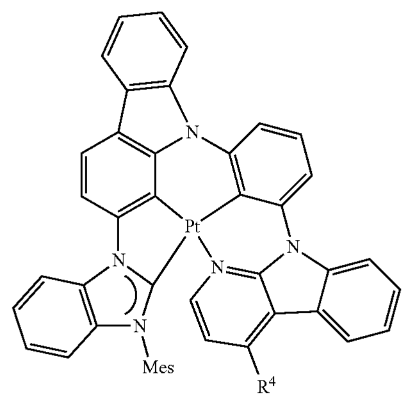
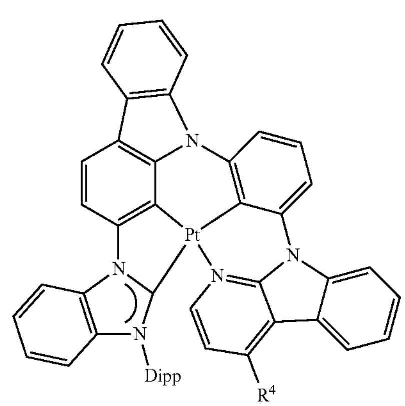

-continued
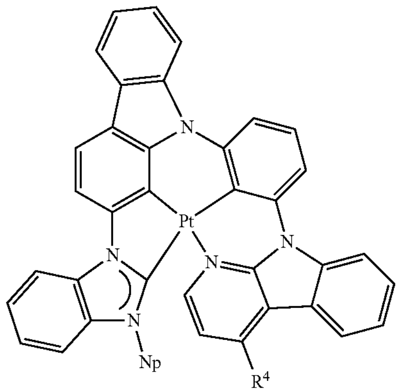
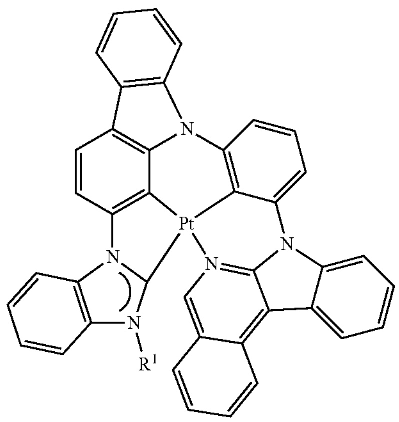
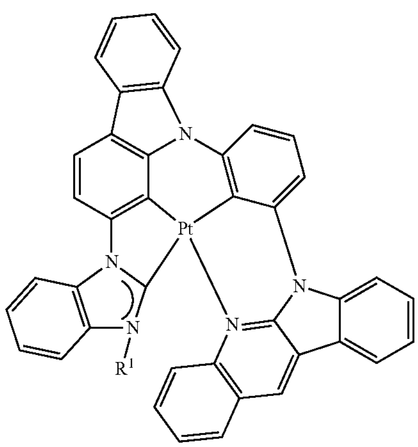
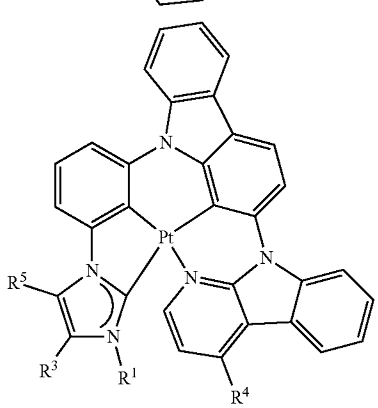
-continued
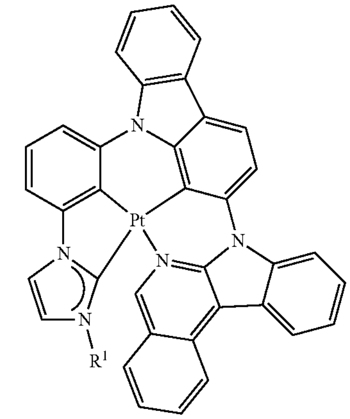
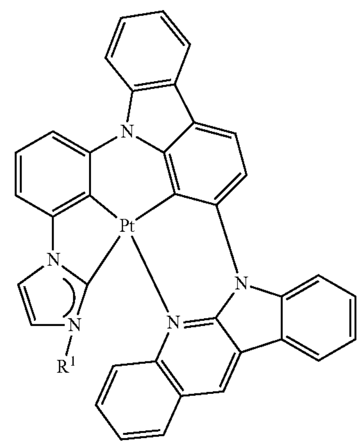
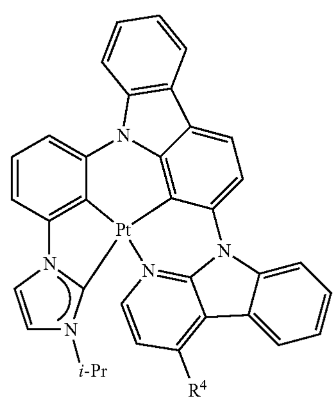
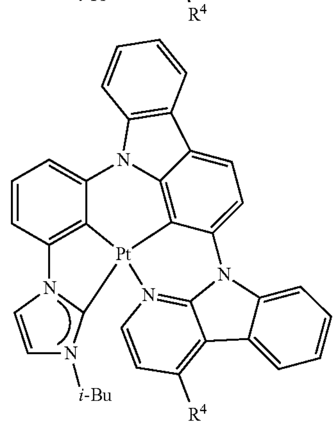

-continued
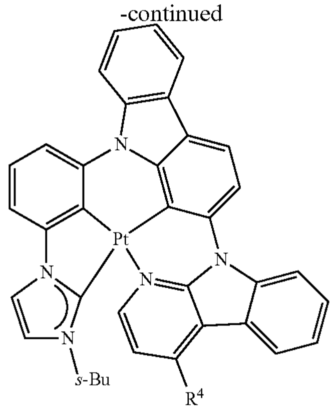
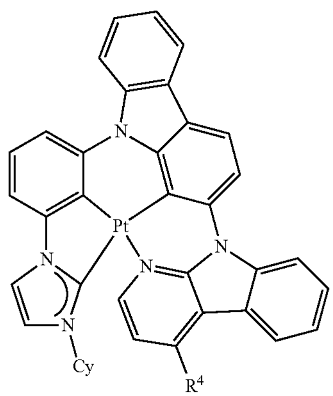
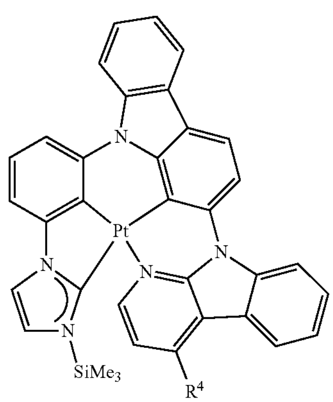
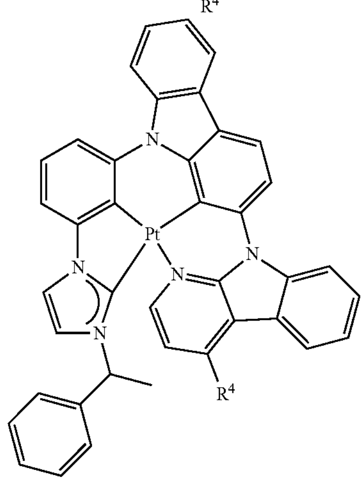
-continued
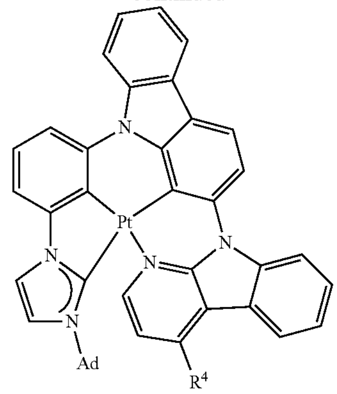
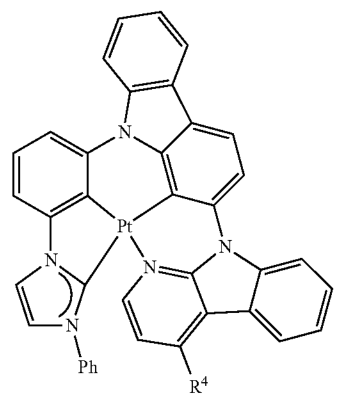
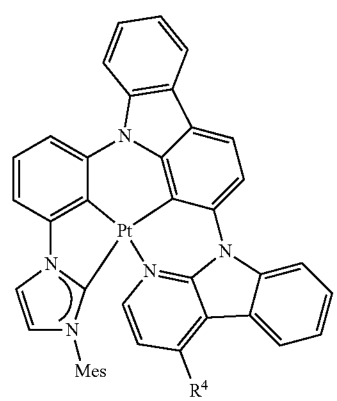
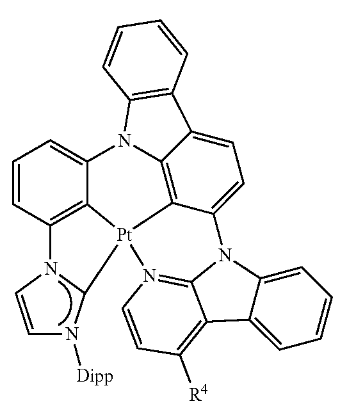

-continued

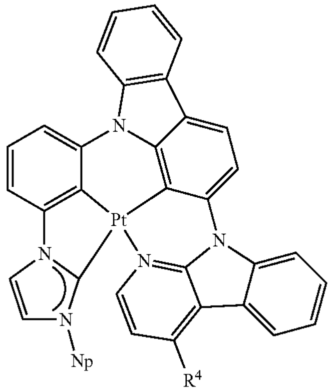

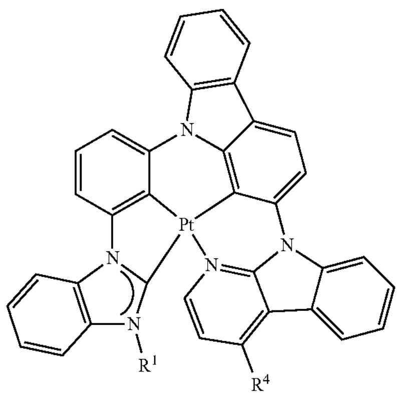

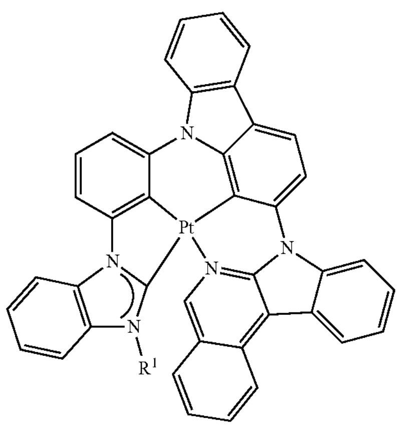

-continued

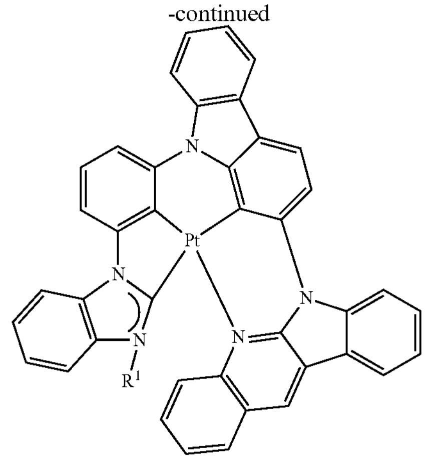

wherein Ad refers to adamantyl;

Mes refers to mesityl;

Dipp refers to 2,6-diisopropylphenyl;

Np refers to neopentyl; and

Cy refers to cyclohexyl.

5. The complex of claim 1, wherein the complex is a delayed fluorescent and phosphorescent emitter.

6. The complex of claim 1, wherein the complex is a phosphorescent emitter.

7. The complex of claim 1, wherein the complex is a delayed fluorescent emitter.

8. The complex of claim 1, wherein any two of R, $R^2$, $R^3$, $R^4$, $R^5$, $R^6$, $R^7$, $R^8$, $R^9$, $R^{10}$, $R^{11}$, and $R^{12}$ on the same ring or adjacent rings are bonded together to form a fused ring system.

9. The complex of claim 8, wherein the fused ring system comprises benzimidazole, benzoxazole, benzothiazole, indazole, quinoline, isoquinoline, or imidazo[1,5-a]pyridine.

10. A method of preparing the complex of claim 1, the method comprising:

combining the ligand with a platinum salt, a bromine-containing compound, and acetic acid to yield a mixture;

heating the mixture; and cooling the mixture to room temperature.

11. The method of claim 10, wherein the platinum salt is $K_2PtCl_4$.

12. The method of claim 10, wherein the bromine-containing compound is n-$Bu_4NBr$.

13. A device comprising the complex of claim 1.

14. The device of claim 13, wherein the device is a light-emitting device.

15. The device of claim 14, wherein the device is an organic light emitting diode.

16. The device of claim 14, wherein the device is a full color display.

17. The compound of claim 1, wherein Y is $NR^{3a}$.

18. The compound of claim 1, wherein X is O.

* * * * *